(12) United States Patent
Suzuki et al.

(10) Patent No.: US 9,170,487 B2
(45) Date of Patent: Oct. 27, 2015

(54) RESIST COMPOSITION, METHOD OF FORMING RESIST PATTERN, AND POLYMERIC COMPOUND

(71) Applicant: Tokyo Ohka Kogyo Co., Ltd., Kawasaki-shi (JP)

(72) Inventors: Yusuke Suzuki, Kawasaki (JP); Tomotaka Yamada, Kawasaki (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 53 days.

(21) Appl. No.: 13/849,769

(22) Filed: Mar. 25, 2013

(65) Prior Publication Data
US 2013/0260312 A1 Oct. 3, 2013

(30) Foreign Application Priority Data

Mar. 28, 2012 (JP) .................................. 2012-074972
Sep. 7, 2012 (JP) .................................. 2012-197774

(51) Int. Cl.
G03F 7/004 (2006.01)
C08F 220/38 (2006.01)
G03F 7/039 (2006.01)

(52) U.S. Cl.
CPC .............. *G03F 7/004* (2013.01); *C08F 220/38* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,949,325 B2 | 9/2005 | Li et al. | |
| 2001/0049073 A1 | 12/2001 | Hada et al. | |
| 2009/0068590 A1 | 3/2009 | Dazai et al. | |
| 2011/0160465 A1 | 6/2011 | Nakayama et al. | |
| 2011/0244392 A1 | 10/2011 | Hirano et al. | |
| 2011/0311913 A1* | 12/2011 | Suzuki et al. | 430/270.1 |
| 2012/0122034 A1* | 5/2012 | Ichikawa et al. | 430/285.1 |
| 2014/0023968 A1* | 1/2014 | Nakashima et al. | 430/270.1 |
| 2014/0234759 A1* | 8/2014 | Kataoka et al. | 430/9 |

FOREIGN PATENT DOCUMENTS

| | | |
|---|---|---|
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2005-336452 | 12/2005 |
| JP | A-2006-259582 | 9/2006 |
| JP | A-2006-317803 | 11/2006 |
| JP | A-2007-031355 | 2/2007 |
| JP | A-2009-025707 | 2/2009 |
| JP | A-2009-062491 | 3/2009 |
| JP | A-2011-158879 | 8/2011 |
| WO | WO 2004/074242 A2 | 9/2004 |
| WO | WO 2010/026974 A1 | 3/2010 |
| WO | WO 2012133595 A1 * | 10/2012 |

OTHER PUBLICATIONS

Angew, Chem., 77(7), pp. 291-305, 1965.

* cited by examiner

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A resist composition which generates acid upon exposure and exhibits changed solubility in a developing solution under the action of acid, the resist composition including a base component that exhibits changed solubility in a developing solution under the action of acid, the base component containing a resin component having a structural unit represented by general formula (a0-1) shown below:

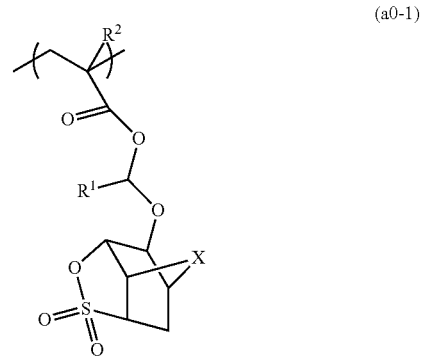

(a0-1)

in which $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

7 Claims, No Drawings

RESIST COMPOSITION, METHOD OF FORMING RESIST PATTERN, AND POLYMERIC COMPOUND

BACKGROUND OF THE INVENTION

1. Field of the Invention

The present invention relates to a novel polymeric compound that can be used as the base component of a resist composition, a resist composition containing the polymeric compound, and a method of forming a resist pattern using the resist composition.

Priority is claimed on Japanese Patent Application No. 2012-074972, filed Mar. 28, 2012, and Japanese Patent Application No. 2012-197774, filed Sep. 7, 2012, the contents of which are incorporated herein by reference.

2. Description of Related Art

In lithography techniques, for example, a resist film composed of a resist material is formed on a substrate, and the resist film is subjected to selective exposure followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as extreme ultraviolet radiation (EUV), electron beam (EB), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, conventionally a chemically amplified composition has been used, which includes an acid generator component that generates acid upon exposure, and a base component that exhibits changed solubility in a developing solution under the action of acid.

Resins (base resins) are typically used as the base components used within chemically amplified resist compositions.

For example, in an alkali developing process where an alkali developing solution is used as the developing solution, a chemically amplified resist composition for forming a positive-type resist pattern typically contains an acid generator component and a resin component that exhibits increased solubility in an alkali developing solution under the action of acid. If the resist film formed using this resist composition is selectively exposed during formation of a resist pattern, then acid is generated from the acid generator component within the exposed portions, and the action of this acid causes an increase in the solubility of the resin component in an alkali developing solution, making the exposed portions soluble in the alkali developing solution. As a result, by performing alkali developing, the unexposed portions remain as a pattern, resulting in the formation of a positive-type pattern.

As the resin component, a resin that exhibits increased polarity under the action of acid is typically used. When the polarity of the resin is increased, the solubility in an alkali developing solution increases, whereas the solubility in an organic solvent decreases. Accordingly, if a solvent developing process that uses a developing solution containing an organic solvent (an organic developing solution) is employed instead of an alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is sometimes referred to as a negative-type developing process (for example, see Patent Document 1).

Currently, resins that contain structural units derived from (meth)acrylate esters within the main chain (acrylic resins) are widely used as base resins for chemically amplified resist compositions that use ArF excimer laser lithography or the like, as they exhibit excellent transparency in the vicinity of 193 nm (for example, see Patent Document 2). Here, the term "(meth)acrylate ester" is a generic term that includes either or both of the acrylate ester having a hydrogen atom bonded to the $\alpha$-position and the methacrylate ester having a methyl group bonded to the $\alpha$-position. The term "(meth)acrylate" is a generic term that includes either or both of the acrylate having a hydrogen atom bonded to the $\alpha$-position and the methacrylate having a methyl group bonded to the $\alpha$-position. The term "(meth)acrylic acid" is a generic term that includes either or both of acrylic acid having a hydrogen atom bonded to the $\alpha$-position and methacrylic acid having a methyl group bonded to the $\alpha$-position.

Numerous materials have been proposed for the acid generator used in a chemically amplified resist composition, and known examples include onium salt-based acid generators, oxime sulfonate-based acid generators, diazomethane-based acid generators, nitrobenzylsulfonate-based acid generators, iminosulfonate-based acid generators, and disulfone-based acid generators. Among these acid generators, onium salt-based acid generators having an onium ion such as a triphenylsulfonium ion for the cation moiety are widely used.

Furthermore, in recent years, resins having a structural unit containing a sultone ring have been proposed for the aforementioned resin component. Conventionally, it has been suggested that these structural units can be added for the purpose of improving the adhesion between the resist composition and the substrate (for example, see Patent Document 3).

DOCUMENTS OF RELATED ART

Patent Documents

[Patent Document 1] Japanese Unexamined Patent Application, First Publication No. 2009-25707

[Patent Document 2] Japanese Unexamined Patent Application, First Publication No. 2009-62491

[Patent Document 3] Japanese Unexamined Patent Application, First Publication No. 2011-158879

SUMMARY OF THE INVENTION

However, as pattern miniaturization continues to progress, improved lithography properties are being demanded of resist patterns formed using the types of chemically amplified resist compositions described above, but the rectangularity of the resist patterns tends to be unsatisfactory, with a tendency to form a tapered shape (footing).

The present invention has been developed in light of the above circumstances, and has an object of providing a resist composition which exhibits excellent lithography properties, and can form a resist pattern having a favorable shape with superior rectangularity, a method of forming a resist pattern that uses the resist composition, and a polymeric compound that can be used as the base component of the resist composition.

In order to achieve the above object, the present invention employs the aspects described below.

In other words, a first aspect of the present invention is a resist composition which generates acid upon exposure and exhibits changed solubility in a developing solution under the action of acid, the resist composition containing a base component (A) that exhibits changed solubility in a developing solution under the action of acid, and the base component (A) containing a resin component (A1) having a structural unit (a0) represented by general formula (a0-1) shown below.

[Chemical Formula 1]

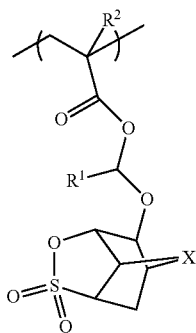

(a0-1)

In the formula, $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

A second aspect of the present invention is a method of forming a resist pattern, the method including: using the resist composition of the first aspect to form a resist film on a substrate, conducting exposure of the resist film, and developing the resist film to form a resist pattern.

A third aspect of the present invention is a polymeric compound having a structural unit (a0) represented by general formula (a0-1) shown below.

[Chemical Formula 2]

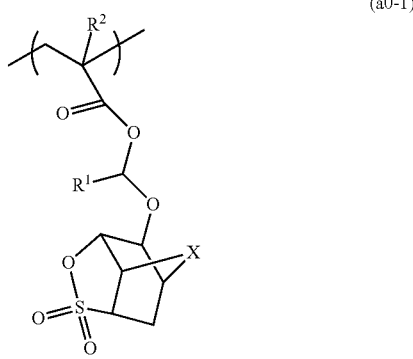

(a0-1)

In the formula, $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

In the present description and claims, the term "exposure" is used as a general concept that includes irradiation with any form of radiation.

The term "structural unit" refers to a monomer unit that contributes to the formation of a polymeric compound (namely, a resin, polymer or copolymer).

The term "aliphatic" is a relative concept used in relation to the term "aromatic", and defines a group or compound that has no aromaticity.

The term "alkyl group" includes linear, branched and cyclic, monovalent saturated hydrocarbon groups, unless otherwise specified.

The term "alkylene group" includes linear, branched and cyclic divalent saturated hydrocarbon groups, unless otherwise specified.

A "halogenated alkyl group" is a group in which part or all of the hydrogen atoms of an alkyl group have each been substituted with a halogen atom, and a "halogenated alkylene group" is a group in which part or all of the hydrogen atoms of an alkylene group have each been substituted with a halogen atom, wherein examples of the halogen atom include a fluorine atom, a chlorine atom, a bromine atom and an iodine atom.

A "fluorinated alkyl group" is a group in which part or all of the hydrogen atoms of an alkyl group have each been substituted with a fluorine atom, and a "fluorinated alkylene group" is a group in which part or all of the hydrogen atoms of an alkylene group have each been substituted with a fluorine atom.

The present invention is able to provide a resist composition which exhibits excellent lithography properties, and can form a resist pattern having a favorable shape with superior rectangularity, a method of forming a resist pattern that uses the resist composition, and a polymeric compound that can be used as the base component of the resist composition.

DETAILED DESCRIPTION OF THE INVENTION

Resist Composition

The resist composition of the present invention generates acid upon exposure and exhibits changed solubility in a developing solution under the action of acid, wherein the resist composition contains a base component (A) (hereafter, referred to as "component (A)") that exhibits changed solubility in a developing solution under the action of acid.

When a resist film is formed using the resist composition, and that resist film is then subjected to selective exposure, acid is generated in the exposed portions, and the action of this generated acid causes a change in the solubility of the component (A) in a developing solution, whereas the solubility of the component (A) in the developing solution remains unchanged in the unexposed portions, and therefore a difference in the solubility in the developing solution develops between the exposed portions and the unexposed portions. For this reason, when the resist film is subjected to developing, either a positive-type resist pattern is formed by dissolving and removing the exposed portions in the case of a positive-type resist composition, or a negative-type resist pattern is formed by dissolving and removing the unexposed portions in the case of a negative-type resist composition.

In this description, a resist composition in which the exposed portions are dissolved and removed to form a positive-type resist pattern is referred to as a "positive-type resist composition", whereas a resist composition in which the unexposed portions are dissolved and removed to form a negative-type resist pattern is referred to as a "negative-type resist composition".

The resist composition of the present invention may be either a positive-type resist composition or a negative-type resist composition.

Further, the resist composition of the present invention may be used for either an alkali developing process in which an alkali developing solution is used for the developing treatment during formation of the resist pattern, or a solvent developing process in which a developing solution containing an organic solvent (an organic developing solution) is used for the developing treatment.

The resist composition of the present invention is a composition that has an acid-generating capability that generates acid upon exposure, and either the base component may generate acid upon exposure, or an additive component that is included in addition to the base component may generate acid upon exposure.

Specifically, the resist composition of the present invention:
(1) may include an acid generator component (B) ("hereafter referred to as "component (B)") that generates acid upon exposure,
(2) may be a composition in which the component (A) is a component that generates acid upon exposure,
(3) may be a composition in which the component (A) is a component that generates acid upon exposure, and which also includes the component (B).

In other words, in the case of (2) and (3) above, the component (A) is a "base component that generates acid upon exposure and exhibits changed solubility in a developing solution under the action of acid". When the component (A) is a base component that generates acid upon exposure and exhibits changed solubility in a developing solution under the action of acid, the component (A1) described below is preferably a resin component (A1') (hereafter also referred to as "component (A1')") that generates acid upon exposure and exhibits changed solubility in a developing solution under the action of acid. Resins having a structural unit that generates acid upon exposure can be used as this type of component (A1'). Conventional units can be used as the structural unit that generates acid upon exposure. Of the various possibilities, the case (1) describe above is particularly desirable for the present invention.

<Component (A)>
In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds that can be used as the base component can be broadly classified into non-polymers and polymers.

In general, as a non-polymer, any non-polymers which have a molecular weight in the range from 500 to less than 4,000 can be used. Hereafter, a "low molecular weight compound" refers to a non-polymer having a molecular weight in the range from 500 to less than 4,000.

As a polymer, any polymers which have a molecular weight of 1,000 or more can generally be used. Hereafter, a "resin" refers to a polymer having a molecular weight of 1,000 or more.

With respect to a polymer, the "molecular weight" is the weight-average molecular weight in terms of the polystyrene equivalent value determined by gel permeation chromatography (GPC).

At least a resin is used as the component (A), and a low molecular weight compound may be used in addition to the resin.

The component (A) may be a component that exhibits increased solubility in a developing solution under the action of acid, or a component that exhibits decreased solubility in a developing solution under the action of acid.

Further, in the present invention, the component (A) may be a component that generates acid upon exposure.

When the resist composition of the present invention is a "negative-type resist composition for an alkali developing process" which forms a negative-type resist pattern in an alkali developing process, or is a "positive-type resist composition for a solvent developing process" which forms a positive-type resist pattern in a solvent developing process, the component (A) is preferably a base component (A-2) (hereafter referred to as "component (A-2)") that is soluble in an alkali developing solution, and a crosslinking component is also added to the composition. In this type of resist composition, when acid is generated upon exposure, the generated acid causes crosslinking between the component (A-2) and the crosslinking agent, resulting in a reduction in the solubility in an alkali developing solution (and an increase in the solubility in an organic developing solution). Accordingly, during resist pattern formation, by conducting selective exposure of a resist film obtained by applying the resist composition to a substrate, the exposed portions change to a state that is substantially insoluble in an alkali developing solution (but soluble in an organic developing solution), while the unexposed portions remain soluble in an alkali developing solution (but substantially insoluble in an organic developing solution), meaning developing with an alkali developing solution can be used to form a negative-type resist pattern. Further, if an organic developing solution is used as the developing solution, then a positive-type resist pattern can be formed.

As the component (A-2), a resin that is soluble in an alkali developing solution (hereafter referred to as an "alkali-soluble resin") is used.

The alkali-soluble resin is preferably a resin having a structural unit derived from at least one of an α-(hydroxyalkyl) acrylic acid and an alkyl ester of an α-(hydroxyalkyl)acrylic acid (preferably an alkyl ester having 1 to 5 carbon atoms), as disclosed in Japanese Unexamined Patent Application, First Publication No. 2000-206694; an acrylic resin or polycycloolefin resin having a sulfonamide group, in which the hydrogen atom bonded to the carbon atom on the α-position may be substituted with a substituent, as disclosed in U.S. Pat. No. 6,949,325; an acrylic resin containing a fluorinated alcohol, in which the hydrogen atom bonded to the carbon atom on the α-position may be substituted with a substituent, as disclosed in U.S. Pat. No. 6,949,325, Japanese Unexamined Patent Application, First Publication No. 2005-336452 or Japanese Unexamined Patent Application, First Publication No. 2006-317803; or a polycycloolefin resin having a fluorinated alcohol, as disclosed in Japanese Unexamined Patent Application, First Publication No. 2006-259582, as these resins are capable of forming favorable resist patterns with minimal swelling.

Among acrylic acids in which the hydrogen atom bonded to the carbon atom on the α-position may be substituted with a substituent, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (and preferably a hydroxyalkyl group of 1 to 5 carbon atoms) is bonded to the carbon atom on the α-position.

An amino-based crosslinking agent such as a glycoluril having a methylol group or alkoxymethyl group, or a melamine-based crosslinking agent is usually preferred as the crosslinking agent component, as it enables the formation of a favorable resist pattern with minimal swelling. The amount added of the crosslinking agent component is preferably within a range from 1 to 50 parts by weight, relative to 100 parts by weight of the alkali-soluble resin.

When the resist composition of the present invention is a resist composition which forms a positive-type pattern in an alkali developing solution, and forms a negative-type pattern in a solvent developing process, a base component (A-1) (hereafter referred to as "component (A-1)") which exhibits increased polarity under the action of acid is used as the component (A). By using the component (A-1), the polarity of the base component changes upon exposure, meaning favorable developing contrast can be obtained not only in an alkali developing process, but also in a solvent developing process.

In those cases where an alkali developing process is used, the component (A-1) is sparingly soluble in an alkali developing solution prior to exposure, but when acid is generated upon exposure, the action of the generated acid causes an increase in polarity that increases the solubility in an alkali developing solution. Accordingly, during resist pattern formation, by conducting selective exposure of a resist film obtained by applying the resist composition to a substrate, the exposed portions change from being sparingly soluble in an alkali developing solution to being soluble, while the unexposed portions remain sparingly soluble in an alkali developing solution, and therefore by performing alkali developing, a positive-type pattern can be formed.

On the other hand, in those cases where a solvent developing process is used, the component (A-1) exhibits good solubility in an organic developing solution prior to exposure, but when acid is generated upon exposure, the action of the generated acid causes an increase in polarity that reduces the solubility in an organic developing solution. Accordingly, during resist pattern formation, by conducting selective exposure of a resist film obtained by applying the resist composition to a substrate, the exposed portions change from being soluble in an organic developing solution to being substantially insoluble, while the unexposed portions remain soluble in an organic developing solution, and therefore by performing developing with an organic developing solution, contrast can be achieved between the exposed portions and the unexposed portions, enabling formation of a negative-type resist pattern.

In the present invention, the component (A) is preferably a component (A-1).

[Resin Component (A1)]

The component (A) contains a resin component (A1) (hereafter referred to as "component (A1)") having a structural unit (a0) represented by general formula (a0-1) shown above. The component (A1) is preferably a component (A-1) described above.

(Structural Unit (a0))

The structural unit (a0) is a structural unit represented by formula (a0-1) shown below. The structural unit (a0) has a terminal sultone skeleton and an acetal structure, and therefore exhibits an acid diffusion-controlling effect and improved substrate adhesion derived from the sultone skeleton, as well as an acid-dissociable function upon exposure to acid derived from the acetal structure, and as a result, the resist composition exhibits excellent lithography properties and shape properties.

Because a carboxyl group is generated following acid dissociation, when pattern formation is conducted by alkali developing, the component exhibits excellent solubility in an alkali developing solution, which contributes to improvements in the lithography properties such as the resolution, LWR and improved footing shape.

[Chemical Formula 3]

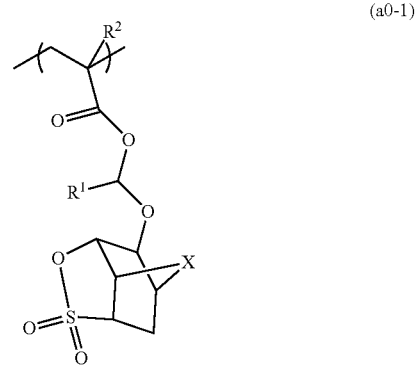

(a0-1)

In the formula, $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

In formula (a0-1), $R^2$ represents a hydrogen atom, an alkyl group of 1 to 5 carbon atoms, or a halogenated alkyl group of 1 to 5 carbon atoms.

The alkyl group of 1 to 5 carbon atoms for $R^2$ is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group of 1 to 5 carbon atoms for $R^2$ include groups in which part or all of the hydrogen atoms within the aforementioned "alkyl groups of 1 to 5 carbon atoms for $R^2$" have each been substituted with a halogen atom. Examples of the halogen atom include a fluorine atom, a chlorine atom, a bromine atom and an iodine atom, and a fluorine atom is particularly desirable.

Of the various possibilities, $R^2$ is preferably a hydrogen atom, an alkyl group of 1 to 5 carbon atoms or a fluorinated alkyl group of 1 to 5 carbon atoms, and a hydrogen atom or a methyl group is particularly desirable in terms of industrial availability.

In general formula (a0-1), $R^1$ represents a hydrogen atom, an alkyl group of 1 to 5 carbon atoms.

The hydrogen atom and alkyl group of 1 to 5 carbon atoms represented by $R^1$ are the same as described above for $R^2$.

From the viewpoints of obtaining a resist pattern having a superior LWR improvement effect and excellent resolution, $R^1$ is preferably a hydrogen atom or a methyl group, and is more preferably a hydrogen atom. Further, when $R^1$ is a hydrogen atom, the acid-dissociable moiety becomes a methylene group, which makes the moiety relatively more difficult to dissociate under the action of acid than the case where $R^1$ is an alkyl group such as a methyl group. Accordingly, the selection of $R^1$ can be based on the intended application of the composition.

When the structural unit (a0) is combined with a structural unit (a1) described below, in order to improve the lithography properties, $R^1$ is preferably a hydrogen atom. It is thought that this is because selecting a hydrogen atom for $R^1$ creates a better balance of the difference in acid dissociability (the deprotection energy) between the two structural units.

In formula (a0-1), X represents an oxygen atom (—O—), a sulfur atom (—S—), or an alkylene group of 1 to 5 carbon atoms which may contain an oxygen atom or a sulfur atom.

The alkylene group of 1 to 5 carbon atoms for X is preferably a linear or branched alkylene group, and specific examples include a methylene group, ethylene group, n-propylene group and isopropylene group.

When the alkylene group contains an oxygen atom or a sulfur atom, examples of the group include the aforementioned alkylene groups in which —O— or —S— is either bonded to the terminal of the alkylene group or interposed between carbon atoms of the alkylene group. Specific examples of such alkylene groups include —O—CH$_2$—, —CH$_2$—O—CH$_2$—, —S—CH$_2$— and —CH$_2$—S—CH$_2$—.

From the viewpoints of obtaining a resist pattern having a superior LWR improvement effect and excellent resolution, X is preferably a methylene group or an oxygen atom (—O—).

Specific examples of the structural unit (a0) are shown below. In each of the following formulas, $R^\alpha$ represents a hydrogen atom, a methyl group, or a trifluoromethyl group.

[Chemical Formula 4]

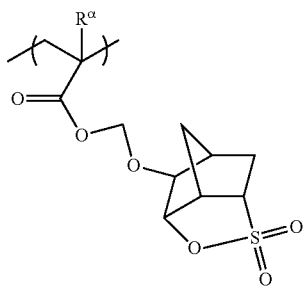

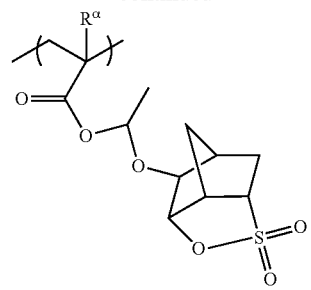

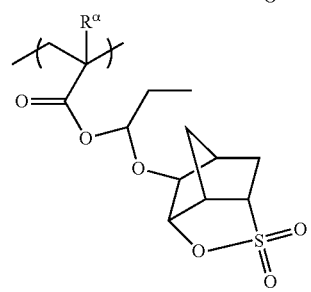

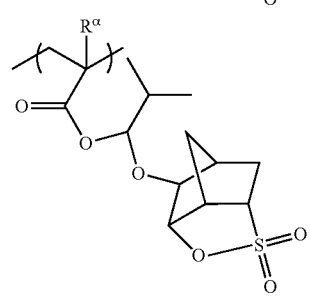

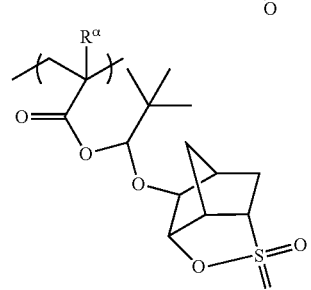

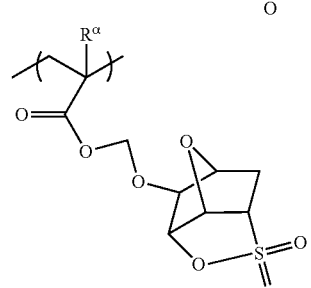

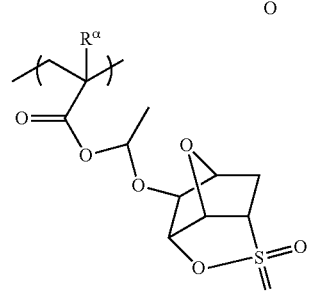

-continued

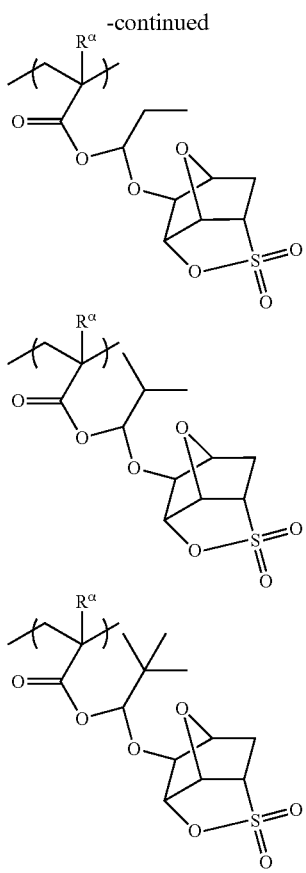

The structural unit (a0) contained within the component (A1) may be either a single type of structural unit or a combination of two or more types of structural units.

In the component (A1), from the viewpoints of obtaining a photoresist pattern having a superior LWR improvement effect and excellent resolution, the amount of the structural unit (a0) within the component (A1), based on the combined total of all the structural units that constitute the component (A1), is preferably within a range from 5 to 80 mol %. more preferably from 10 to 70 mol %, and still more preferably from 10 to 50 mol %.

By making the amount of the structural unit (a0) not more than the upper limit of the above range, the solubility of the component (A1) in an organic solvent (such as a component (S) described below) can be improved. On the other hand, when the amount of the structural unit (a0) is at least as large as the lower limit of the above range, the lithography properties such as the LWR can be improved further.

In addition to the structural unit (a0), the component (A1) preferably also includes a structural unit (a1) containing an acid-decomposable group that exhibits increased polarity under the action of acid. Further, the component (A1) preferably also includes a structural unit (a5) having an —$SO_2$-containing cyclic group, either in addition to the structural unit (a0), or in addition to the combination of the structural unit (a0) and the structural unit (a1). The structural units (a1) and (a5) do not correspond with the above definition of the structural unit (a0).

Furthermore, in those cases where the component (A1) is the resin component (A1') that generates acid upon exposure and exhibits changed solubility in a developing solution under the action of acid, the moiety within the component (A1') that generates acid upon exposure (namely, the acid-generating moiety) may be included within a side chain, or may be included at a terminal of the main chain. Of these possibilities, the component (A1') preferably includes the acid-generating moiety within a side chain, and a component (A1) that includes a structural unit that generates acid upon exposure in addition to the structural units (a0) and (a1) and the like is particularly desirable.

(Structural Unit (a1))

In addition to the structural unit (a0) described above, the component (A1) preferably also includes a structural unit (a1) containing an acid-decomposable group that exhibits increased polarity under the action of acid.

The term "acid-decomposable group" refers to a group exhibiting acid decomposability in which at least part of the bonding within the structure of the acid-decomposable group can be cleaved under the action of acid generated from upon exposure (such as the acid generated from the component (B) described below).

Examples of acid-decomposable groups that exhibit increased polarity under the action of acid include groups that decompose under the action of acid to form a polar group.

Examples of the polar group include a carboxyl group, a hydroxyl group, an amino group and a sulfo group (—$SO_3H$). Among these groups, polar groups that contain an —OH within the structure (hereafter also referred to as "OH-containing polar groups") are preferred, a carboxyl group or a hydroxyl group is more preferred, and a carboxyl group is particularly desirable.

More specific examples of the acid-decomposable groups include groups in which the aforementioned polar group is protected with an acid-dissociable group (such as groups in which the hydrogen atom of an OH-containing polar group is protected with an acid-dissociable group).

An "acid-dissociable group" is a group exhibiting acid dissociability in which at least the bond between the acid-dissociable group and the atom adjacent to this acid-dissociable group can be cleaved under the action of acid generated upon exposure. It is necessary that the acid-dissociable group that constitutes the acid-decomposable group is a group which exhibits a lower polarity than the polar group generated by the dissociation of the acid-dissociable group. Thus, when the acid-dissociable group is dissociated under the action of acid, a polar group exhibiting a higher polarity than that of the acid-dissociable group is generated, thereby increasing the polarity. As a result, the polarity of the entire component (A1) is increased. Increasing the polarity causes a relative change in the solubility within a developing solution, and the solubility increases when the developing solution is an alkali developing solution, whereas the solubility decreases when the developing solution is a developing solution containing an organic solvent (organic developing solution).

There are no particular limitations on the acid-dissociable group, and any of the groups that have been proposed as acid-dissociable groups for the base resins of chemically amplified resists can be used. Generally, groups that form either a cyclic or chain-like tertiary alkyl ester with the carboxyl group of (meth)acrylic acid or the like, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched, acid-dissociable groups and aliphatic cyclic group-containing acid-dissociable groups.

Here, the term "aliphatic branched" refers to a branched structure having no aromaticity. The "aliphatic branched, acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched, acid-dissociable group include groups represented by the formula —C($R^{71}$)($R^{72}$)($R^{73}$). In this formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The aliphatic cyclic group within the "acid-dissociable groups containing an aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the "aliphatic cyclic group" exclusive of substituents is not limited to structures constituted from only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either a monocyclic group or a polycyclic group.

The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, in these alicyclic hydrocarbon groups, part of the carbon atoms constituting the ring may be replaced with an ether group (—O—).

Examples of acid-dissociable groups containing an aliphatic cyclic group include:

(i) a group which forms a tertiary carbon atom on the ring structure of a monovalent aliphatic cyclic group in which a substituent (a group or an atom other than hydrogen) is bonded to the carbon atom to which an atom adjacent to the acid-dissociable group (for example, "—O—" within a "—C(=O)—O— group") is bonded (hereafter, sometimes referred to as a "group which has a tertiary carbon atom on the ring structure of a cyclic alkyl group"); and (ii) a group which has a monovalent aliphatic cyclic group, and a branched alkylene group containing a tertiary carbon atom that is bonded to the monovalent aliphatic cyclic group.

In a group of type (i) described above, an example of the substituent bonded to the carbon atom to which an atom adjacent to the acid-dissociable group is bonded on the ring skeleton of the aliphatic cyclic group is an alkyl group which may have a substituent. Examples of these alkyl groups include the same groups as those described below for $R^{14}$ in formulas (1-1) to (1-9).

Specific examples of groups of type (i) include groups represented by general formulas (1-1) to (1-9) shown below.

Specific examples of groups of type (ii) include groups represented by general formulas (2-1) to (2-6) shown below.

[Chemical Formula 5]

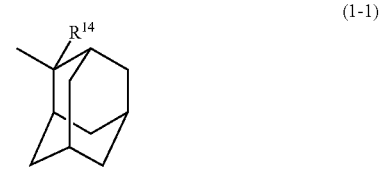

(1-1)

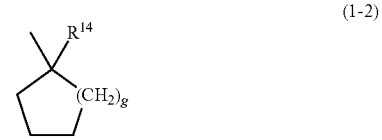

(1-2)

(1-3)

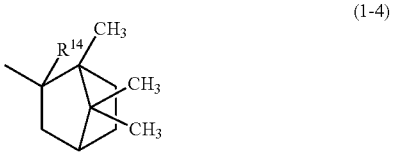

(1-4)

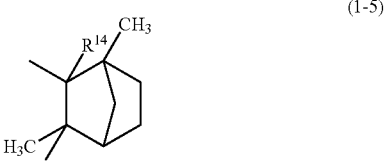

(1-5)

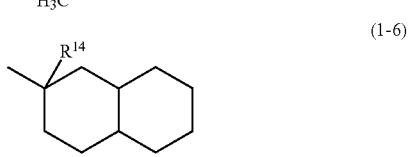

(1-6)

(1-7)

(1-8)

(1-9)

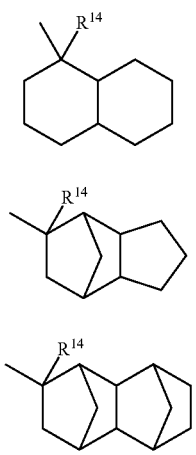

In the formulas above, $R^{14}$ represents an alkyl group which may have a substituent, and g represents an integer of 0 to 8.

[Chemical Formula 6]

(2-1)

(2-2)

(2-3)

(2-4)

(2-5)

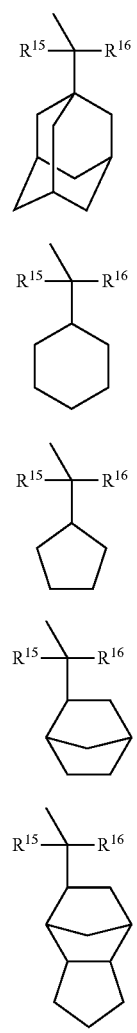

(2-6)

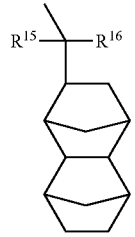

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

The linear or branched alkyl group may have a substituent. Examples of the substituent include an alkoxy group, halogen atom, halogenated alkyl group, hydroxyl group, oxygen atom (=O), cyano group, and carboxyl group.

The cyclic alkyl group preferably has 3 to 10 carbon atoms, and more preferably 5 to 8 carbon atoms. Specific examples include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane or tetracyclododecane.

The cyclic alkyl group may have a substituent. Specifically, part or all of the hydrogen atoms that constitute the alkyl group may be substituted with an alkoxy group, halogen atom, halogenated alkyl group, hydroxyl group, oxygen atom (=O), cyano group or carboxyl group or the like, and part or all of the carbon atoms that constitute the alkyl group may be substituted with a hetero atom such as an oxygen atom, a sulfur atom or a nitrogen atom.

g is preferably an integer of 0 to 3, more preferably an integer of 1 to 3, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and formulas (2-1) to (2-6), a portion of the carbon atoms that constitute the ring(s) may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type, acid-dissociable group is bonded, thereby forming an OH-containing polar group such as a carboxyl group or a hydroxyl group.

Examples of acetal-type acid-dissociable groups include groups represented by general formula (p1) shown below.

[Chemical Formula 7]

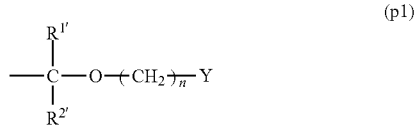

(p1)

In the formula, each of $R^{1\prime}$ and $R^{2\prime}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p1), n is preferably an integer of 0 to 2, more preferably 0 or 1, and most preferably 0.

In formula (p1), each of $R^{1\prime}$ and $R^{2\prime}$ independently represents a hydrogen atom or an alkyl group of 1 to 5 carbon atoms. Examples of the alkyl group of 1 to 5 carbon atoms for $R^{1\prime}$ and $R^{2\prime}$ include the same alkyl groups of 1 to 5 carbon atoms as those described above for R, and a methyl group or ethyl group is preferable, and a methyl group is particularly desirable.

Examples of the alkyl group of 1 to 5 carbon atoms for Y include the same groups as those described above for the alkyl group of 1 to 5 carbon atoms for $R^{1\prime}$ and $R^{2\prime}$.

The cyclic alkyl group for Y preferably contains 4 to 15 carbon atoms, more preferably 4 to 12 carbon atoms, and most preferably 5 to 10 carbon atoms. Examples include groups in which one or more hydrogen atoms have been removed from a monocycloalkane which may or may not be substituted with a fluorine atom or a fluorinated alkyl group. Specific examples include groups in which one or more hydrogen atoms have been removed from a monocycloalkane such as cyclopentane or cyclohexane.

Further, each of $R^{1\prime}$ and Y may independently represent an alkyl group of 1 to 5 carbon atoms, wherein the terminal of $R^{1\prime}$ is bonded to the terminal of Y. In this case, the cyclic group formed by the bonding of the two groups is preferably a 4- to 7-membered ring, and more preferably a 4- to 6-membered ring. Specific examples of the cyclic group include a tetrahydropyranyl ring and a tetrahydrofuranyl ring.

In the resist composition of the present invention, examples of the structural unit (a1) include a structural unit (a11) derived from an acrylate ester which may have the hydrogen atom bonded to the carbon atom on the α-position substituted with a substituent and contains an acid-decomposable group which exhibits increased polarity under the action of acid; a structural unit (a12) derived from a hydroxystyrene or hydroxystyrene derivative and having at least part of the hydrogen atoms in the hydroxyl group of the structural unit has been protected with a substituent containing an acid decomposable group; and a structural unit (a13) derived from a vinylbenzoic acid or vinylbenzoic acid derivative and having at least part of the hydrogen atom in the —C(=O)—OH group of the structural unit is protected with a substituent containing an acid decomposable group.

In the present descriptions and the claims, the term "structural unit derived from an acrylate ester" refers to a structural unit which is formed by the cleavage of the ethylenic double bond of an acrylate ester.

An "acrylate ester" refers to a compound in which the hydrogen atom at the carboxyl group terminal of acrylic acid ($CH_2$=CH—COOH) has been substituted with an organic group.

In the acrylate ester, the hydrogen atom bonded to the carbon atom on the α-position may be substituted with a substituent. The substituent for substituting the hydrogen atom bonded to the carbon atom on the α-position is an atom or group other than a hydrogen atom, and examples include an alkyl group of 1 to 5 carbon atoms, a halogenated alkyl group of 1 to 5 carbon atoms and a hydroxyalkyl group of 1 to 5 carbon atoms. The carbon atom on the α-position of an acrylate ester refers to the carbon atom having the carbonyl group bonded thereto, unless specified otherwise.

Hereafter, an acrylate ester in which the hydrogen atom bonded to the carbon atom on the α-position has been substituted with a substituent is sometimes referred to as an "α-substituted acrylate ester". Further, the generic term "(α-substituted) acrylate ester" may be used to describe both the acrylate ester and the α-substituted acrylate ester.

With respect to the α-substituted acrylate esters, the alkyl group as the substituent on the α-position is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Further, specific examples of the halogenated alkyl group as the substituent on the α-position include groups in which some or all of the hydrogen atoms of the aforementioned "alkyl group as the substituent on the α-position" have each been substituted with a halogen atom. Examples of the halogen atom include a fluorine atom, a chlorine atom, a bromine atom and an iodine atom, and a fluorine atom is particularly desirable.

Further, specific examples of the hydroxyalkyl group as the substituent on the α-position include groups in which some or all of the hydrogen atoms of the aforementioned "alkyl group as the substituent on the α-position" have each been substituted with a hydroxyl group.

It is preferable that a hydrogen atom, an alkyl group of 1 to 5 carbon atoms or a halogenated alkyl group of 1 to 5 carbon atoms is bonded to the α-position of the α-substituted acrylate esters. Of these, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The expression "structural unit derived from a hydroxystyrene or hydroxystyrene derivative" refers to a structural unit that is formed by the cleavage of the ethylenic double bond of a hydroxystyrene or hydroxystyrene derivative.

The term "hydroxystyrene derivative" is a generic term that includes both the compounds in which the α-position hydrogen atom of a hydroxystyrene has been substituted with another substituent such as an alkyl group or a halogenated alkyl group, as well as the derivatives thereof. Furthermore, unless stated otherwise, the α-position (the carbon atom on the α-position) refers to the carbon atom having the benzene ring bonded thereto.

The expression "structural unit derived from a vinylbenzoic acid or vinylbenzoic acid derivative" refers to a structural unit that is formed by the cleavage of the ethylenic double bond of a vinylbenzoic acid or vinylbenzoic acid derivative.

The term "vinylbenzoic acid derivative" is a generic term that includes both the compounds in which the α-position hydrogen atom of a vinylbenzoic acid has been substituted with another substituent such as an alkyl group or a halogenated alkyl group, as well as the derivatives thereof. Furthermore, unless stated otherwise, the α-position (the carbon atom on the α-position) refers to the carbon atom having the benzene ring bonded thereto.

The structural units (a11), (a12) and (a13) are described below in further detail.

(Structural Unit (a11))

Specific examples of the structural unit (a11) include structural units represented by general formula (a11-0-1) shown below and structural units represented by general formula (a11-0-2) shown below.

[Chemical Formula 8]

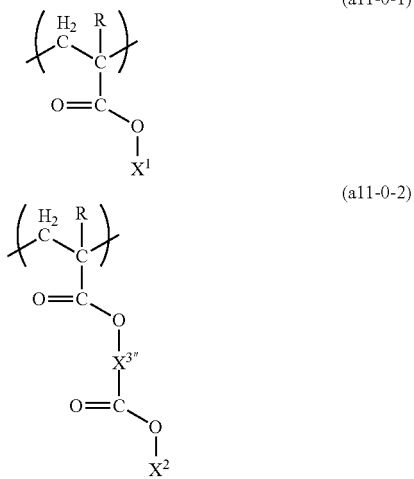

In the formulas, R represents a hydrogen atom, an alkyl group of 1 to 5 carbon atoms or a halogenated alkyl group of 1 to 5 carbon atoms, $X^1$ represents an acid-dissociable group, $Y^{3\prime\prime}$ represents a divalent linking group, and $X^2$ represents an acid-dissociable group.

In general formula (a11-0-1), R is the same as defined above for $R^2$ in formula (a0-1).

$X^1$ is not particularly limited as long as it is an acid-dissociable group. Examples include the aforementioned tertiary alkyl ester-type acid-dissociable groups and acetal-type acid-dissociable groups, and tertiary alkyl ester-type acid-dissociable groups are preferable.

In general formula (a11-0-2), R is the same as defined above.

$X^2$ is the same as defined for $X^1$ in formula (a11-0-1).

Although there are no particular limitations on the divalent linking group for $Y^{3\prime\prime}$, preferred examples include divalent hydrocarbon groups which may have a substituent, and divalent linking groups containing a hetero atom.

The description that the hydrocarbon group "may have a substituent" means that part or all of the hydrogen atoms within the hydrocarbon group may each be substituted with a substituent (an atom other than a hydrogen atom or a group).

The hydrocarbon group for $Y^{3\prime\prime}$ may be either an aliphatic hydrocarbon group or an aromatic hydrocarbon group.

An "aliphatic hydrocarbon group" refers to a hydrocarbon group that has no aromaticity.

The aliphatic hydrocarbon group as the divalent hydrocarbon group for $Y^{3\prime\prime}$ described above may be either saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group that includes a ring within the structure.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those mentioned above.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which two hydrogen atoms have been removed from a monocycloalkane is preferred. The monocycloalkane preferably contains 3 to 6 carbon atoms, and specific examples include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as the divalent hydrocarbon group for $Y^{3"}$ described above preferably has 5 to 30 carbon atoms, more preferably 5 to 20 carbon atoms, still more preferably 6 to 15 carbon atoms, and most preferably 6 to 10 carbon atoms. This number of carbon atoms does not include any carbon atoms within any substituents.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom.

Specific examples of the aromatic hydrocarbon group include groups in which two hydrogen atoms have been removed from an aforementioned aromatic hydrocarbon ring (namely, arylene groups), and groups in which one of the hydrogen atoms of a group having one hydrogen atom removed from an aforementioned aromatic hydrocarbon ring (namely, an aryl group) has been substituted with an alkylene group (for example, groups in which one further hydrogen atom has been removed from the aryl group within an arylalkyl group such as a benzyl group, phenethyl group, 1-naphthylmethyl group, 2-naphthylmethyl group, 1-naphthylethyl group or 2-naphthylethyl group). The alkylene group (the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an aforementioned aromatic hydrocarbon group may be substituted with a substituent. Examples of the substituent include an alkyl group, an alkoxy group, a halogen atom, a halogenated alkyl group, a hydroxyl group and an oxygen atom (=O).

The alkyl group for the substituent is preferably an alkyl group of 1 to 5 carbon atoms, and is most preferably a methyl group, ethyl group, propyl group, n-butyl group or tert-butyl group.

The alkoxy group as the substituent is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms of an aforementioned alkyl group have each been substituted with an aforementioned halogen atom.

Examples of the hetero atom in the "divalent linking group containing a hetero atom" for $Y^{3"}$ described above include atoms other than a carbon atom or a hydrogen atom, and specific examples include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (wherein H may be substituted with a substituent such as an alkyl group or an acyl group or the like), —S—, —S(=O)$_2$—, —S(=O)$_2$—O—, —NH—C(=O)—, =N—, and groups represented by a general formula —$Y^{21}$—O—$Y^{22}$—, —[$Y^{21}$—C(=O)—O]$_{m'}$—$Y^{22}$— or —$Y^{21}$—O—C(=O)—$Y^{22}$— [in these formulas, each of $Y^{21}$ and $Y^{22}$ independently represents a divalent hydrocarbon group which may have a substituent, O represents an oxygen atom, and m' represents an integer of 0 to 3].

When $Y^{3"}$ represents —NH—, this H may be substituted with a substituent such as an alkyl group or an aryl group (aromatic group).

In the formulas —$Y^{21}$—O—$Y^{22}$—, —[$Y^{21}$—C(=O)—O]$_{m'}$—$Y^{22}$— and —$Y^{21}$—O—C(=O)—$Y^{22}$—, each of $Y^{21}$ and $Y^{22}$ independently represents a divalent hydrocarbon group which may have a substituent. Examples of the divalent hydrocarbon groups include the same groups as those described above for the "divalent hydrocarbon group which may have a substituent" for $Y^{3"}$.

$Y^{21}$ is preferably a linear aliphatic hydrocarbon group, more preferably a linear alkylene group, still more preferably a linear alkylene group of 1 to 5 carbon atoms, and most preferably a methylene group or an ethylene group.

$Y^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by formula —[$Y^{21}$—C(=O)—O]$_{m'}$—$Y^{22}$—, m' represents an integer of 0 to 3, and is preferably an integer of 0 to 2, more preferably 0 or 1, and most preferably 1. In other words, the group represented by formula —[$Y^{21}$—C(=O)—O]$_{m'}$—$Y^{22}$— is most preferably a group represented by a formula —$Y^{21}$—C(=O)—O—$Y^{22}$—. Among such groups, groups represented by —(CH$_2$)$_{a'}$—C(=O)—O—(CH$_2$)$_{b'}$— are particularly preferred. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking groups containing a hetero atom, linear groups containing an oxygen atom as a hetero atom, such as groups containing an ether bond or an ester bond are preferable, and groups represented by the above formula —$Y^{21}$—O—$Y^{22}$—, —[$Y^{21}$—C(=O)—O]$_{m'}$—$Y^{22}$— or —$Y^{21}$—O—C(=O)—$Y^{22}$— are more preferred.

Of the various possibilities described above, the divalent linking group for $Y^{3"}$ is preferably a linear or branched alkylene group, a divalent alicyclic hydrocarbon group or a divalent linking group containing a hetero atom. Among these, a linear or branched alkylene group or a divalent linking group containing a hetero atom is particularly preferable.

Specific examples of the structural unit (a11) include structural units represented by general formulas (a1-1) to (a1-4) shown below.

[Chemical Formula 9]

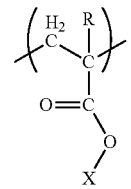

(a1-1)

-continued (a1-2)
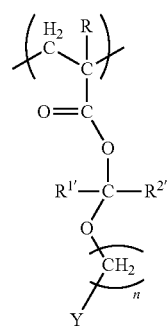

(a1-3)
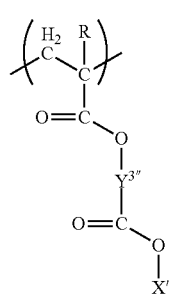

(a1-4)
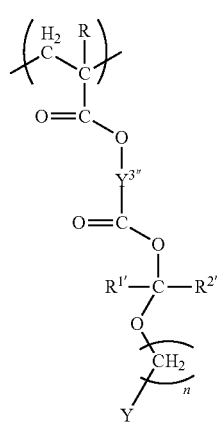

In the formulas, R, $R^{1\prime}$, $R^{2\prime}$, n, Y and $Y^{3\prime\prime}$ are each the same as defined above, and X' represents a tertiary alkyl ester-type acid-dissociable group.

In the above formulas, examples of X' include the same tertiary alkyl ester-type acid-dissociable groups as those described above.

$R^{1\prime}$, $R^{2\prime}$, n and Y are the same as defined above for $R^{1\prime}$, $R^{2\prime}$, n and Y respectively in general formula (p1) within the description relating to the "acetal-type acid-dissociable group".

Examples of $Y^{3\prime\prime}$ include the same groups as those described above for $Y^{3\prime\prime}$ in general formula (a11-0-2).

The structural unit represented by formula (a1-3) is preferably a structural unit represented by one of formulas (a1-3-13) to (a1-3-32) shown below.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 10]

(a1-1-1)
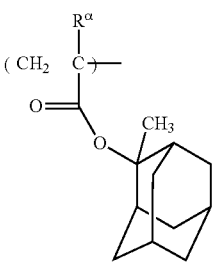

(a1-1-2)
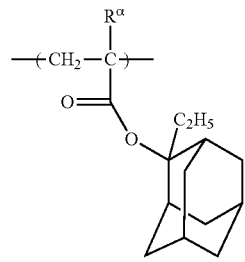

(a1-1-3)
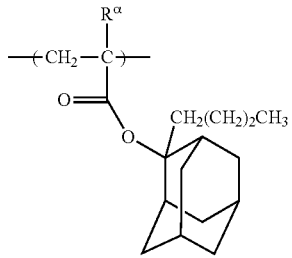

(a1-1-4)
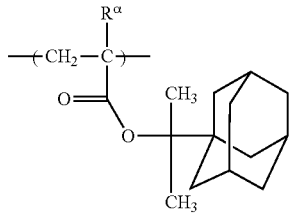

(a1-1-5)
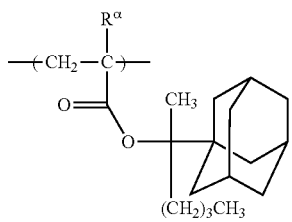

(a1-1-6)
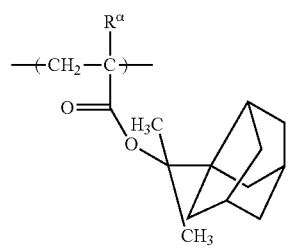

(a1-1-7)
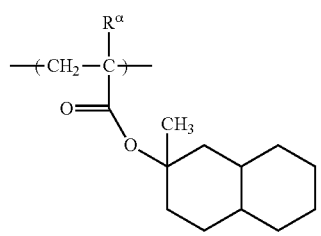
(a1-1-8)
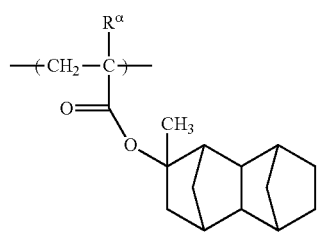
(a1-1-9)
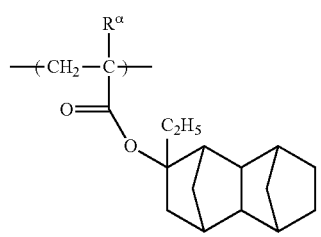
[Chemical Formula 11]
(a1-1-10)
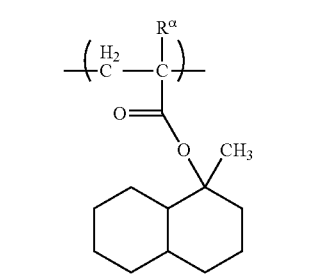
(a1-1-11)
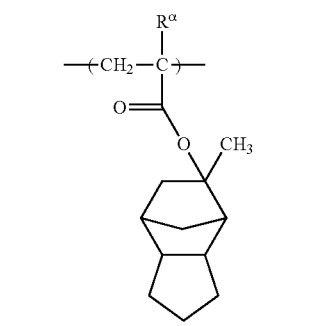
(a1-1-12)
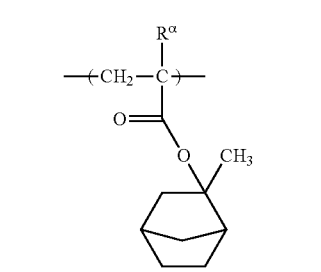
(a1-1-13)
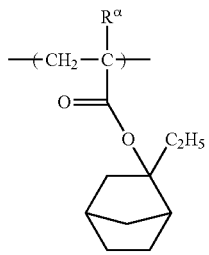
(a1-1-14)
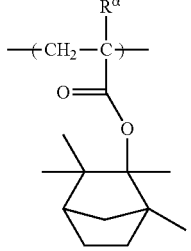
(a1-1-15)
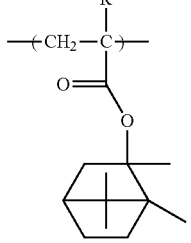
(a1-1-16)
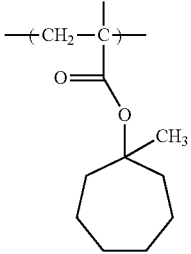
(a1-1-17)
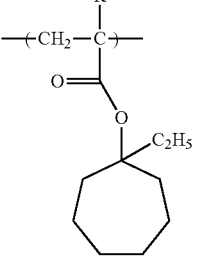
(a1-1-18)
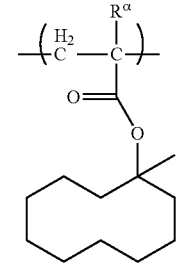

(a1-1-19) 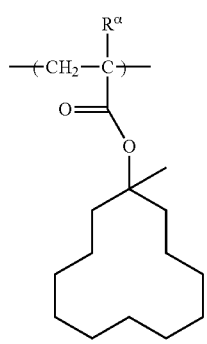
(a1-1-20) 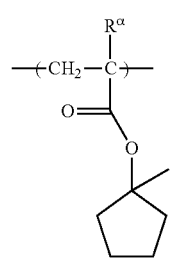
(a1-1-21) 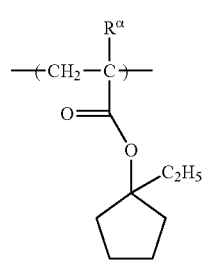
[Chemical Formula 12]
(a1-1-22) 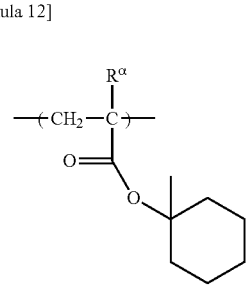
(a1-1-23) 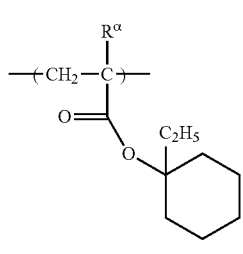
(a1-1-24) 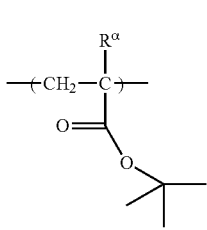
(a1-1-25) 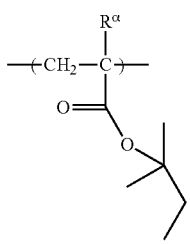
(a1-1-26) 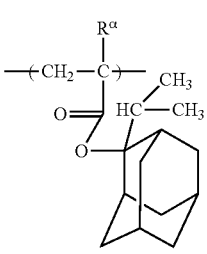
(a1-1-27) 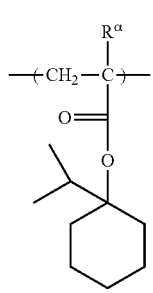
(a1-1-28) 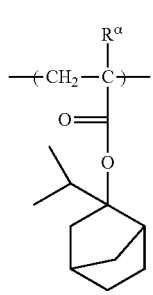
(a1-1-29) 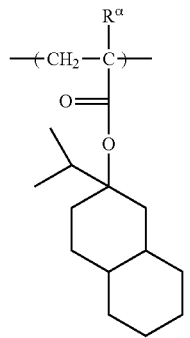

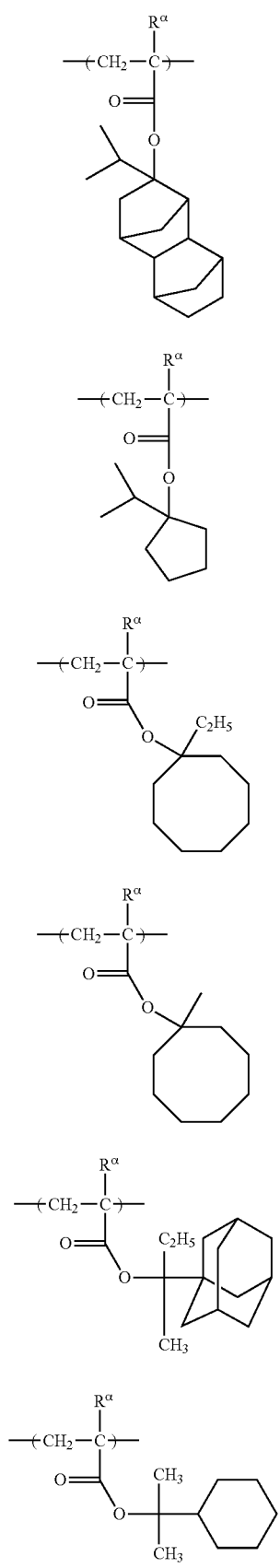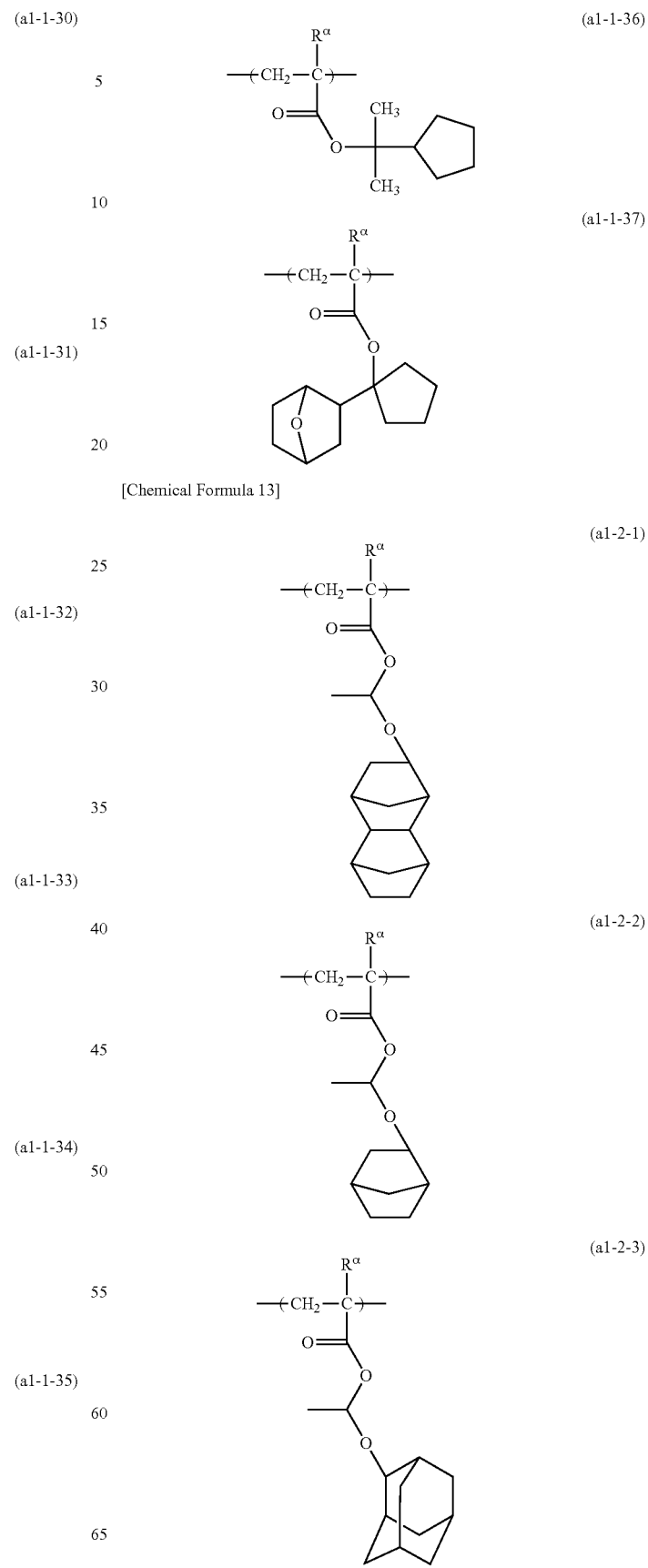

-continued
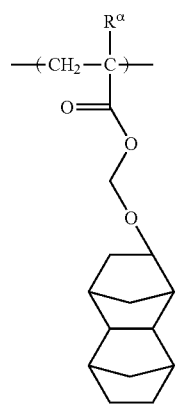 (a1-2-4)
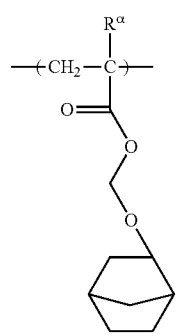 (a1-2-5)
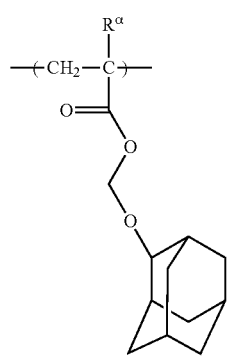 (a1-2-6)
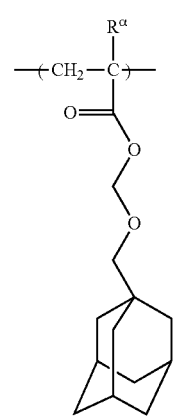 (a1-2-7)
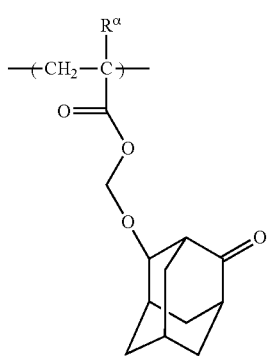 (a1-2-8)
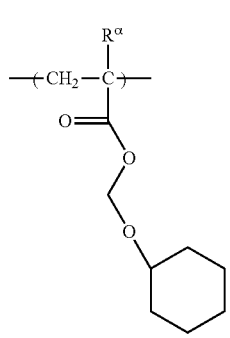 (a1-2-9)
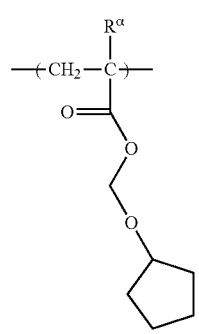 (a1-2-10)
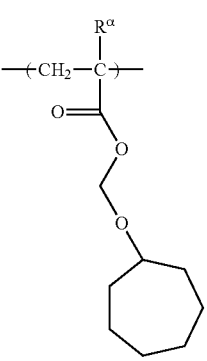 (a1-2-11)

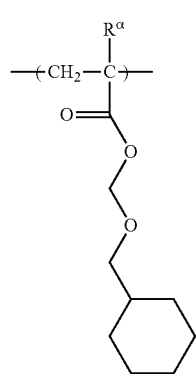 (a1-2-12)
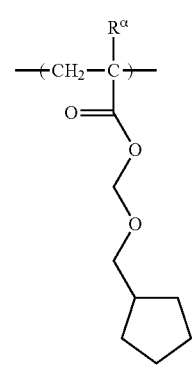 (a1-2-13)
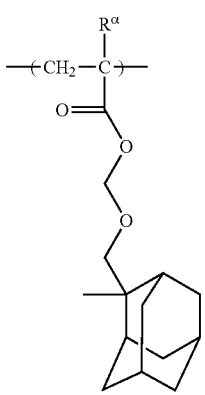 (a1-2-14)
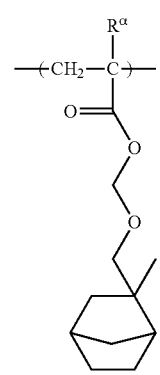 (a1-2-15)
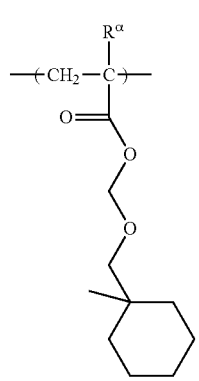 (a1-2-16)
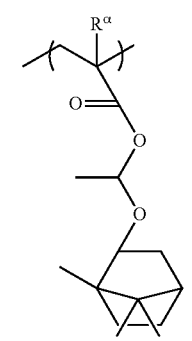 (a1-2-17)
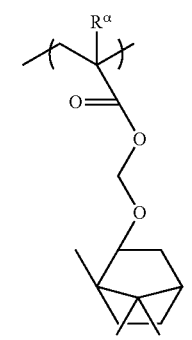 (a1-2-18)
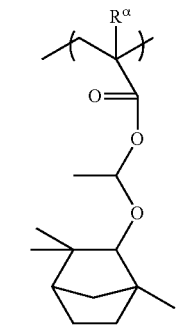 (a1-2-19)

(a1-2-20) 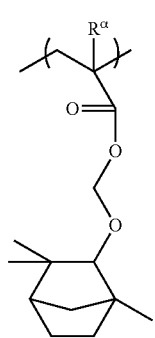
(a1-2-21) 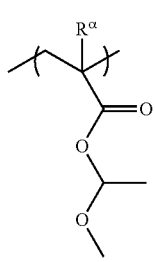
(a1-2-22) 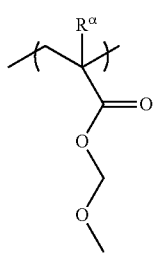
(a1-2-23) 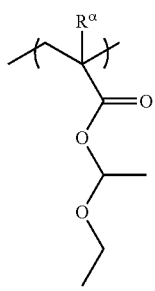
(a1-2-24) 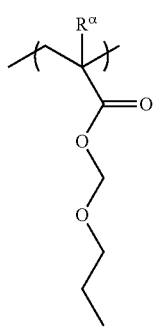
[Chemical Formula 14]
(a1-3-1) 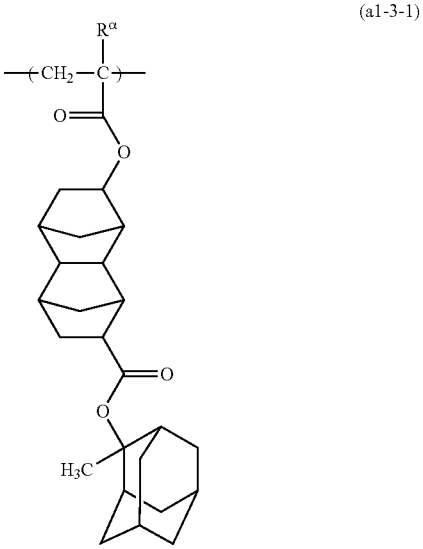
(a1-3-2) 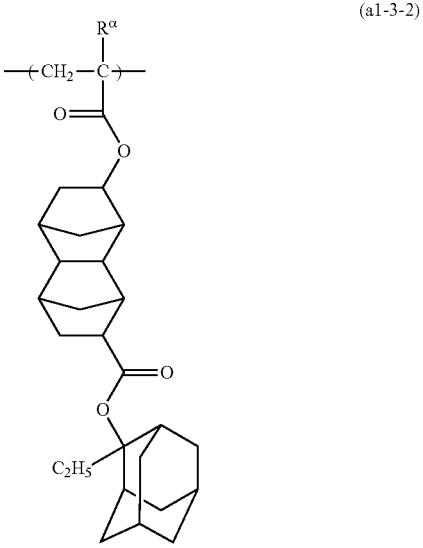
(a1-3-3) 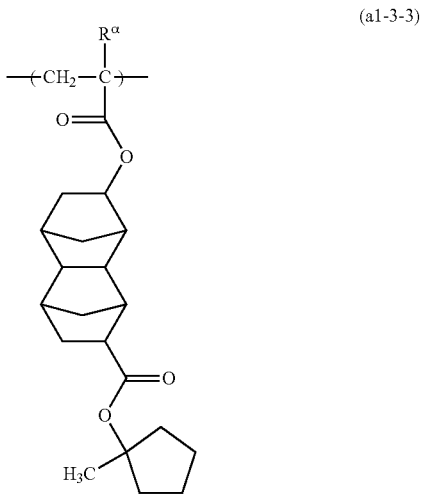

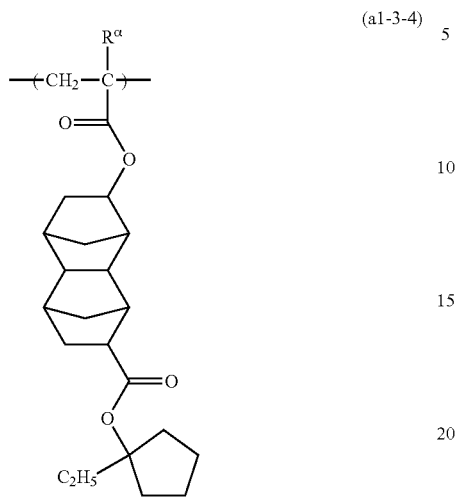
(a1-3-4)
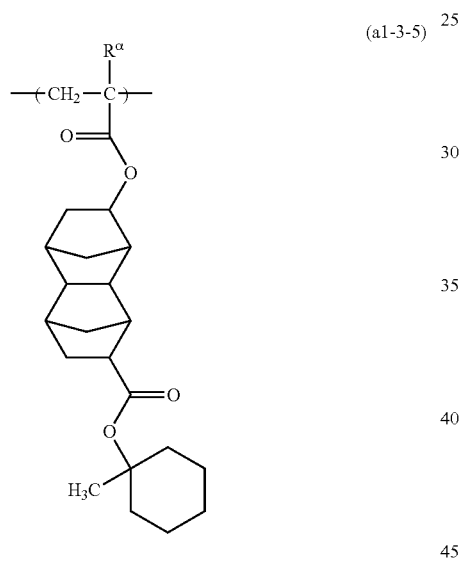
(a1-3-5)
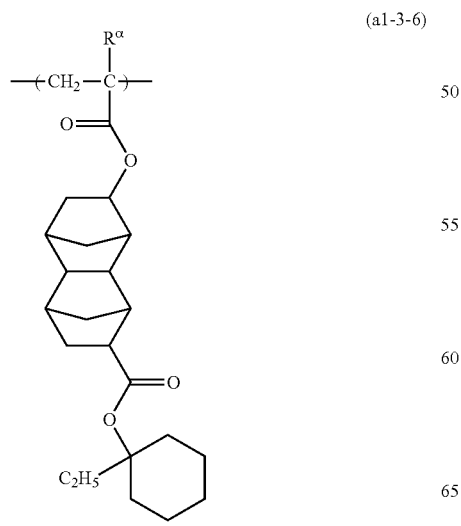
(a1-3-6)
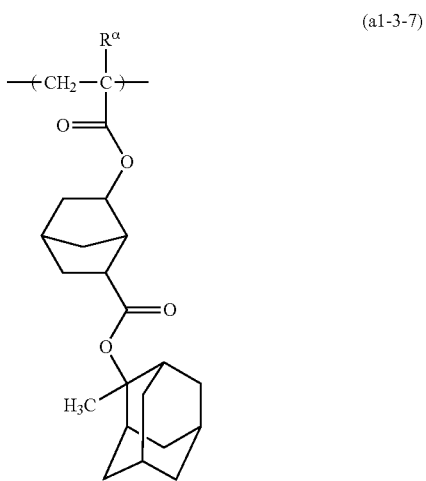
(a1-3-7)
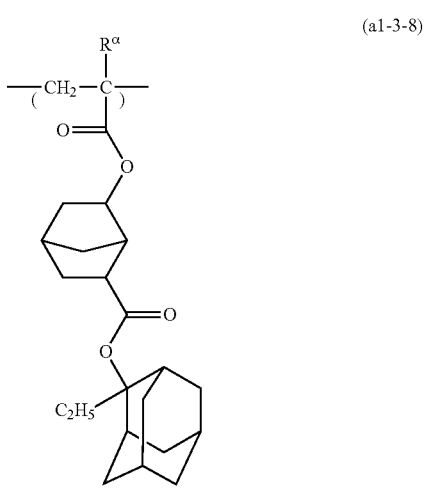
(a1-3-8)
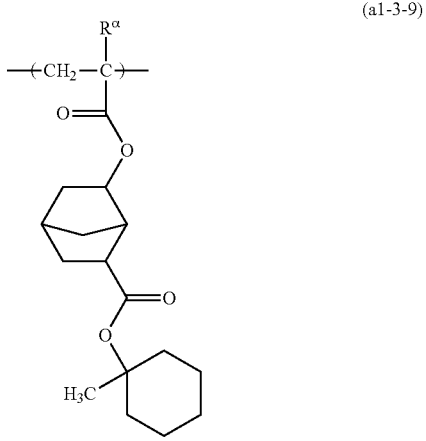
(a1-3-9)

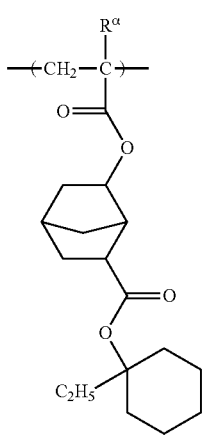 (a1-3-10)
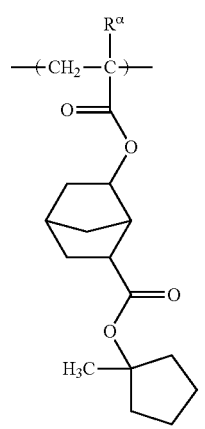 (a1-3-11)
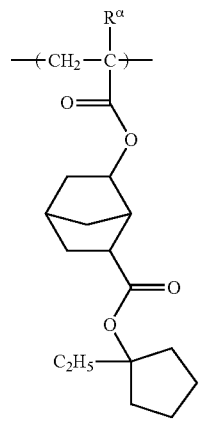 (a1-3-12)
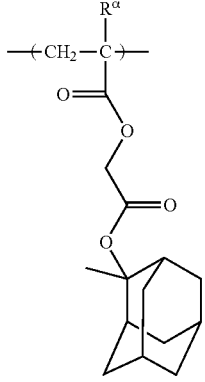 (a1-3-13)
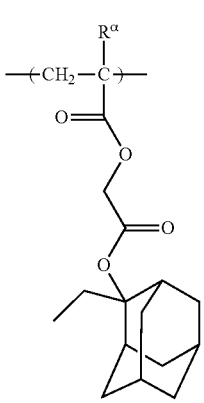 (a1-3-14)
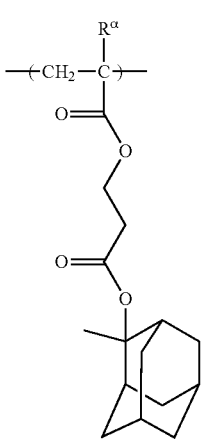 (a1-3-15)
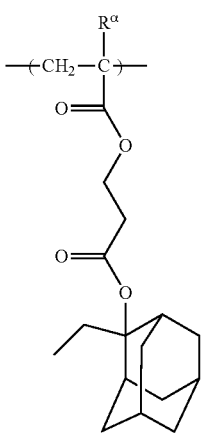 (a1-3-16)
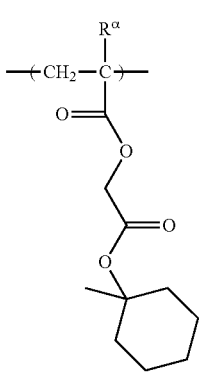 (a1-3-17)

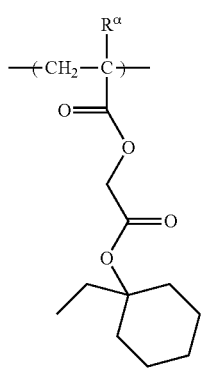 (a1-3-18)
[Chemical Formula 15]
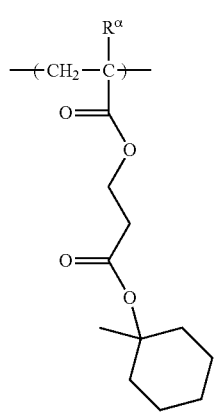 (a1-3-19)
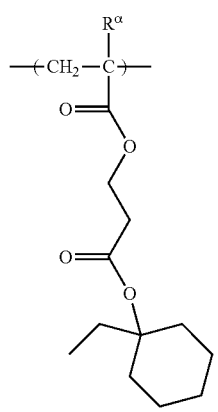 (a1-3-20)
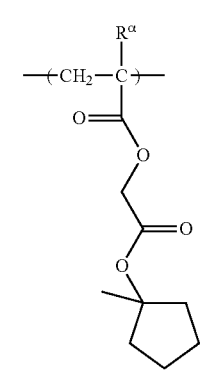 (a1-3-21)
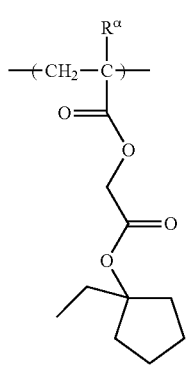 (a1-3-22)
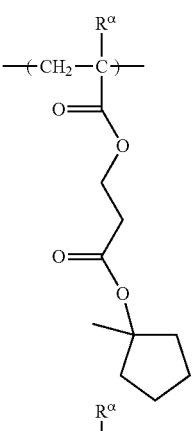 (a1-3-23)
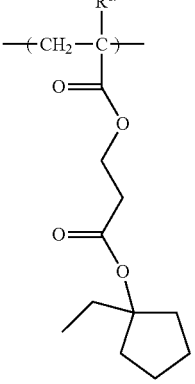 (a1-3-24)
[Chemical Formula 16]
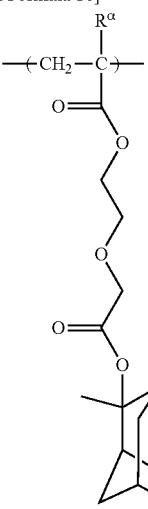 (a1-3-25)

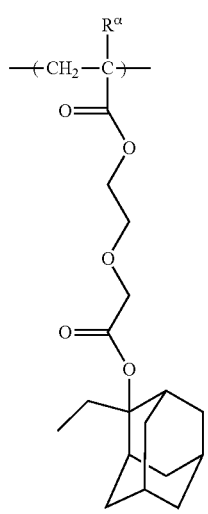 (a1-3-26)
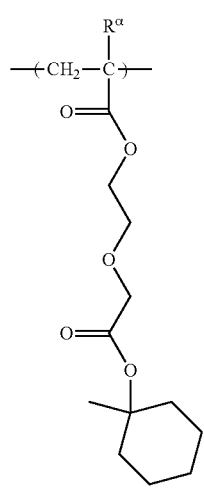 (a1-3-27)
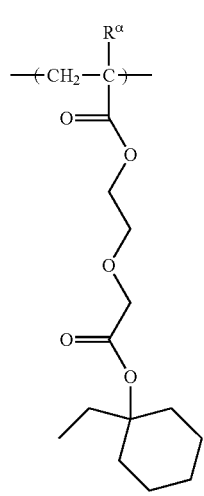 (a1-3-28)
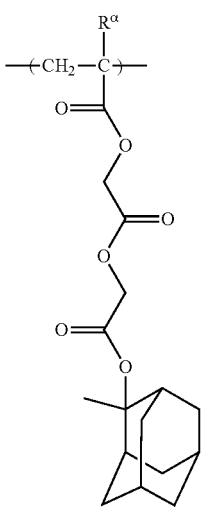 (a1-3-29)
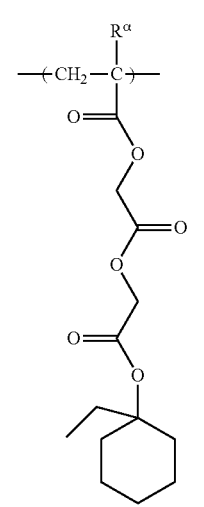 (a1-3-30)
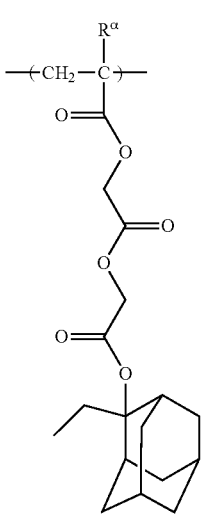 (a1-3-31)

(a1-3-32)
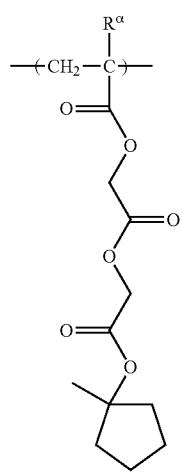
[Chemical Formula 17]
(a1-4-1)
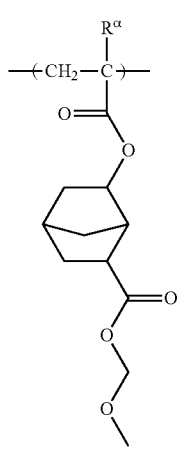
(a1-4-2)
(a1-4-3)
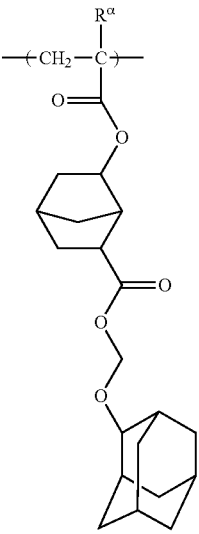
(a1-4-4)
(a1-4-5)
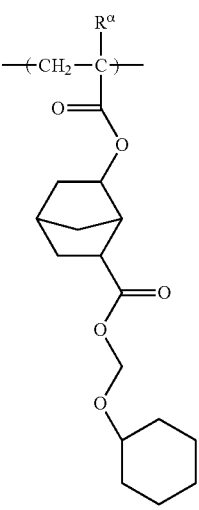

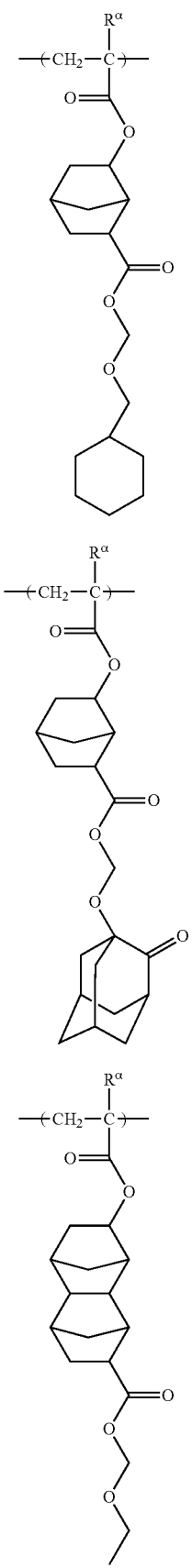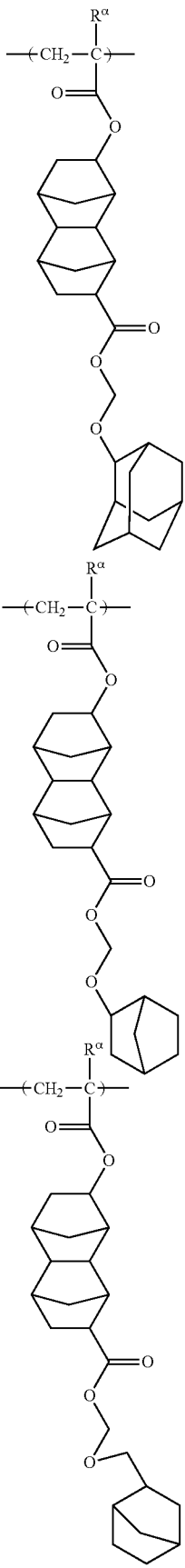

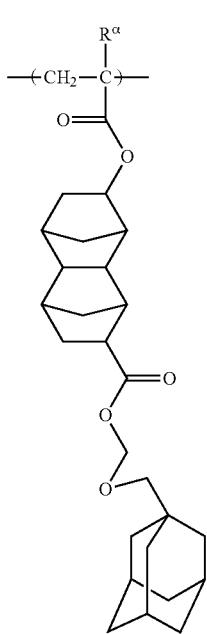

(a1-4-12)

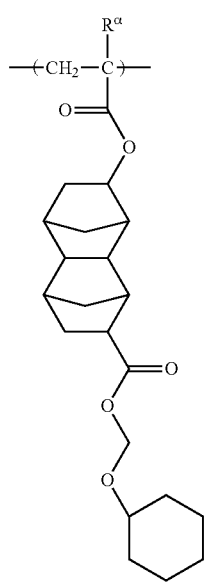

(a1-4-13)

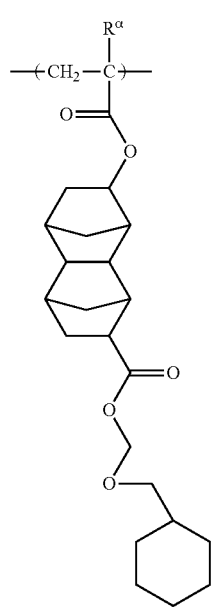

(a1-4-14)

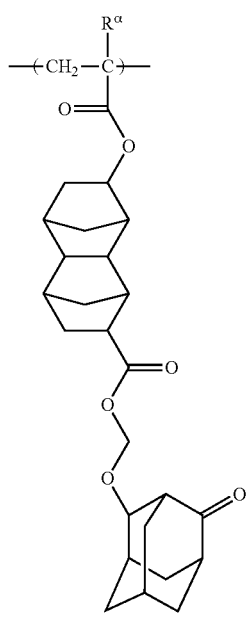

(a1-4-15)

The present invention preferably includes, as the structural unit (a11), at least one structural unit selected from the group consisting of structural units represented by general formulas (a11-0-11) to (a11-0-15) shown below.

Among these structural units, it is more preferable to include at least one structural unit selected from the group consisting of structural units represented by general formulas (a11-0-11) to (a11-0-13) and (a11-0-15) shown below.

[Chemical Formula 18]

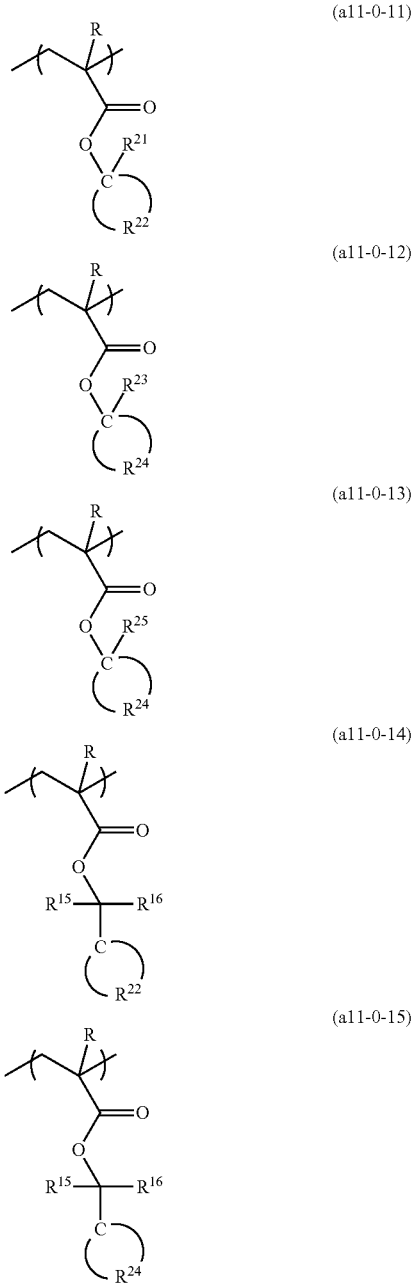

In the formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group which forms an aliphatic monocyclic group in combination with the carbon atom to which this $R^{22}$ group is bonded, $R^{23}$ represents a branched alkyl group, $R^{24}$ represents a group which forms an aliphatic polycyclic group in combination with the carbon atom to which this $R^{24}$ group is bonded, $R^{25}$ represents a linear alkyl group of 1 to 5 carbon atoms, and each of $R^{15}$ and $R^{16}$ independently represents an alkyl group.

In each of the above formulas, R is the same as defined above.

In formula (a11-0-11), examples of the alkyl group for $R^{21}$ include the same alkyl groups as those described above for $R^{14}$ in formulas (1-1) to (1-9), and a methyl group, an ethyl group, an isopropyl group, or a cyclic alkyl group (preferably a polycyclic group) is preferred.

In terms of $R^{22}$, examples of the aliphatic monocyclic group that is formed in combination with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

A portion of the carbon atoms that constitute the ring of the monocycloalkane may or may not be substituted with an ether group (—O—).

Further, the monocycloalkane may include an alkyl group of 1 to 5 carbon atoms, a fluorine atom, or a fluorinated alkyl group of 1 to 5 carbon atoms as a substituent.

Examples of the $R^{22}$ group that constitutes the aliphatic monocyclic group include linear alkylene groups which may have an ether group (—O—) interposed between the carbon atoms.

Specific examples of the structural unit represented by formula (a11-0-11) include structural units represented by the above formulas (a11-1-16) to (a1-1-23), (a1-1-27), (a1-1-31) and (a1-1-37).

In formula (a11-0-12), examples of the branched alkyl group for $R^{23}$ include the same branched alkyl groups as those described above for the alkyl group for $R^{14}$ in the formulas (1-1) to (1-9), and an isopropyl group is particularly desirable.

Examples of the aliphatic polycyclic group formed by $R^{24}$ in combination with the carbon atom to which $R^{24}$ is bonded include the polycyclic groups among the aliphatic cyclic groups described above in connection with the tertiary alkyl ester-type acid-dissociable groups.

Specific examples of the structural unit represented by general formula (a11-0-12) include the structural units represented by the above formula (a1-1-26) and formulas (a1-1-28) to (a1-1-30).

The structural unit represented by formula (a11-0-12) is preferably a structural unit in which the aliphatic polycyclic group formed by $R^{24}$ in combination with the carbon atom to which $R^{24}$ is bonded is a 2-adamantyl group, and a structural unit represented by the above formula (a1-1-26) is particularly desirable.

In formula (a11-0-13), R and $R^{24}$ are each the same as defined above.

Examples of the linear alkyl group for $R^{25}$ include the same linear alkyl groups as those described above for the alkyl group for $R^{14}$ in formulas (1-1) to (1-9), and a methyl group or an ethyl group is the most desirable.

Specific examples of the structural unit represented by formula (a11-0-13) include the structural units represented by formulas (a1-1-1), (a1-1-2) and (a1-1-7) to (a1-1-15) which were described above as specific examples of the structural unit represented by the aforementioned general formula (a1-1).

The structural unit represented by formula (a11-0-13) is preferably a structural unit in which the aliphatic polycyclic group formed by $R^{24}$ in combination with the carbon atom to which $R^{24}$ is bonded is a 2-adamantyl group, and a structural unit represented by the above formula (a1-1-1) or (a1-1-2) is particularly desirable.

Further, structural units in which the aliphatic polycyclic group formed by $R^{24}$ in combination with the carbon atom to which $R^{24}$ is bonded is a "group in which one or more hydrogen atoms have been removed from tetracyclododecane" are also preferred, and structural units represented by the above formulas (a1-1-8), (a1-1-9) and (a1-1-30) are also preferred.

In formula (a11-0-14), R and $R^{22}$ are each the same as defined above. $R^{15}$ and $R^{16}$ are the same as defined above for $R^{15}$ and $R^{16}$ respectively in the aforementioned general formulas (2-1) to (2-6).

Specific examples of the structural unit represented by formula (a11-0-14) include the structural units represented by formulas (a1-1-35) and (a1-1-36), which were described above as specific examples of the structural unit represented by general formula (a1-1).

In formula (a11-0-15), R and $R^{24}$ are each the same as defined above. $R^{15}$ and $R^{16}$ are the same as defined above for $R^{15}$ and $R^{16}$ respectively in the aforementioned general formulas (2-1) to (2-6).

Specific examples of the structural unit represented by formula (a11-0-15) include the structural units represented by formulas (a1-1-4) to (a 1-1-6) and (a 1-1-34), which were described above as specific examples of the structural unit represented by the aforementioned general formula (a1-1).

(Structural Unit (a12), Structural Unit (a13))

In the present description, the structural unit (a12) is a structural unit derived from a hydroxystyrene or hydroxystyrene derivative and having at least part of the hydrogen atoms in the hydroxyl group of the structural unit has been protected with a substituent containing an acid decomposable group.

Further, the structural unit (a13) is a structural unit derived from a vinylbenzoic acid or vinylbenzoic acid derivative and having at least part of the hydrogen atom in the —C(=O)—OH group of the structural unit is protected with a substituent containing an acid decomposable group.

In the structural units (a12) and (a13), preferred examples of the substituent containing an acid-decomposable group include the same tertiary alkyl ester-type acid-dissociable groups and acetal-type acid-dissociable groups as those described above in connection with the structural unit (a11).

Preferred examples of the structural units (a12) and (a13) include structural units represented by any one of general formulas (a12-1) to (a12-4) and general formula (a13-1) shown below.

[Chemical Formula 19]

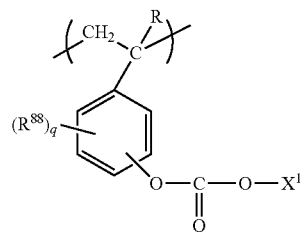
(a12-1)

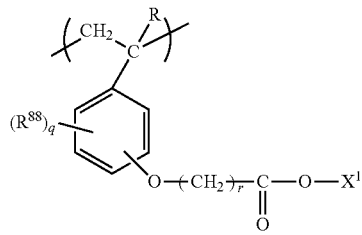
(a12-2)

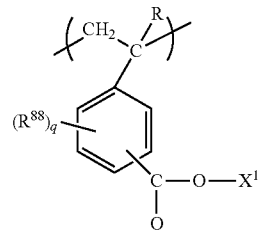
(a12-3)

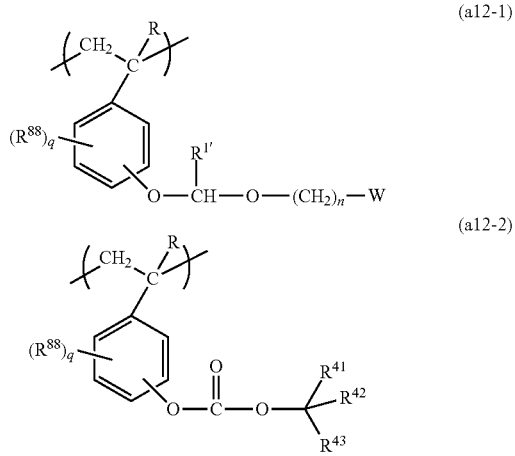

(a12-4)

(a13-1)

In formulas (a12-1) to (a12-4) and (a13-1), R is the same as defined above, $R^{88}$ represents a halogen atom, an alkyl group of 1 to 5 carbon atoms or a halogenated alkyl group of 1 to 5 carbon atoms, q represents an integer of 0 to 4, $R^{1'}$ is the same as defined above; n represents an integer of 0 to 3, W represents an aliphatic cyclic group, an aromatic cyclic hydrocarbon group or an alkyl group of 1 to 5 carbon atoms, r represents 1 to 3, each of $R^{41}$, $R^{42}$ and $R^{43}$ independently represents a linear or branched alkyl group, and $X^1$ represents an acid-dissociable group.

In the aforementioned formulas (a12-1) to (a12-4) and (a13-1), the bonding position for the groups —O—$CHR^{1'}$-O—$(CH_2)_n$—W, —O—C(O)—O—$C(R^{41})(R^{42})(R^{43})$, —O—$(CH_2)_r$—C(O)—O—$X^1$ and —C(O)—O—$X^1$ on the phenyl group may be any one of the o-position, the m-position, or the p-position of the phenyl group, and the p-position is most desirable as the effects of the present invention are improved.

$R^{88}$ represents a halogen atom, an alkyl group of 1 to 5 carbon atoms or a halogenated alkyl group of 1 to 5 carbon atoms.

Examples of the halogen atom for $R^{88}$ include a fluorine atom, a chlorine atom, a bromine atom and an iodine atom, and a fluorine atom is preferable.

Examples of the alkyl group of 1 to 5 carbon atoms and halogenated alkyl group of 1 to 5 carbon atoms for $R^{88}$ include the same alkyl groups of 1 to 5 carbon atoms and halogenated alkyl groups of 1 to 5 carbon atoms as those described above for R.

When q is 1, the substitution position of $R^{88}$ may be any of the o-position, the m-position and the p-position.

When q is 2, any desired combination of substitution positions can be used.

However, $1 \leq p+q \leq 5$.

q is an integer of 0 to 4, preferably 0 or 1, and most preferably 0 from an industrial viewpoint.

n represents an integer of 0 to 3, is preferably an integer of 0 to 2, more preferably 0 or 1, and most preferably 0.

The aliphatic cyclic group for W is a monovalent aliphatic cyclic group. The aliphatic cyclic group can be selected appropriately, for example, from the multitude of groups that have been proposed for conventional ArF resists. Specific examples of the aliphatic cyclic group include aliphatic monocyclic groups of 5 to 7 carbon atoms and aliphatic polycyclic groups of 10 to 16 carbon atoms.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the aliphatic cyclic group exclusive of substituents is not limited to groups constituted from only carbon and hydrogen (not limited to hydrocarbon groups), and may include an oxygen atom or the like in the ring structure.

Examples of the aliphatic monocyclic groups of 5 to 7 carbon atoms include groups in which one hydrogen atom has been removed from a monocycloalkane, and specific examples include groups in which one hydrogen atom has been removed from cyclopentane or cyclohexane or the like.

Examples of the aliphatic polycyclic group of 10 to 16 carbon atoms include groups in which one hydrogen atom has been removed from a bicycloalkane, tricycloalkane, or tetracycloalkane or the like. Specific examples include groups in which one hydrogen atom has been removed from a polycycloalkane such as adamantane, norbornane, isobornane, tricyclodecane or tetracyclododecane. Of these, an adamantyl group, a norbornyl group or a tetracyclododecyl group is preferred industrially, and an adamantyl group is particularly desirable.

Examples of the aromatic cyclic hydrocarbon group for W include aromatic polycyclic groups of 10 to 16 carbon atoms. Specific examples of such aromatic polycyclic groups include groups in which one hydrogen atom has been removed from naphthalene, anthracene, phenanthrene or pyrene or the like. Specific examples include a 1-naphthyl group, 2-naphthyl group, 1-anthryl group, 2-anthryl group, 1-phenanthryl group, 2-phenanthryl group, 3-phenanthryl group and 1-pyrenyl group, and a 2-naphthyl group is particularly preferred industrially.

Examples of the alkyl group of 1 to 5 carbon atoms for W include the same groups as those alkyl groups of 1 to 5 carbon atoms which may be bonded to the α-position of the aforementioned hydroxystyrene, although a methyl group or an ethyl group is preferable, and an ethyl group is most preferable.

Each of $R^{41}$ to $R^{43}$ preferably represents an alkyl group of 1 to 5 carbon atoms, and more preferably an alkyl group of 1 to 3 carbon atoms. Specific examples include the same alkyl groups of 1 to 5 carbon atoms as those described above for R.

The acid-dissociable group for $X^1$ is the same as defined above for the acid-dissociable group for $X^1$ in the aforementioned formula (a11-0-1).

r is preferably 1 or 2, and more preferably 1.

Among the above structural units (a12) and (a13), the structural unit (a12) is preferable, and structural units represented by general formula (a12-1) and structural units represented by general formula (a12-4) are more preferable.

Specific preferred examples of the structural unit (a12) are shown below.

[Chemical Formula 20]

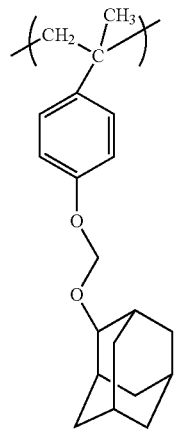

(a12-1-1)

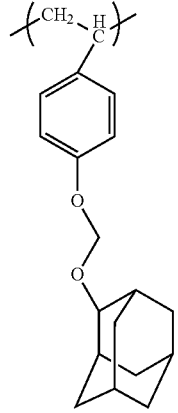

(a12-1-2)

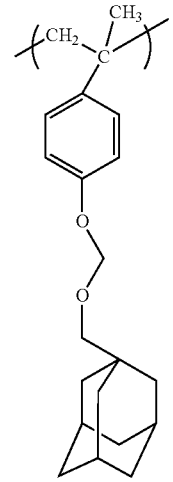

(a12-1-3)

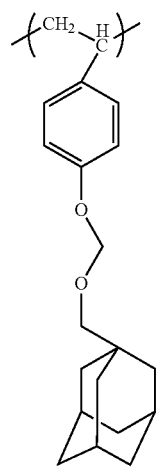 (a12-1-4)
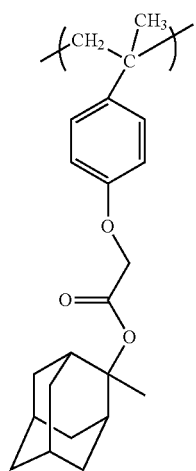 (a12-1-5)
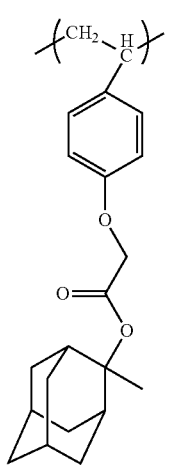 (a12-1-6)
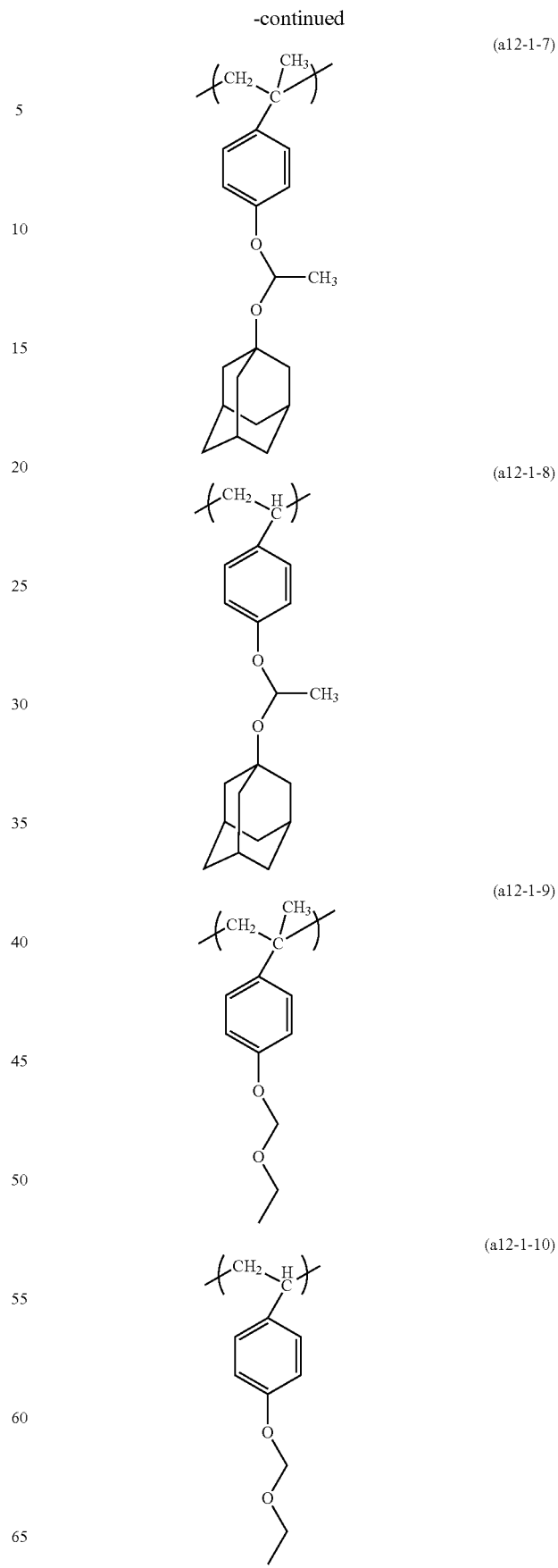

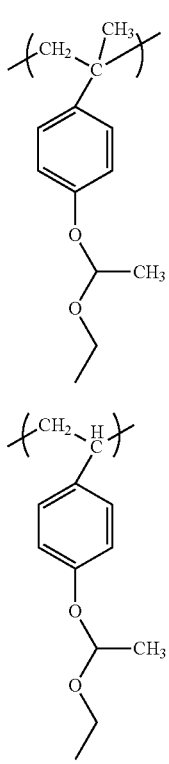

As the structural unit (a12), at least one type of structural unit selected from the group represented by chemical formulas (a12-1-1) to (a12-1-12) is preferable, and at least one type of structural unit selected from the group represented by chemical formulas (a12-1-1), (a12-1-2) and (a12-1-5) to (a12-1-12) are the more preferable.

The structural unit (a1) contained within the component (A1) may be either a single type of structural unit or a combination of two or more types of structural units.

Among the examples described above, the structural unit (a1) is preferably a structural unit (a11) derived from an acrylate ester which may have the hydrogen atom bonded to the carbon atom on the α-position substituted with a substituent.

The amount of the structural unit (a1) within the component (A1), based on the combined total of all the structural units that constitute the component (A1), is preferably within a range from 5 to 70 mol %, more preferably from 10 to 65 mol %, and still more preferably from 15 to 60 mol %. When the amount of the structural unit (a1) is at least as large as the lower limit of the above range, a pattern can be formed easily using a resist composition prepared from the component (A1), and the lithography properties such as the sensitivity, the resolution and the LWR also improve. On the other hand, when the amount of the structural unit (a1) is not more than the upper limit of the above range, a good balance can be achieved with the other structural units.

(Structural Unit (a5))

The structural unit (a5) is a structural unit having an —$SO_2$-containing cyclic group (but excluding structural units that can be classified as the aforementioned structural unit (a0)). When the component (A1) is used in forming a resist film, the —$SO_2$-containing cyclic group of the structural unit (a5) is effective in improving the adhesion of the resist film to the substrate. Further, because the structural unit (a5) also improves the affinity of the component (A1) with developing solutions containing water, such as alkali developing solutions, the structural unit (a5) is particularly effective in an alkali developing process.

Here, an "—$SO_2$-containing cyclic group" refers to a cyclic group having a ring containing —$SO_2$— within the ring structure, and refers specifically to a cyclic group in which the sulfur atom (S) within —$SO_2$— forms a part of the ring structure of the cyclic group. In the —$SO_2$-containing cyclic group, the ring containing —$SO_2$— within the ring structure is counted as the first ring, and a cyclic group having only this first ring is referred to as a monocyclic group, and a group containing other ring structures is described as a polycyclic group regardless of the structure of the other rings. The —$SO_2$-containing cyclic group may be either a monocyclic group or a polycyclic group.

The —$SO_2$-containing cyclic group is preferably a cyclic group containing —O—$SO_2$— within the ring structure, namely a cyclic group containing a sultone ring in which the —O—S— within the —O—$SO_2$— forms a part of the ring structure of the cyclic group.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be either an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which part of the carbon atoms that constitute the ring structure have been substituted with either —$SO_2$— or —O—$SO_2$—. More specific examples include groups in which at least one hydrogen atom has been removed from an aliphatic hydrocarbon ring in which a —$CH_2$— moiety that constitutes part of the ring structure has been substituted with —$SO_2$—, and groups in which at least one hydrogen atom has been removed from an aliphatic hydrocarbon ring in which a —$CH_2$—$CH_2$—moiety that constitutes part of the ring structure has been substituted with —O—$SO_2$—.

The alicyclic hydrocarbon ring preferably contains 3 to 20 carbon atoms, and more preferably 3 to 12 carbon atoms.

The alicyclic hydrocarbon ring may be either polycyclic or monocyclic. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (=O), —COOR", —OC(=O)R", hydroxyalkyl group and cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably contains 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

More specific examples of the —SO$_2$-containing cyclic group include groups represented by general formulas (3-1) to (3-4) shown below.

[Chemical Formula 21]

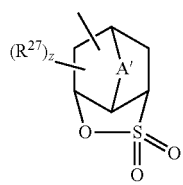

(3-1)

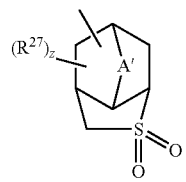

(3-2)

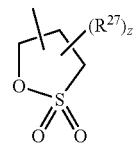

(3-3)

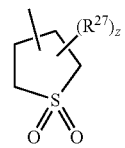

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In the above general formulas (3-1) to (3-4), A' represents an oxygen atom (—O—), a sulfur atom (—S—), or an alkylene group of 1 to 5 carbon atoms which may contain an oxygen atom or a sulfur atom.

The alkylene group of 1 to 5 carbon atoms for A' is preferably a linear or branched alkylene group, and specific examples include a methylene group, ethylene group, n-propylene group and isopropylene group.

Examples of alkylene groups which contain an oxygen atom or a sulfur atom include the aforementioned alkylene groups in which —O— or —S— is either bonded to the terminal of the alkylene group or interposed between carbon atoms of the alkylene group. Specific examples of such alkylene groups include —O—CH$_2$—, —CH$_2$—O—CH$_2$—, —S—CH$_2$— and —CH$_2$—S—CH$_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^{27}$ groups may be the same or different.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above as the substituent for the —SO$_2$-containing cyclic group.

Specific examples of the cyclic groups represented by the aforementioned general formulas (3-1) to (3-4) are shown below. In the formulas shown below, "Ac" represents an acetyl group.

[Chemical Formula 22]
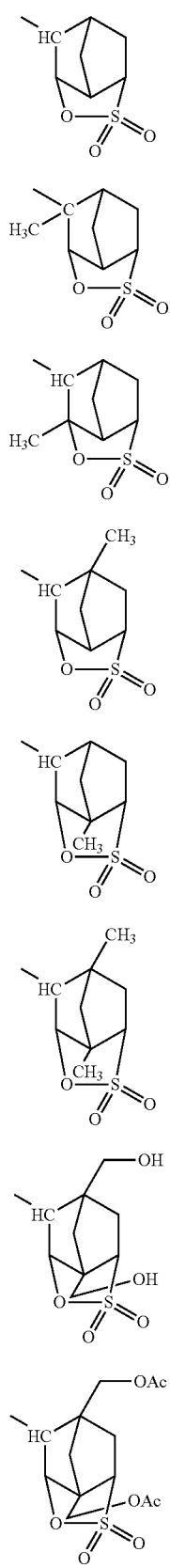
(3-1-1)
(3-1-2)
(3-1-3)
(3-1-4)
(3-1-5)
(3-1-6)
(3-1-7)
(3-1-8)
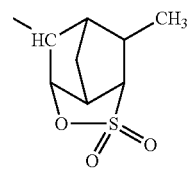
(3-1-9)
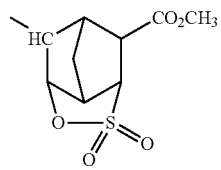
(3-1-10)
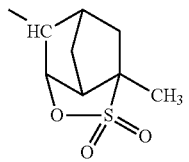
(3-1-11)
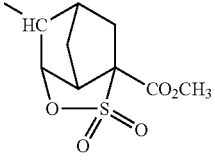
(3-1-12)
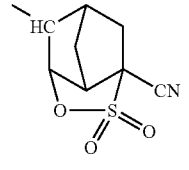
(3-1-13)
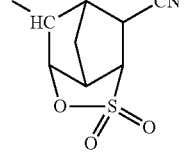
(3-1-14)
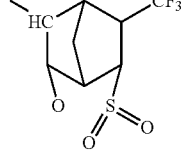
(3-1-15)
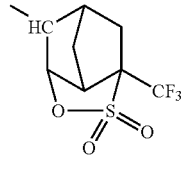
(3-1-16)
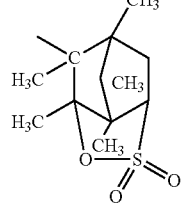
(3-1-17)

-continued
(3-1-18)
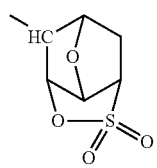
(3-1-19)
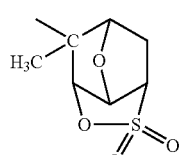
(3-1-20)
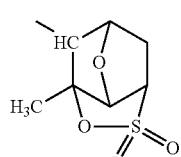
(3-1-21)
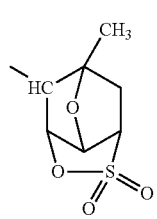
[Chemical Formula 23]
(3-1-22)
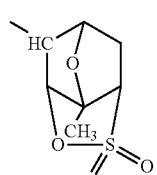
(3-1-22)
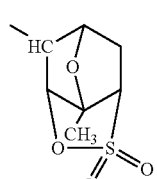
(3-1-23)
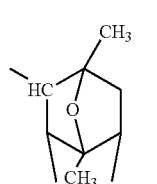
(3-1-24)
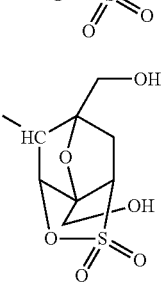
-continued
(3-1-25)
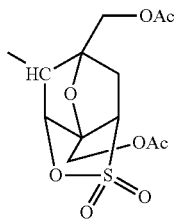
(3-1-26)
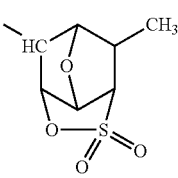
(3-1-27)
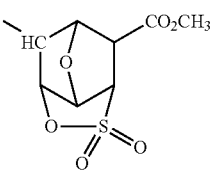
(3-1-28)
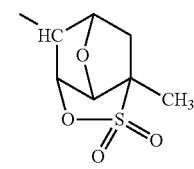
(3-1-29)
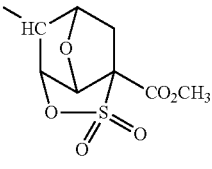
(3-1-30)
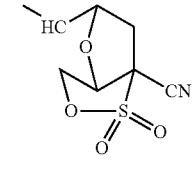
(3-1-31)
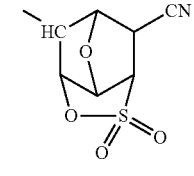
(3-1-32)
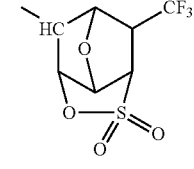
(3-1-33)
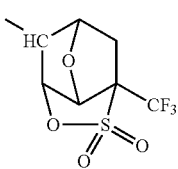

[Chemical Formula 24]

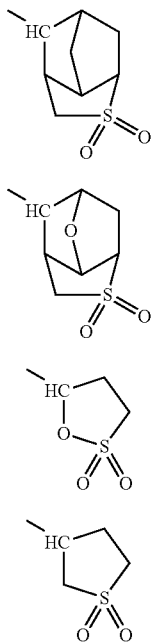

(3-2-1)

(3-2-2)

(3-3-1)

(3-4-1)

Of the groups shown above, the —SO$_2$-containing cyclic group is preferably a group represented by the above general formula (3-1), more preferably at least one group selected from the group consisting of groups represented by the above chemical formulas (a11-0-1), (3-1-18), (3-3-1) and (3-4-1), and most preferably a group represented by the chemical formula (3-1-1) or (3-4-1).

More specific examples of the structural unit (a5) include structural units represented by general formula (a5-0) shown below.

[Chemical Formula 25]

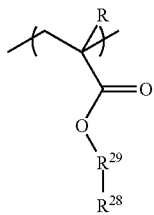

(a5-0)

In the formula, R represents a hydrogen atom, an alkyl group of 1 to 5 carbon atoms or a halogenated alkyl group of 1 to 5 carbon atoms, $R^{28}$ represents a group containing a sultone ring, and $R^{29}$ represents a single bond or a divalent linking group.

In formula (a5-0), R is the same as defined above.

$R^{28}$ is the same as the group containing a sultone ring described above.

$R^{29}$ may be either a single bond or a divalent linking group. A divalent linking group is preferable in terms of achieving superior effects for the present invention.

There are no particular limitations on the divalent linking group for $R^{29}$, and examples include the same groups as those mentioned above for $Y^{3\prime\prime\prime}$ in the aforementioned general formula (a1-3). Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above for the aliphatic hydrocarbon group for $Y^{3\prime\prime\prime}$.

The divalent linking group containing an ester linkage is preferably a group represented by general formula: —$R^{30}$—C(=O)—O— (wherein $R^{30}$ represents a divalent linking group). In other words, the structural unit (a5) is preferably a structural unit represented by general formula (a5-0-1) shown below.

[Chemical Formula 26]

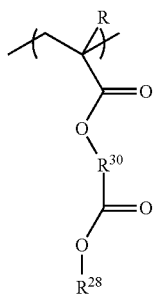

(a5-0-1)

In the formula, R and $R^{28}$ are each the same as defined above, and $R^{30}$ represents a divalent linking group.

There are no particular limitations on $R^{30}$, and examples include the same divalent linking groups as those described above for $Y^{3\prime\prime\prime}$ in general formula (a1-3).

The divalent linking group for $R^{30}$ is preferably a linear or branched alkylene group, an aliphatic hydrocarbon group that includes a ring within the structure, or a divalent linking group containing a hetero atom, and is more preferably a linear or branched alkylene group, or a divalent linking group containing an oxygen atom as a hetero atom.

As the linear alkylene group, a methylene group or ethylene group is preferable, and a methylene group is particularly desirable.

As the branched alkylene group, an alkylmethylene group or alkylethylene group is preferable, and —CH(CH$_3$)—, —C(CH$_3$)$_2$— and —C(CH$_3$)$_2$CH$_2$— are particularly desirable.

The divalent linking group containing an oxygen atom is preferably a divalent linking group containing an ether linkage or an ester linkage.

The structural unit (a5) contained within the component (A1) may be either a single type of structural unit or a combination of two or more types of structural units.

In those cases where the component (A1) includes the structural unit (a5), the amount of the structural unit (a5), based on the combined total of all the structural units that constitute the component (A1), is preferably within a range from 1 to 60 mol %, more preferably from 5 to 50 mol %, and still more preferably from 10 to 40 mol %. When the amount of the structural unit (a5) is at least as large as the lower limit of the above range, the effects achieved by including the structural unit (a5) can be satisfactorily realized, whereas when the amount of the structural unit (a5) is not more than the upper limit of the above range, a good balance can be achieved with the other structural units, and various lithography properties such as the DOF and the CDU, and the pattern shape can be improved.

(Structural Unit (a2))

The component (A1) may also include, in addition to the structural units (a0), (a1) and (a5), a structural unit (a2) containing a lactone-containing cyclic group.

When the component (A1) is used in forming a resist film, the lactone-containing cyclic group of the structural unit (a2) is effective in improving the adhesion of the resist film to the substrate. Further, because the structural unit (a2) also improves the affinity of the component (A1) with developing solutions containing water, such as alkali developing solutions, the structural unit (a2) is particularly effective in an alkali developing process.

If any of the aforementioned structural units (a0), (a1) or (a5) includes a lactone-containing cyclic group within the structure of the structural unit, then although that structural unit corresponds with the definition of the structural unit (a2), it is deemed to be a structural unit (a0), (a1) or (a5), and is not classified as the structural unit (a2).

In the present description, in a formula, "*" represents a valence bond.

The term "lactone-containing cyclic group" refers to a cyclic group including a ring (lactone ring) containing —O—C(=O)— within the ring structure. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be monocyclic or polycyclic.

There are no particular limitations on the lactone-containing cyclic group in the structural unit (a2), and any desired group may be used. Specific examples include the lactone-containing cyclic groups represented by general formulas (a3-r-1) to (a2-r-7) shown below.

[Chemical Formula 27]

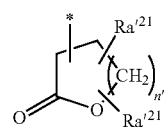
(a2-r-1)

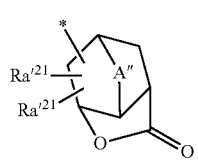
(a2-r-2)

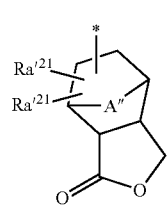
(a2-r-3)

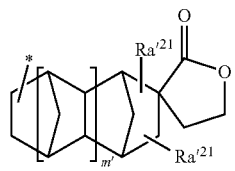
(a2-r-4)

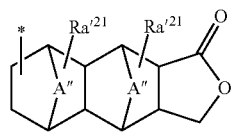
(a2-r-5)

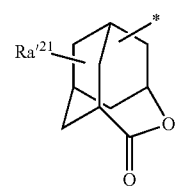
(a2-r-6)

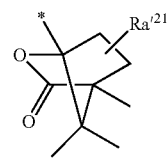
(a2-r-7)

In the formulas, each $Ra'^{21}$ independently represents a hydrogen atom, alkyl group, alkoxy group, halogen atom, halogenated alkyl group, hydroxyl group, —COOR", —OC(=O)R", hydroxyalkyl group or cyano group, A" represents an oxygen atom, a sulfur atom, or an alkylene group of 1 to 5 carbon atoms which may contain an oxygen atom or a sulfur atom, n' represents an integer of 0 to 2, and m' represents 0 or 1.

Specific examples of the structural units represented by the above general formulas (a2-r-1) to (a2-r-7) are shown below.

[Chemical Formula 28]

(r-lc-1-1)

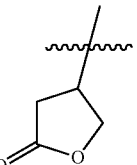
(r-lc-1-2)

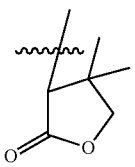
(r-lc-1-3)

-continued
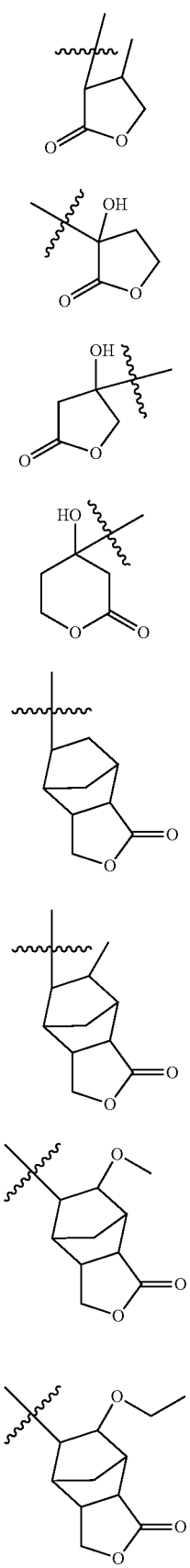
(r-Ic-1-4)
(r-Ic-1-5)
(r-Ic-1-6)
(r-Ic-1-7)
(r-Ic-3-1)
(r-Ic-3-2)
(r-Ic-3-3)
(r-Ic-3-4)
-continued
(r-Ic-3-5)
[Chemcial Formula 29]
(r-Ic-2-1)
(r-Ic-2-2)
(r-Ic-2-3)
(r-Ic-2-4)
(r-Ic-2-5)
(r-Ic-2-6)
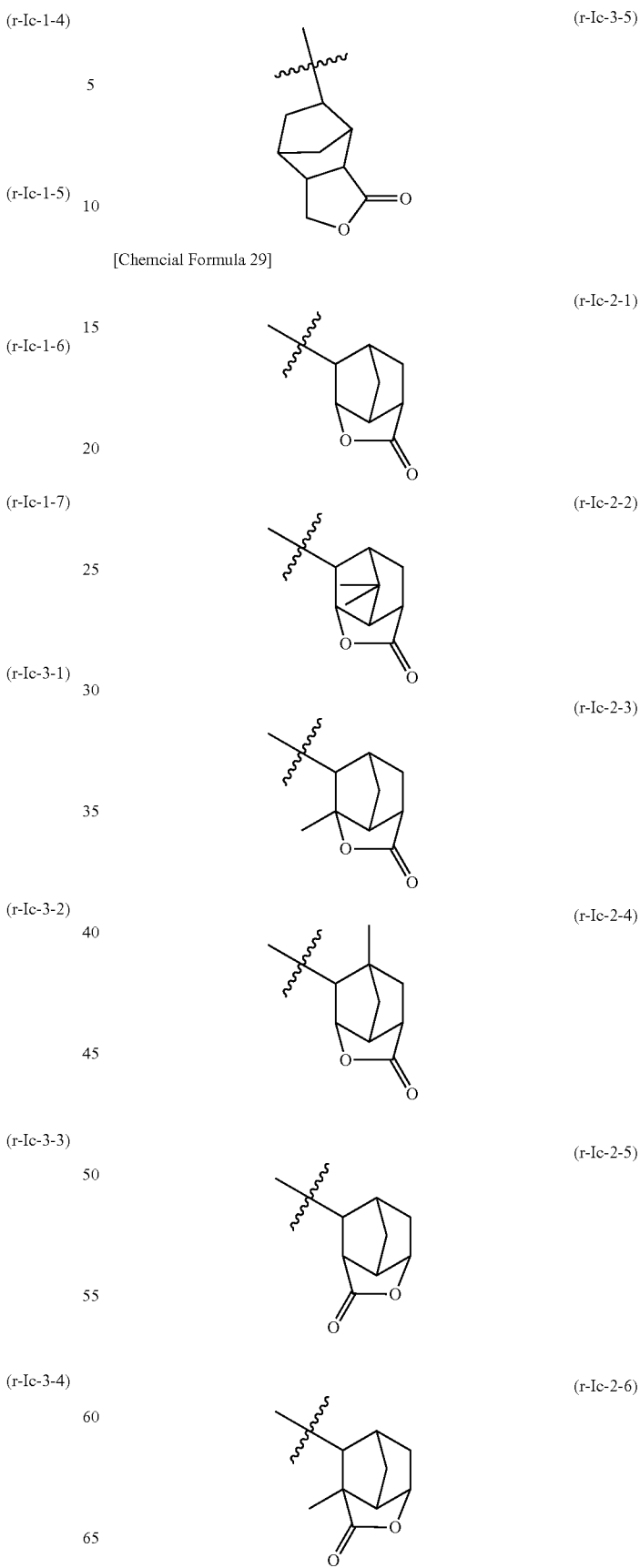

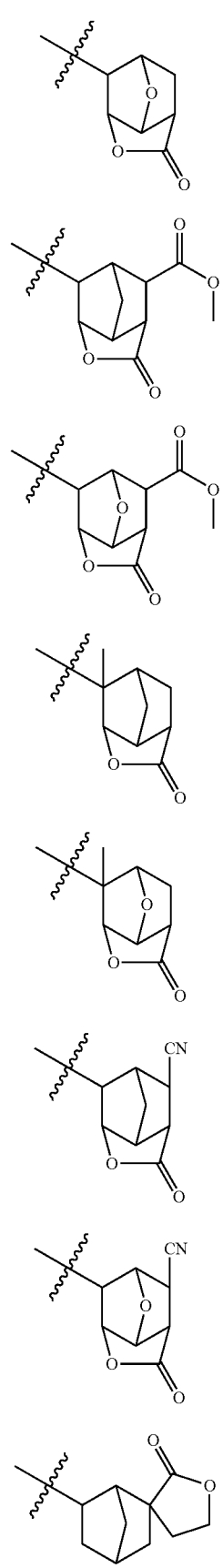
(r-Ic-2-7)
(r-Ic-2-8)
(r-Ic-2-9)
(r-Ic-2-10)
(r-Ic-2-11)
(r-Ic-2-12)
(r-Ic-2-13)
(r-Ic-4-1)
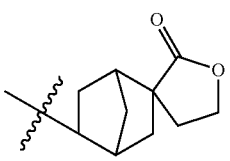
(r-Ic-4-2)
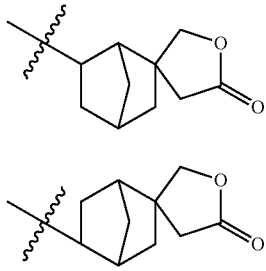
(r-Ic-4-3)
(r-Ic-4-4)
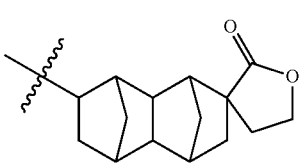
(r-Ic-4-5)
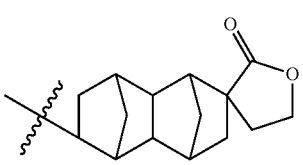
(r-Ic-4-6)
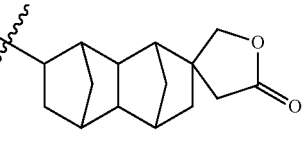
(r-Ic-4-7)
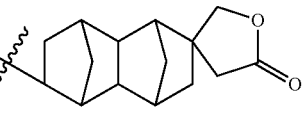
(r-Ic-4-8)
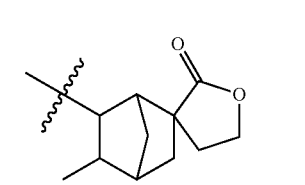
(r-Ic-4-9)
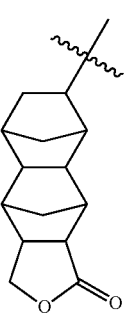
(r-Ic-5-1)
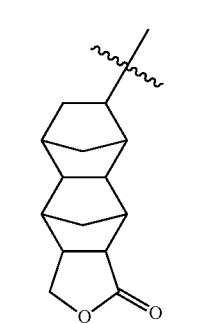

(r-Ic-5-2)

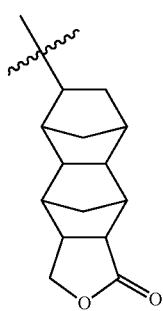

(r-Ic-5-3)

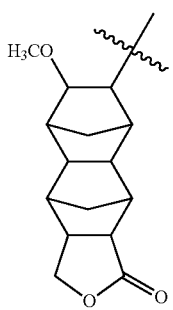

(r-Ic-5-4)

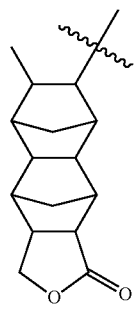

(r-Ic-6-1)

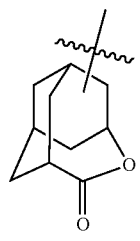

(r-Ic-7-1)

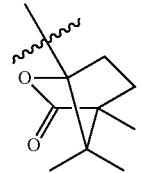

Provided the structural unit (a2) contains a lactone-containing cyclic group, there are no particular limitations on the other portions of the structural unit, but the structural unit (a2) is preferably a structural unit in which the $R^{28}$ group in the structural unit (a5) represented by the aforementioned formula (a5-0) has been substituted with an aforementioned lactone-containing cyclic group, and is more preferably a structural unit in which the $R^{28}$ group in the structural unit (a5) represented by the aforementioned formula (a5-0-1) has been substituted with an aforementioned lactone-containing cyclic group.

When the structural unit (a2) is included within the component (A1), the amount of the structural unit (a2), based on the combined total of all the structural units that constitute the component (A1), is preferably within a range from 1 to 80 mol %, and more preferably from 10 to 70 mol %.

(Structural Unit (a3))

The component (A1) may also include a structural unit (a3) represented by general formula (a3-1) shown below.

[Chemical Formula 30]

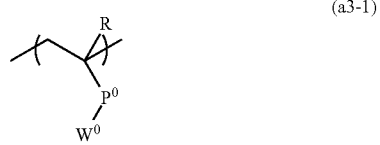

(a3-1)

In the formula, R represents a hydrogen atom, an alkyl group of 1 to 5 carbon atoms or a halogenated alkyl group of 1 to 5 carbon atoms, and $P^0$ represents —C(=O)—O—, —C(=O)—NR$^0$— (wherein R$^0$ represents a hydrogen atom or an alkyl group of 1 to 5 carbon atoms), or a single bond. $W^0$ represents —COOH or —CONHCO—$R^{a3}$ (wherein $R^{a3}$ represents a hydrocarbon group), or represents a hydrocarbon group having at least one group selected from the group consisting of —OH, —COOH, —CN, —SO$_2$NH$_2$ and —CONH$_2$ as a substituent, wherein $W^0$ may have an oxygen atom or a sulfur atom in an arbitrary position.

In formula (a3-1), R is the same as defined above.

In formula (a3-1), $P^0$ represents —C(=O)—O—, —C(=O)—NR$^0$— (wherein R$^0$ represents a hydrogen atom or an alkyl group of 1 to 5 carbon atoms), or a single bond. The alkyl group for R$^0$ is the same as defined above for the alkyl group for R.

In formula (a3-1), $W^0$ represents —COOH or —CONHCO—$R^{a3}$ (wherein $R^{a3}$ represents a hydrocarbon group), or represents a hydrocarbon group having at least one group selected from the group consisting of —OH, —COOH, —CN, —SO$_2$NH$_2$ and —CONH$_2$ as a substituent, wherein $W^0$ may have an oxygen atom or a sulfur atom in an arbitrary position.

The expression "hydrocarbon having a substituent" describes a group in which at least part of the hydrogen atoms bonded to the hydrocarbon group have been substituted with a substituent.

The hydrocarbon group for $W^0$ or $R^{a3}$ may be an aliphatic hydrocarbon group or an aromatic hydrocarbon group.

Preferred examples of the aliphatic hydrocarbon group for $W^0$ or $R^{a3}$ include a linear or branched hydrocarbon group (and preferably an alkylene group) of 1 to 10 carbon atoms, and an aliphatic cyclic group (monocyclic group or polycyclic group), and these groups are as described above.

The aromatic hydrocarbon group for $W^0$ or $R^{a3}$ is a hydrocarbon group having at least one aromatic ring, and is the same as described above.

In formula (a3-1), $W^0$ may have an oxygen atom or a sulfur atom in an arbitrary position. This expression that the group "may have an oxygen atom or a sulfur atom in an arbitrary position" means that either a portion of the carbon atoms that constitute the hydrocarbon group or the hydrocarbon group having a substituent (including the carbon atoms in the substituent portion) may be substituted with an oxygen atom or a sulfur atom, or that one or more hydrogen atoms bonded to the hydrocarbon group may be substituted with an oxygen atom or a sulfur atom.

Examples of $W^0$ groups having an oxygen atom (O) in an arbitrary position are shown below.

[Chemical Formula 31]

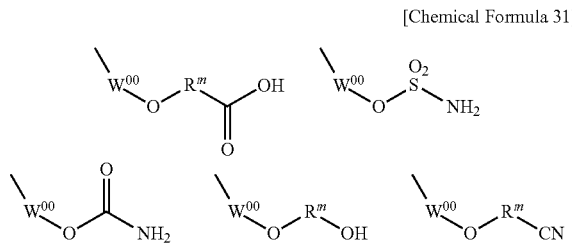

In the formulas, $W^{00}$ represents a hydrocarbon group, and $R^m$ represents an alkylene group of 1 to 5 carbon atoms.

In the above formulas, $W^{00}$ represents a hydrocarbon group, and examples include the same groups as those mentioned above for $W^0$ in formula (a3-1). $W^{00}$ is preferably an aliphatic hydrocarbon group, and more preferably an aliphatic cyclic group (monocyclic group or polycyclic group).

$R^m$ is preferably a linear or branched group, is more preferably an alkylene group of 1 to 3 carbon atoms, and is most preferably a methylene group or an ethylene group.

Among the various possibilities for the structural unit (a3), specific examples of preferred structural units include structural units derived from an (α-substituted) acrylate ester, and structural units represented by any of general formulas (a3-11) to (a3-13) shown below. An example of a structural unit derived from an (α-substituted) acrylate ester is a structural unit of the above formula (a3-1) in which $P^0$ represents a single bond and $W^0$ represents —COOH.

[Chemical Formula 32]

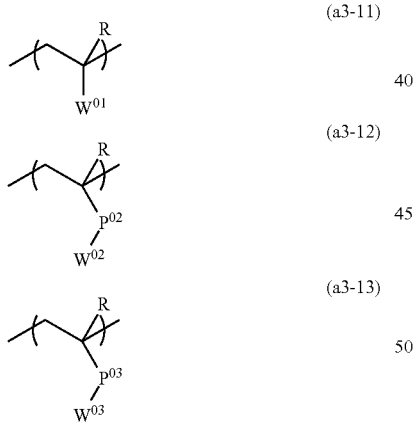

In the formulas, R represents a hydrogen atom, an alkyl group of 1 to 5 carbon atoms or a halogenated alkyl group of 1 to 5 carbon atoms, represents an aromatic hydrocarbon group having at least one group selected from the group consisting of —OH, —COOH, —CN, —SO$_2$NH$_2$ and —CONH$_2$ as a substituent, each of $P^{02}$ and $P^{03}$ represents —C(=O)—O—, —C(=O)—NR$^0$— (wherein R$^0$ represents a hydrogen atom or an alkyl group of 1 to 5 carbon atoms) or a single bond, $W^{02}$ represents a cyclic hydrocarbon group having at least one group selected from the group consisting of —OH, —COOH, —CN, —SO$_2$NH$_2$ and —CONH$_2$ as a substituent, or —CONHCO—R$^{a32}$ (wherein R$^{a32}$ represents a cyclic hydrocarbon group), and may have an oxygen atom or a sulfur atom in an arbitrary position, and $W^{03}$ represents a chain-like hydrocarbon group having at least one group selected from the group consisting of —OH, —COOH, —CN, —SO$_2$NH$_2$ and —CONH$_2$ as a substituent, or —CONHCO—R$^{a33}$ (wherein R$^{a33}$ represents a chain-like hydrocarbon group).

[Structural Unit Represented by General Formula (a3-11)]

In the above formula (a3-11), R is the same as defined above for R in formula (a3-1).

The aromatic hydrocarbon group for $W^{01}$ is the same as the aromatic hydrocarbon group described above for $W^0$ in formula (a3-1).

Specific examples of preferred structural units represented by general formula (a3-11) are shown below. In each of the following formulas, $R^\alpha$ represents a hydrogen atom, a methyl group, or a trifluoromethyl group.

[Chemical Formula 33]

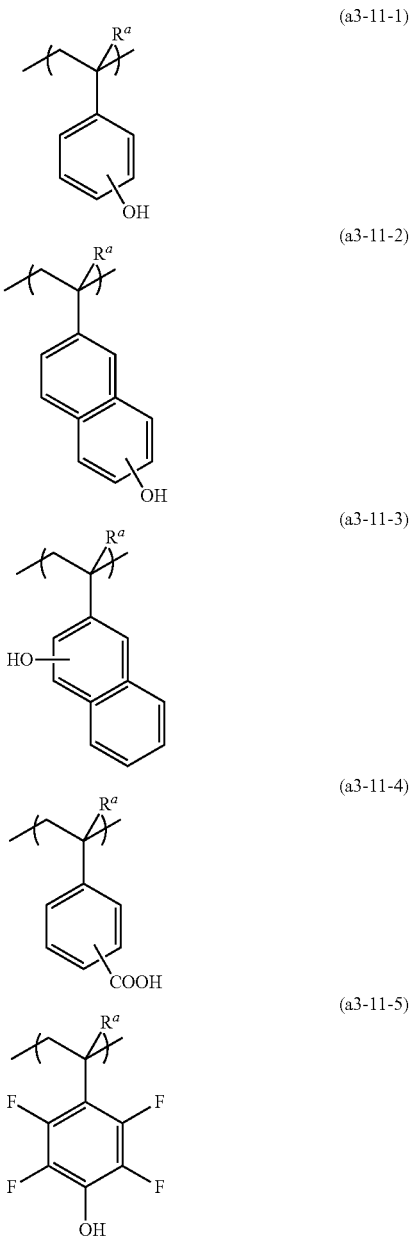

[Structural Unit Represented by General Formula (a3-12)]

In the above formula (a3-12), R is the same as defined above for R in formula (a3-1).

$P^{02}$ represents —C(=O)—O—, —C(=O)—NR⁰— (wherein R⁰ represents a hydrogen atom or an alkyl group of 1 to 5 carbon atoms) or a single bond, and is preferably —C(=O)—O— or a single bond. The alkyl group for R⁰ is the same as defined above for the alkyl group for R.

Examples of the cyclic hydrocarbon group for $W^{02}$ or $R^{a32}$ include the same groups as those mentioned above for the aliphatic cyclic group (monocyclic group or polycyclic group) and the aromatic hydrocarbon group within the description for W⁰ in the aforementioned formula (a3-1).

$W^{02}$ or $R^{a32}$ may have an oxygen atom or a sulfur atom in an arbitrary position, and this is the same as described above for W⁰ in formula (a3-1).

Specific examples of preferred structural units represented by general formula (a3-12) are shown below. In each of the following formulas, $R^{\alpha}$ represents a hydrogen atom, a methyl group, or a trifluoromethyl group.

[Chemical Formula 34]

(a3-12-1)

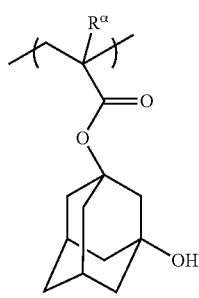

(a3-12-2)

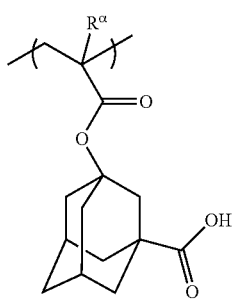

(a3-12-3)

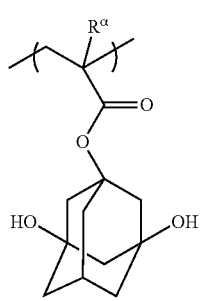

(a3-12-4)

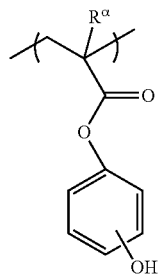

(a3-12-5)

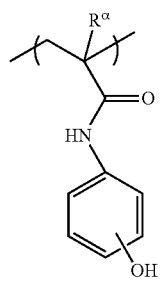

(a3-12-6)

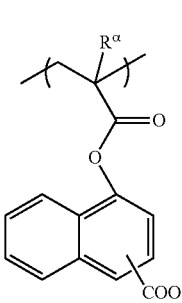

(a3-12-7)

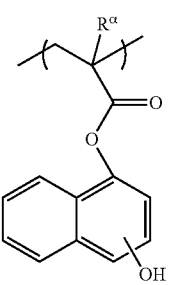

(a3-12-8)

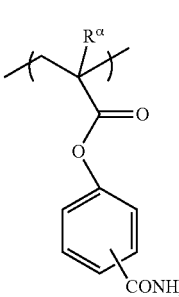

(a3-12-9)
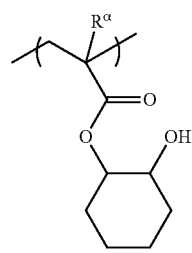
(a3-12-10)
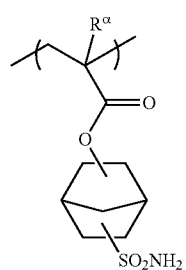
(a3-12-11)
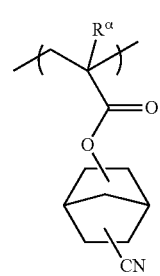
(a3-12-12)
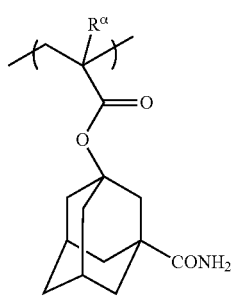
[Chemical Formula 35]
(a3-12-13)
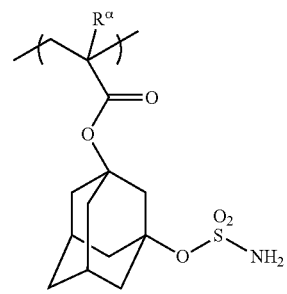
(a3-12-14)
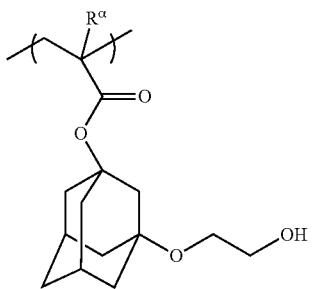
(a3-12-15)
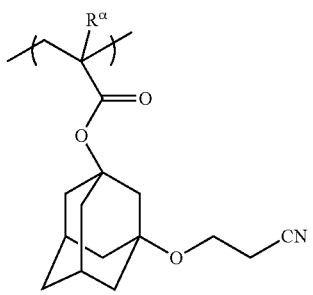
(a3-12-16)
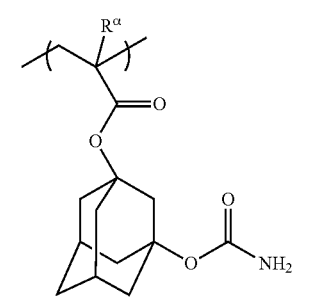
(a3-12-17)
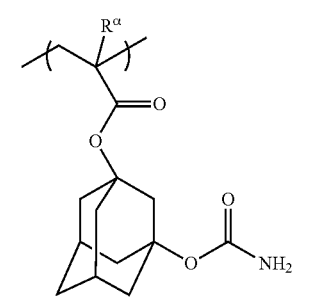
(a3-12-18)
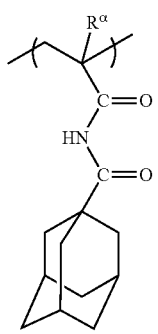

-continued

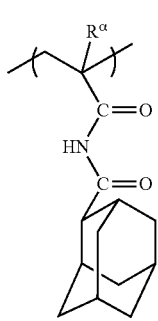
(a3-12-19)

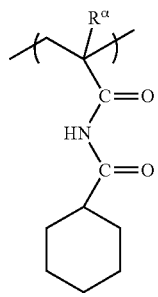
(a3-12-20)

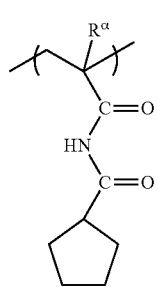
(a3-12-21)

In those cases where the component (A1) includes the structural unit (a3), the structural unit (a3) contained within the component (A1) may be either a single type of structural unit or a combination of two or more types of structural units.

In those cases where the component (A1) includes the structural unit (a3), the amount of the structural unit (a3), based on the combined total of all the structural units that constitute the component (A1), is preferably within a range from 0 to 85 mol %, and more preferably from 0 to 80 mol %. When the amount of the structural unit (a3) is at least as large as the lower limit of the above range, the effects achieved by including the structural unit (a3) (namely, improved resolution, lithography properties and pattern shape) can be satisfactorily realized, whereas when the amount of the structural unit (a3) is not more than the upper limit of the above range, a good balance can be achieved with the other structural units.

(Structural Unit (a4))

The structural unit (a4) is a structural unit containing a non-acid-dissociable aliphatic polycyclic group.

In the structural unit (a4), examples of the polycyclic group include the same groups as those mentioned above for the polycyclic group described in relation to the aforementioned structural unit (a1), and any of the multitude of conventional polycyclic groups used within the resin components of resist compositions designed for ArF excimer lasers or KrF excimer lasers (and preferably ArF excimer lasers) can be used.

In particular, at least one group selected from among a tricyclodecyl group, adamantyl group, tetracyclododecyl group, isobornyl group and norbornyl group is preferred in terms of ease of industrial availability. These polycyclic groups may have a linear or branched alkyl group of 1 to 5 carbon atoms as a substituent.

Specific examples of the structural unit (a4) include structural units represented by general formulas (a4-1) to (a4-5) shown below.

[Chemical Formula 36]

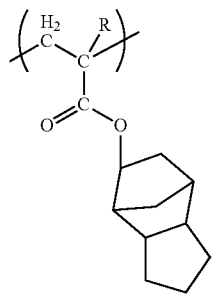
(a4-1)

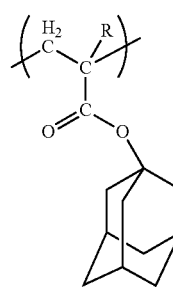
(a4-2)

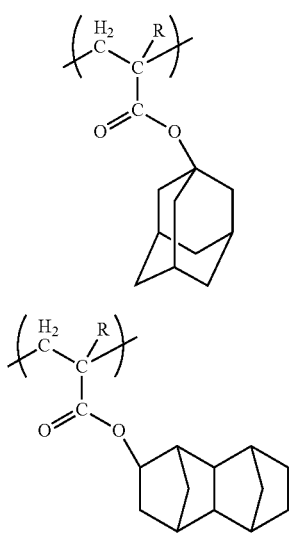
(a4-3)

(a4-4)

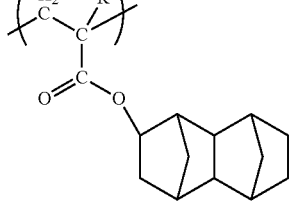

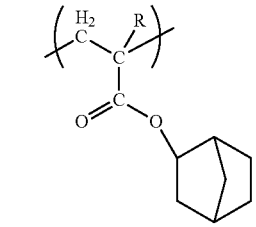
(a4-5)

In the formula, R is the same as defined above.

In those cases where the structural unit (a4) is included in the component (A1), the amount of the structural unit (a4) within the component (A1), based on the combined total of all the structural units that constitute the component (A1), is preferably within a range from 1 to 30 mol %, and more preferably from 5 to 20 mol %.

In the resist composition of the present invention, the component (A) includes the resin component (A1) containing the aforementioned structural unit (a0).

The component (A1) is preferably a polymeric compound containing the structural unit (a0) and the structural unit (a1), or a polymeric compound containing the structural unit (a0) and the structural unit (a2).

Specific examples of the component (A1) include polymeric compounds consisting of the structural unit (a0) and the structural unit (a1), polymeric compounds consisting of the structural unit (a0) and the structural unit (a2), polymeric compounds consisting of the structural unit (a0), the structural unit (a1) and the structural unit (a5), polymeric compounds consisting of the structural unit (a0), the structural unit (a1) and the structural unit (a2), polymeric compounds consisting of the structural unit (a0), the structural unit (a1), the structural unit (a2) and the structural unit (a3), polymeric compounds consisting of the structural unit (a0), the structural unit (a1), the structural unit (a5) and the structural unit (a3), polymeric compounds consisting of the structural unit (a0), the structural unit (a1), the structural unit (a2) and the structural unit (a4), and polymeric compounds consisting of the structural unit (a0), the structural unit (a1), the structural unit (a5) and the structural unit (a4).

In the component (A), a single type of the component (A1) may be used alone, or a combination of two or more types of the component (A1) may be used.

The amount of the component (A1) within the component (A), based on the total weight of the component (A), is preferably at least 25% by weight, more preferably at least 50% by weight, still more preferably at least 75% by weight, and is most preferably 100% by weight. Provided that the amount of the component (A1) is at least 25% by weight of the component (A), the effects of the present invention can be further improved.

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight-average molecular weight is not more than the upper limit of the above range, the component (A1) exhibits satisfactory solubility in a resist solvent when used as a resist. On the other hand, when the weight-average molecular weight is at least as large as the lower limit of the above range, the dry etching resistance and the cross-sectional shape of the resist pattern are improved.

Further, although there are no particular limitations on the dispersity (Mw/Mn) of the component (A1), the dispersity is preferably within a range from 1.0 to 5.0, more preferably from 1.0 to 3.0, and most preferably from 1.0 to 2.5. Here, Mn represents the number-average molecular weight.

The component (A) can be produced, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH during the aforementioned polymerization, a —$C(CF_3)_2$—OH group can be introduced at the terminals of the component (A). Such a copolymer having an introduced hydroxyalkyl group in which part of the hydrogen atoms of the alkyl group have been substituted with fluorine atoms is effective in reducing developing defects and line edge roughness (LER: unevenness in the side walls of a line pattern).

The monomers used for forming each of the structural units may be commercially available compounds, or may be synthesized using conventional methods.

The monomer that yields the structural unit (a0) can be produced, for example, using the method described below.

(Method of Producing Monomer that Yields the Structural Unit (a0))

As illustrated below, the monomer that yields the structural unit (a0) (hereafter referred to as "the acrylate ester-based derivative (1)") can be produced, for example, by reacting an alcohol derivative (3) and an aldehyde compound (4) in the presence of acid to produce an alkyl ether compound (2) (first step), and then subjecting the alkyl ether compound (2) to an esterification (second step).

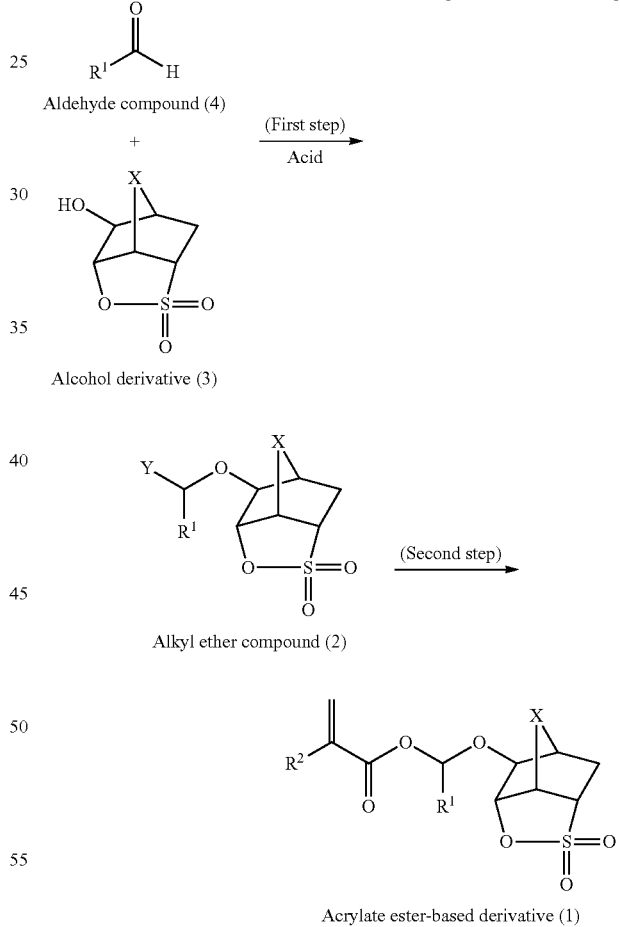

[Chemical Formula 37]

In the above formulas, $R^1$, $R^2$ and X are the same as defined above, and Y represents a chlorine atom, a bromine atom or an iodine atom.

(First Step)

Specific examples of the alcohol derivative (3) that can be used as a raw material in the first step are shown below, but the following is not an exhaustive list.

[Chemical Formula 38]

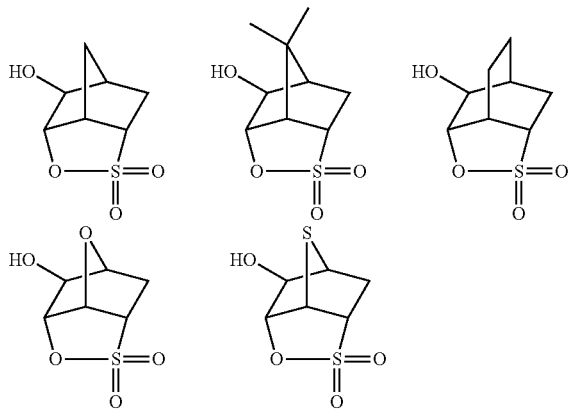

There are no particular limitations on the method used for producing the alcohol derivative (3) used in the first step, and conventional methods can be used. For example, production can be achieved by hydrolyzing norbornenesulfonyl chloride (which can be produced from 2-chloroethanesulfonyl chloride and cyclopentadiene) to produce a sulfonic acid derivative, and then treating the sulfonic acid derivative with an oxidizing agent (see International Patent Publication No. 2010/026974).

Examples of the aldehyde compound (4) used as a raw material in the first step include formaldehyde, acetaldehyde, propionaldehyde, isobutyraldehyde and pivalaldehyde. Of these, from the viewpoints of enhancing the LWR improvement effect and achieving a high-resolution photoresist pattern, formaldehyde, propionaldehyde and isobutyraldehyde are preferable, and formaldehyde is particularly desirable. Paraformaldehyde, which functions as a precursor to formaldehyde, is preferably used as the formaldehyde.

The amount used of the aldehyde compound (4) is preferably within a range from 0.7 to 10 mol, more preferably from 1 to 10 mol, still more preferably from 1.2 to 5 mol, and most preferably from 1.4 to 2 mol, per 1 mol of the alcohol derivative (3).

Examples of the acid used in the first step include hydrogen halide gases such as hydrogen chloride gas and hydrogen iodide gas, hydrogen halide acids such as hydrochloric acid, hydrobromic acid and hydriodic acid, other inorganic acids such as sulfuric acid and nitric acid or aqueous solutions thereof, and organic acids such as methanesulfonic acid, p-toluenesulfonic acid and trichloroacetic acid. The presence of water can inhibit progression of the reaction, and therefore it is preferable to use an acid that is not an aqueous solution. Of the various possibilities, from the viewpoint of the reactivity between the alcohol derivative (3) and the aldehyde compound (4), a hydrogen halide gas is preferable, and from the viewpoint of the stability of the produced alkyl ether compound (2), hydrogen chloride gas is particularly desirable. In other words, in the general formula (2), Y is preferably a chlorine atom. If Y is a chlorine atom, then production of the alkyl ether compound (2) is relatively simple, and subsequent production of the acrylate ester-based derivative (1) described below is also simplified.

The amount of acid used is preferably within a range from 1 to 30 mol, and more preferably from 3 to 15 mol, per 1 mol of the alcohol derivative (3), and it is particularly desirable to continue adding acid until it has been confirmed that the alcohol derivative (3) has been dissipated. This elimination of the alcohol derivative (3) can easily be confirmed by gas chromatography.

The first step is usually performed in the presence of a solvent. There are no particular limitations on this solvent, provided it does not impair the reaction, and specific examples of solvents that can be used include aliphatic hydrocarbons such as pentane, hexane, heptane and octane, aromatic hydrocarbons such as toluene, xylene and cymene, halogenated hydrocarbons such as methylene chloride, dichloroethane, chloroform and carbon tetrachloride, and ethers such as tetrahydrofuran and diisopropyl ether. Among these, dichloromethane, 1,2-dichloroethane and chloroform are preferable, and dichloromethane is more preferable. A single solvent may be used alone, or a combination of two or more solvents may be used. Of the various solvents, halogenated hydrocarbons are preferable and methylene chloride is particularly desirable.

The amount used of the solvent is preferably at least 2 parts by weight, more preferably 4 to 30 parts by weight, and still more preferably 9 to 20 parts by weight, per 1 part by weight of the alcohol derivative (3).

The reaction temperature for the first step varies depending on the alcohol derivative (3) and the aldehyde compound (4) used, and the types of acid and solvent used, but usually, from the viewpoint of achieving good solubility of the raw materials and the acid, the temperature is preferably within a range from −20 to 30° C., more preferably from −10 to 10° C., and still more preferably from −10 to 5° C. There are no particular limitations on the reaction pressure during the first step, and performing the reaction at normal pressure is simplest, and therefore preferable.

There are no particular limitations on the reaction time of the first step. It is usually preferable to continue the reaction until elimination of the alcohol derivative (3) has been confirmed.

There are no particular limitations on the operational method employed for the reaction of the first step. There are no particular limitations on the method used for adding the raw materials, the acid and the solvent, nor on the sequence in which they are added, and addition can be performed using any desired method and sequence. In one specific example of a preferred operational method for the reaction, a batch reactor is charged with the alcohol derivative (3), the solvent and the aldehyde compound (4), and the acid is then added to the resulting mixture at a predetermined temperature.

In those cases where a hydrogen halide gas is used as the acid, a method in which the gas is bubbled through the mixture can be used favorably.

Further, although the first step is preferably conducted in the absence of water, the reaction proceeds satisfactorily without having to subject the raw materials and the solvent to dewatering treatments, and without requiring the atmosphere inside the reaction system to be replaced with an inert gas such as nitrogen gas.

Separation and purification of the alkyl ether compound (2) from the reaction mixture obtained in the first step can be performed using the types of methods typically used for separating and purifying organic compounds. For example, following completion of the reaction, the alkyl ether compound (2) can be separated by concentrating the organic layer, and this concentrate may be used in the second step without any further modification, or if required, may be purified by recrystallization, distillation or silica gel column chromatography or the like, with the thus obtained high-purity alkyl ether compound (2) then being used in the second step.

Specific examples of the alkyl ether compound (2) obtained in the first step are shown below, but the following is not an exhaustive list.
[Chemical Formula 39]
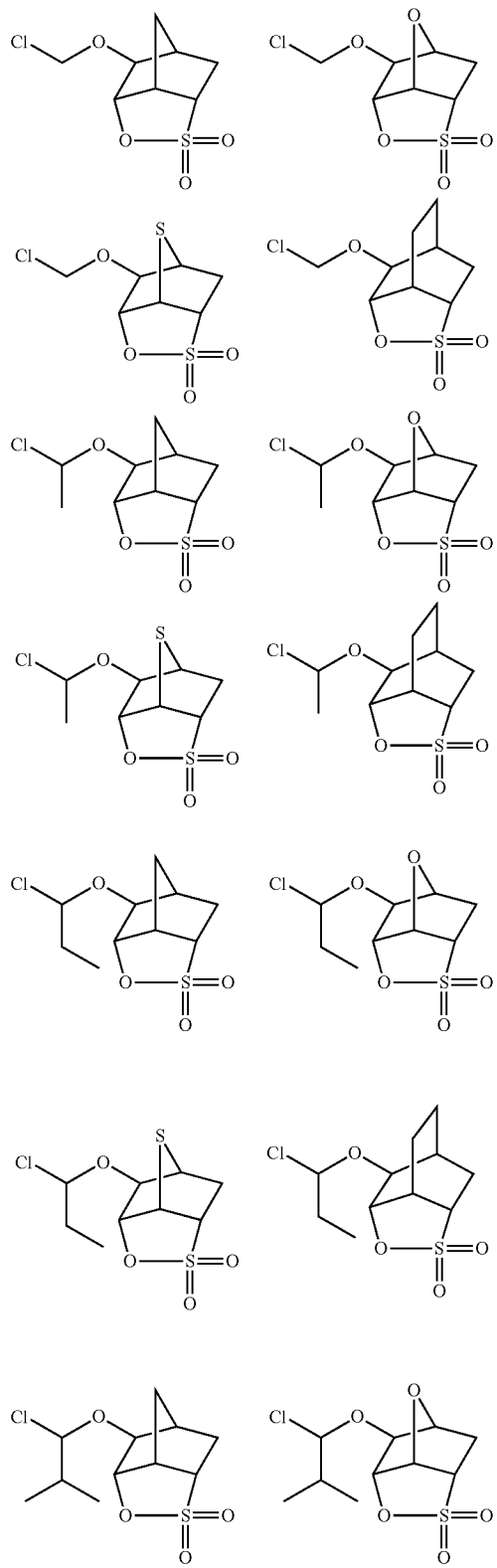
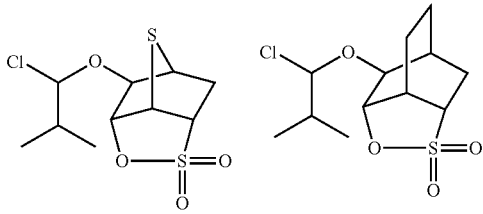
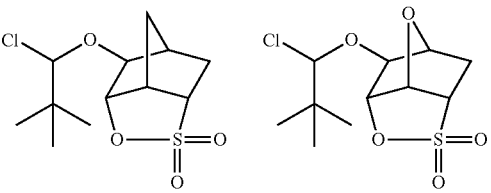
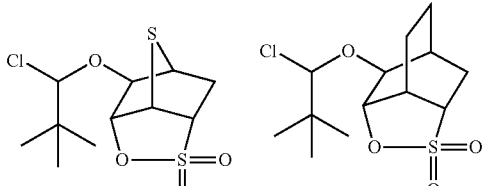
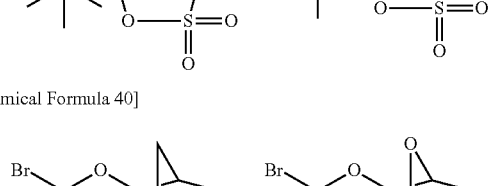
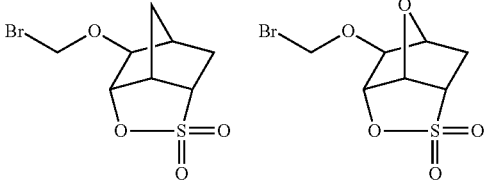
[Chemical Formula 40]
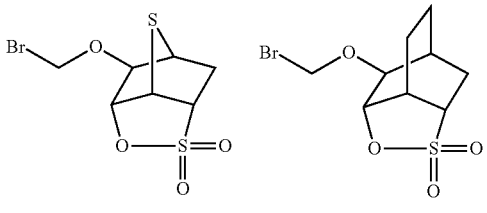
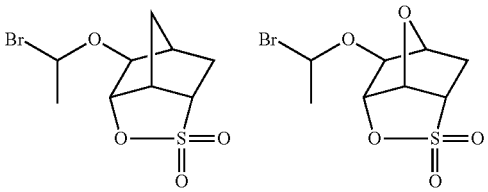
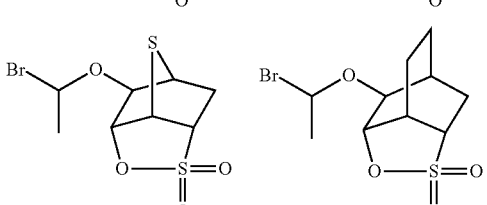
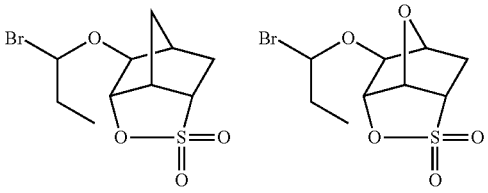

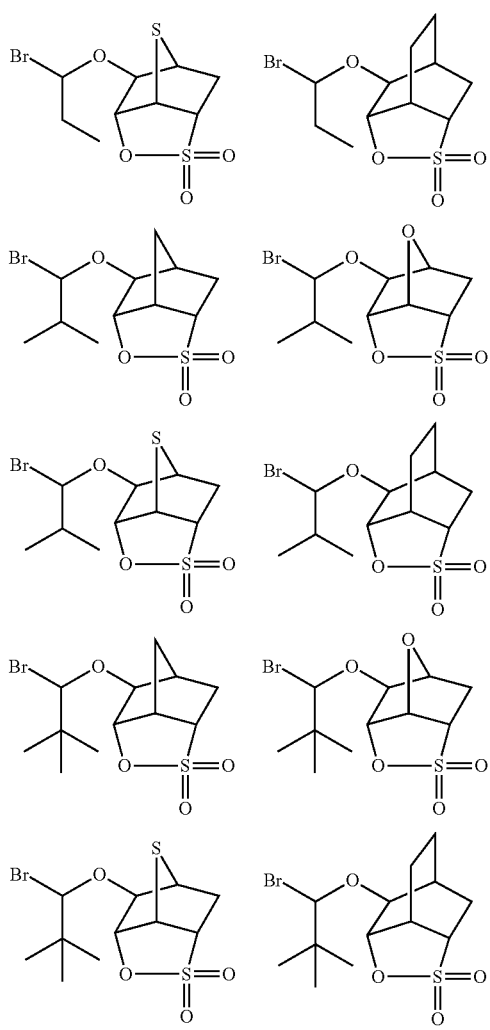

[Chemical Formula 41]

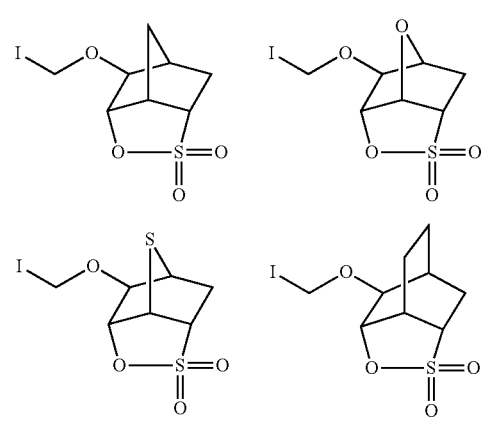

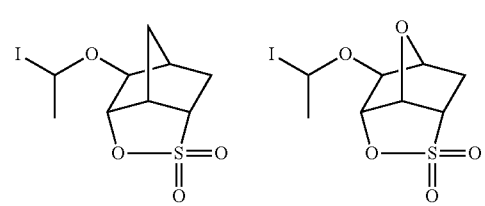

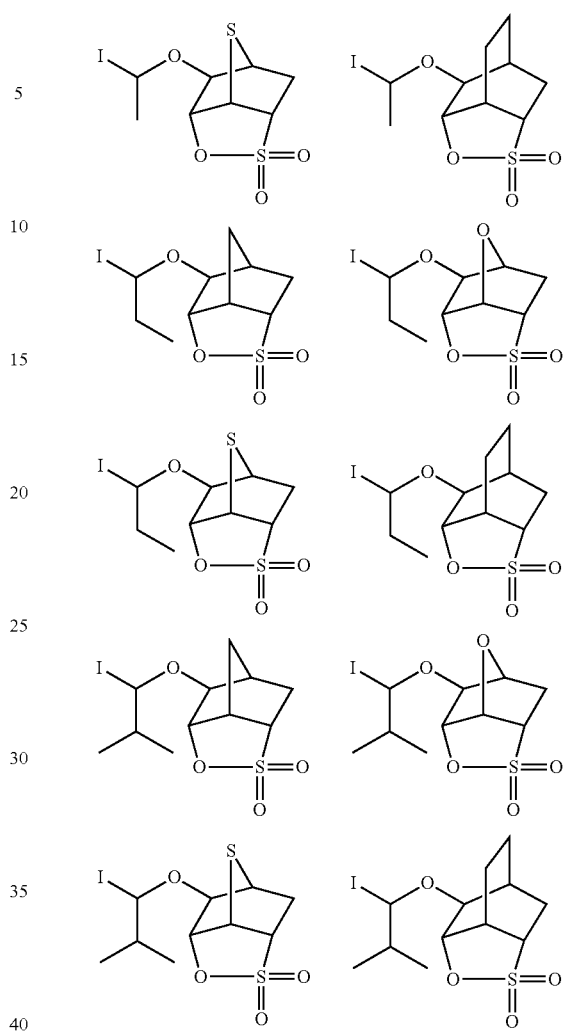

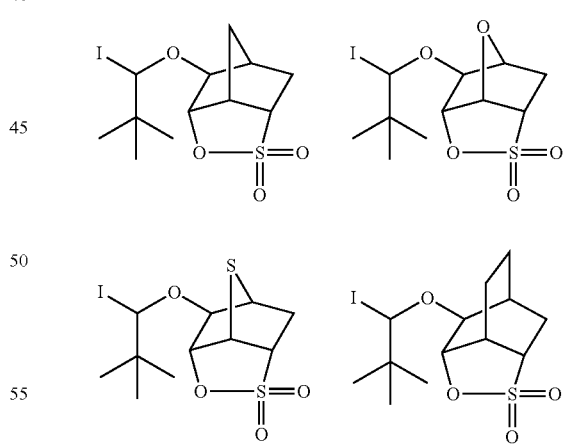

(Second Step)

There are no particular limitations on the method used for performing the esterification of the second step, and in one specific method, the alkyl ether compound (2) obtained in the first step is reacted with an acrylic acid-based compound (hereafter referred to as "the "acrylic acid-based compound (5)") represented by general formula (5) shown below, preferably in the presence of a base.

[Chemical Formula 42]

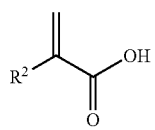

(5)

In the formula, R² is the same as defined above.

Specific examples of the acrylic acid-based compound (5) used in the second step include acrylic acid, methacrylic acid and 2-(trifluoromethyl)acrylic acid. From the viewpoints of economic viability and the ease of after-treatment, the amount used of the acrylic acid-based compound (5) is preferably within a range from 0.7 to 20 mol, more preferably from 0.7 to 5 mol, and still more preferably from 1 to 5 mol, per 1 mol of the alkyl ether compound (2).

Examples of the base used in the second step include alkali metal hydrides such as sodium hydride and potassium hydride, alkali metal hydroxides such as sodium hydroxide and potassium hydroxide, alkali metal carbonates such as sodium carbonate and potassium carbonate, tertiary amines such as triethylamine, tributylamine and 4-dimethylaminopyridine, and nitrogen-containing heterocyclic compounds such as pyridine. Among these, weak bases are preferable, tertiary amines and nitrogen-containing heterocyclic compounds are more preferable, tertiary amines are still more preferable, and triethylamine is particularly desirable.

When a base is used, from the viewpoints of economic viability and the ease of after-treatment, the amount used of the base is preferably within a range from 0.7 to 5 mol, more preferably from 0.7 to 3 mol, and still more preferably from 1 to 3 mol, per 1 mol of the alkyl ether compound (2).

The second step can be performed either in the presence of, or in the absence of, a polymerization inhibitor. There are no particular limitations on the polymerization inhibitor, provided it does not impair the reaction, and specific examples of compounds that can be used include quinone-based compounds such as hydroquinone, benzoquinone and toluquinone, alkylphenol-based compounds such as 2,6-di-tert-butylphenol, 2,4-di-tert-butylphenol, 2-tert-butyl-4,6-dimethylphenol, p-tert-butylcatechol and 4-methoxyphenol, and amine-based compounds such as phenothiazine. A single polymerization inhibitor may be used alone, or a combination of two or more inhibitors may be used. Of the various possibilities, an alkylphenol-based compound is preferable, and 4-methoxyphenol is particularly desirable.

When a polymerization inhibitor is used, the amount used is preferably not more than 5% by weight, more preferably not more than 1% by weight, and still more preferably not more than 0.5% by weight, relative to the total weight of the reaction mixture including the solvent.

The second step is usually performed in the presence of a solvent. There are no particular limitations on this solvent, provided it does not impair the reaction, and specific examples of solvents that can be used include aliphatic hydrocarbons such as hexane, heptane and octane, aromatic hydrocarbons such as toluene, xylene and cymene, halogenated hydrocarbons such as methylene chloride and dichloroethane, ethers such as tetrahydrofuran and diisopropyl ether, and amides such as dimethylformamide. A single solvent may be used alone, or a combination of two or more solvents may be used. Of the various solvents, aromatic hydrocarbons and halogenated hydrocarbons are preferable, and toluene and methylene chloride are particularly desirable.

From the viewpoints of economic viability and the ease of after-treatment, the amount used of the solvent is preferably at least within a range from 0.1 to 20 parts by weight, and more preferably from 0.1 to 10 parts by weight, per 1 part by weight of the alkyl ether compound (2).

The reaction temperature for the second step varies depending on the alkyl ether compound (2) and the acrylic acid-based compound (5) used, and the types of base, polymerization inhibitor and solvent used, but the temperature is preferably within a range from −50 to 100° C., and from the viewpoints of inhibiting polymerization of the acrylic acid-based compound (5) and the acrylate ester-based derivative (1), and achieving good solubility of the raw materials and the base in the solvent, the temperature is more preferably within a range from −10 to 50° C., more preferably from −10 to 15° C., and still more preferably from 0 to 10° C. There are no particular limitations on the reaction pressure during the second step, and performing the reaction at normal pressure is simplest, and therefore preferable.

The reaction time of the second step varies depending on the alkyl ether compound (2) and the acrylic acid-based compound (5) used, and the types of base, polymerization inhibitor and solvent used, but usually, the reaction time is preferably within a range from 0.5 to 48 hours, and more preferably from 1 to 24 hours.

Further, although the second step is preferably conducted in the absence of water, the reaction proceeds satisfactorily without having to subject the raw materials and the solvent to dewatering treatments, and without requiring the atmosphere inside the reaction system to be replaced with an inert gas such as nitrogen gas.

On the other hand, the reaction of the second step can be halted by adding water. The amount of water added is preferably at least 1 mol per 1 mol of the excess base. If the amount of water used is too small, then the excess base cannot be decomposed completely, which can result in the generation of by-products.

There are no particular limitations on the operational method employed for the reaction of the second step. There are no particular limitations on the method used for adding the alkyl ether compound (2), the acrylic acid-based compound (5), the polymerization inhibitor and the solvent, nor on the sequence in which they are added, and addition can be performed using any desired method and sequence. In one specific example of a preferred operational method for the reaction, a batch reactor is charged with the alkyl ether compound (2), the acrylic acid-based compound (5), and where desired the solvent and the polymerization inhibitor, and the base is then added (dropwise if necessary) to the resulting mixture at a predetermined temperature.

Separation and purification of the acrylate ester-based derivative (1) from the reaction mixture obtained in the second step can be performed using the types of methods typically used for separating and purifying organic compounds. For example, following completion of the reaction and subsequent neutralization of the reaction mixture, the acrylate ester-based derivative (1) can be separated by extracting the reaction mixture into an organic solvent, and then concentrating the organic layer. If necessary, this concentrate can be purified by recrystallization, distillation or silica gel column chromatography or the like to obtain a high-purity acrylate ester-based derivative (1).

The acrylate ester-based derivative (1) can be used favorably as a raw material for a polymeric compound for a photoresist composition regardless of whether it exists as a single enantiomer or a mixture of enantiomers.

<Acid Generator Component; Component (B)>

The component (B) is an acid generator component that generates acid upon exposure.

There are no particular limitations on the component (B), and any of the conventional materials that have already been proposed as acid generators for use in chemically amplified resists can be used. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

Examples of onium salt-based acid generators that may be used include compounds represented by general formula (b-1) or (b-2) shown below.

[Chemical Formula 43]

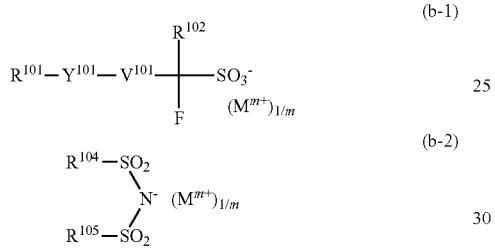

In the above formulas, $R^{101}$ represents a cyclic group which may have a substituent, or a chain-like alkyl group or alkenyl group which may have a substituent, $Y^{101}$ represents a single bond or a divalent linking group containing an oxygen atom, $V^{101}$ represents a single bond, an alkylene group or a fluorinated alkylene group, $R^{102}$ represents a fluorine atom or a fluorinated alkyl group of 1 to 5 carbon atoms, each of $R^{104}$ and $R^{105}$ independently represents an alkyl group or fluorinated alkyl group of 1 to 10 carbon atoms, or $R^{104}$ and $R^{105}$ may be bonded to each other to form a ring, $M^{m+}$ represents an organic cation having a valency of m, and m represents an integer of 1 to 3.

{Anion Moiety}

The cyclic group which may have a substituent for $R^{101}$ may be either a cyclic aliphatic hydrocarbon group (aliphatic cyclic group), an aromatic hydrocarbon group (aromatic cyclic group), or a heterocyclic group containing a hetero atom within the ring.

Examples of the cyclic aliphatic hydrocarbon group for $R^{101}$ include monovalent hydrocarbon groups in which one hydrogen atom has been removed from the types of monocycloalkanes and polycycloalkanes mentioned above in relation to the divalent aliphatic hydrocarbon group, and an adamantyl group or norbornyl group is preferable.

Examples of the aromatic hydrocarbon group for $R^{101}$ include aryl groups in in which one hydrogen atom has been removed from the types of aromatic hydrocarbon rings mentioned above in relation to the divalent aromatic hydrocarbon group, or from an aromatic compound containing two or more aromatic rings, and a phenyl group or naphthyl group is preferable.

Specific examples of the heterocyclic group for $R^{101}$ include groups represented by formulas (L1) to (L6) and (S1) to (S4) shown below.

[Chemical Formula 44]

 (L1)

 (L2)

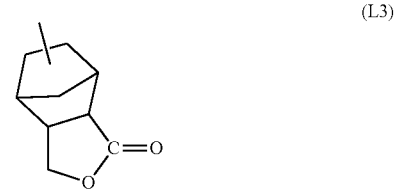 (L3)

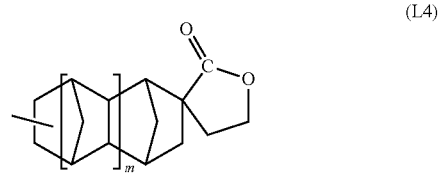 (L4)

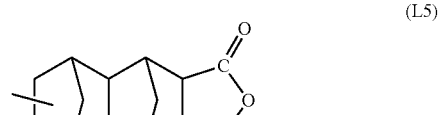 (L5)

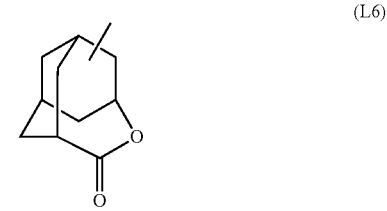 (L6)

 (S1)

 (S2)

 (S3)

(S4)

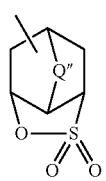

In the above formulas, Q" represents an alkylene group of 1 to 5 carbon atoms, —O—, —S—, —O—$R^{94}$— or —S—$R^{95}$—, wherein each of $R^{94}$ and $R^{95}$ independently represents an alkylene group of 1 to 5 carbon atoms, and m represents an integer of 0 or 1.

In the above formulas, the alkylene groups for Q", $R^{94}$ and $R^{95}$ are preferably methylene groups.

Examples of the heterocyclic group for $R^{101}$, besides those already mentioned above, include the groups shown below.

[Chemical Formula 45]

(r-al-1)

(r-al-2)

(r-al-3)

(r-al-4)

(r-al-5)

(r-al-6)

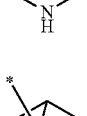

(r-al-7)

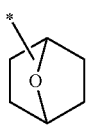

(r-al-8)

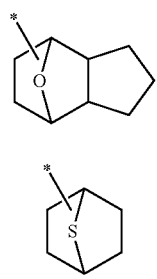

(r-al-9)

(r-al-10)

(r-hr-1)

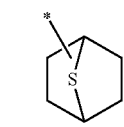

(r-hr-2)

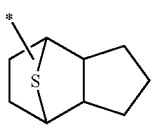

(r-hr-3)

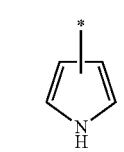

(r-hr-4)

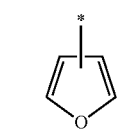

(r-hr-5)

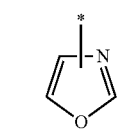

(r-hr-6)

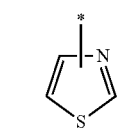

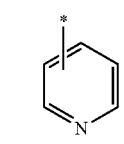

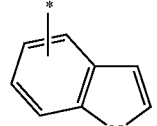

The cyclic aliphatic hydrocarbon group, aromatic hydrocarbon group or heterocyclic group for $R^{101}$ may have a substituent. Here, the expression that the hydrocarbon group or heterocyclic group "may have a substituent" means that part or all of the hydrogen atoms bonded to the cyclic structure of the hydrocarbon group or heterocyclic group may be substituted with a group or an atom other than a hydrogen atom. Examples of the substituent include an alkyl group, alkoxy group, halogen atom, halogenated alkyl group, hydroxyl group oxygen atom (=O), and nitro group.

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an alkyl group of 1 to 5 carbon atoms (such as a methyl group, ethyl group, propyl group, n-butyl group or tert-butyl group) have each been substituted with an aforementioned halogen atom.

The chain-like alkyl group for $R^{101}$ may be either a linear or branched group.

The linear alkyl group preferably contains 1 to 20 carbon atoms, more preferably 1 to 15 carbon atoms, and most preferably 1 to 10 carbon atoms. Specific examples of the linear alkyl group include a methyl group, ethyl group, propyl group, butyl group, pentyl group, hexyl group, heptyl group, octyl group, nonyl group, decanyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched alkyl group preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The alkenyl group for $R^{101}$ preferably contains 2 to 10 carbon atoms, more preferably 2 to 5 carbon atoms, still more preferably 2 to 4 carbon atoms, and most preferably 3 carbon atoms. Specific examples include a vinyl group, propenyl group (allyl group) and butenyl group. Of these, a propenyl group is particularly desirable.

Examples of the substituent for the chain-like alkyl group or alkenyl group for $R^{101}$ include the alkoxy group, halogen atom, halogenated alkyl group, hydroxyl group oxygen atom (=O) and nitro group mentioned above for the substituent for the cyclic group, as well as an aforementioned cyclic group.

In the present invention, $R^{101}$ is preferably a cyclic group which may have a substituent, and is more preferably a phenyl group, a naphthyl group, a group in which one hydrogen atom has been removed from a polycycloalkane, a lactone-containing cyclic group represented by one of the above formulas (L1) to (L6) or (S1) to (S4), or an —SO$_2$-containing cyclic group or the like.

The divalent linking group containing an oxygen atom for $Y^{101}$ may contain one or more atoms other than the oxygen atom. Examples of these atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (ether linkage: —O—), O—), an ester linkage (—C(=O)—O—), an amide linkage (—C(=O)—NH—), a carbonyl linkage (—C(=O)—) and a carbonate linkage (—O—C(=O)—O—); and combinations of these non-hydrocarbon, oxygen atom-containing linking groups with an alkylene group. Furthermore, the combinations may also have a sulfonyl group (—SO$_2$—) bonded thereto.

Specific examples of these combinations include —V$^{105}$—O—, —V$^{105}$—O—C(=O)—, —C(=O)—O—V$^{105}$—O—C(=O), —SO$_2$—O—V$^{105}$—O—C(=O)— and —V$^{105}$—SO$_2$—O—V$^{106}$—O—C(=O)— (wherein each of V$^{105}$ and V$^{106}$ independently represents an alkylene group).

The alkylene group for V$^{105}$ and V$^{106}$ is preferably a linear or branched alkylene group, and preferably contains 1 to 12 carbon atoms, more preferably 1 to 5 carbon atoms, and most preferably 1 to 3 carbon atoms.

Examples of the alkylene group include the same groups as those mentioned above for the alkylene group for X.

Q' is preferably a divalent linking group containing an ester linkage or an ether linkage, and is more preferably a group represented by —V$^{105}$—O—, —V$^{105}$—O—C(=O)—, or —C(=O)—O—V$^{105}$—O—C(=O)—.

Examples of the alkylene group for V$^{101}$ include the same groups as those mentioned above for the alkylene group for X, and an alkylene group of 1 to 5 carbon atoms is preferable.

Examples of the fluorinated alkylene group for V$^{101}$ include groups in which part or all of the hydrogen atoms that constitute any of the alkylene groups mentioned above for X have each been substituted with a fluorine atom. The fluorinated alkylene group preferably contains 1 to 5 carbon atoms, and more preferably 1 or 2 carbon atoms.

Examples of the fluorinated alkyl group of 1 to 5 carbon atoms for $R^{102}$ include groups in which part or all of the hydrogen atoms that constitute an alkyl group of 1 to 5 carbon atoms have each been substituted with a fluorine atom.

Each of $R^{104}$ and $R^{105}$ independently represents an alkyl group or fluorinated alkyl group of 1 to 10 carbon atoms, or $R^{104}$ and $R^{105}$ may be bonded to each other to form a ring.

$R^{104}$ and $R^{105}$ are preferably linear or branched (fluorinated) alkyl groups. The (fluorinated) alkyl group preferably contains 1 to 10 carbon atoms, more preferably 1 to 7 carbon atoms, and still more preferably 1 to 3 carbon atoms. Within the above range of the number of carbon atoms, because a smaller number of carbon atoms in the (fluorinated) alkyl group for $R^{104}$ and $R^{105}$ yields better solubility in a resist solvent, a smaller number of carbon atoms is preferred.

Further, in the (fluorinated) alkyl group for $R^{104}$ and $R^{105}$, it is preferable that the number of hydrogen atoms substituted with fluorine atoms is as large as possible, because the acid strength increases, and the transparency to high energy radiation of 200 nm or less or an electron beam is improved.

The amount of fluorine atoms within the (fluorinated) alkyl group, namely, the fluorination ratio, is preferably within a range from 70 to 100%, and more preferably from 90 to 100%. A perfluoroalkyl group in which all the hydrogen atoms have been substituted with fluorine atoms is the most desirable.

Specific examples of the anion moiety in the aforementioned formula (b-1) include anions represented by any of formulas (b1) to (b9) shown below.

[Chemical Formula 46]

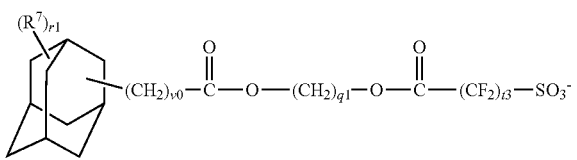
(b1)

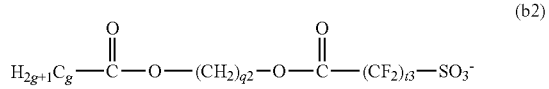
(b2)

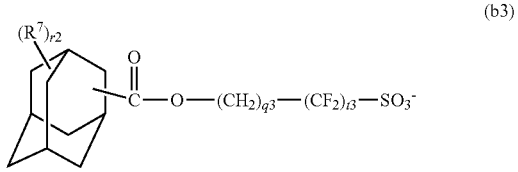
(b3)

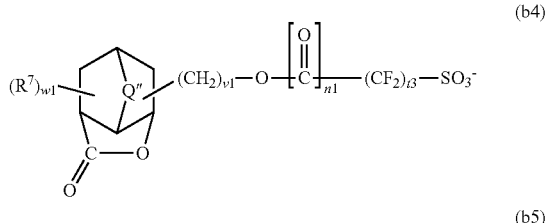
(b4)

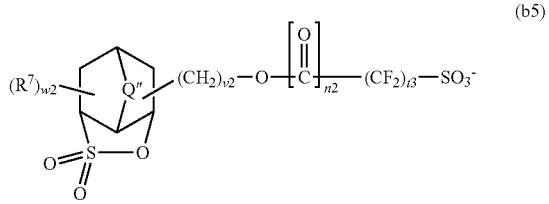
(b5)

[Chemical Formula 47]

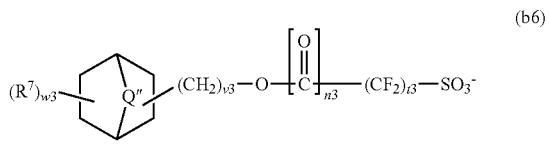
(b6)

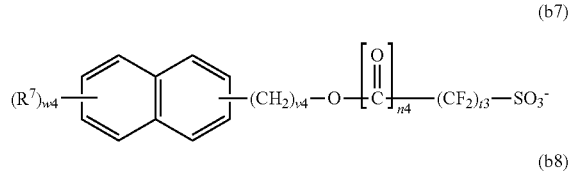
(b7)

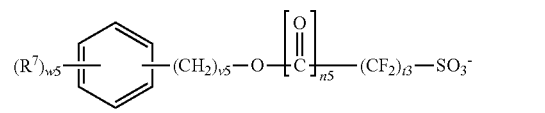
(b8)

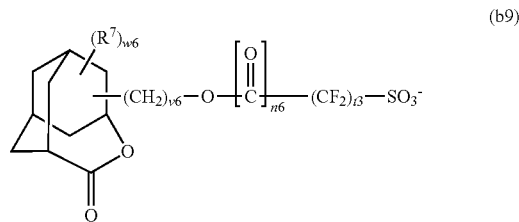
(b9)

In the above formulas, each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, $R^7$ represents a substituent, each of n1 to n6 independently represents 0 or 1, each of v0 to v6 independently represents an integer of 0 to 3, each of w1 to w6 independently represents an integer of 0 to 3, and Q″ is the same as defined above.

Examples of the substituent for $R^7$ include the same groups as those mentioned above, within the description relating to $R^{101}$, as substituents that may substitute part of the hydrogen atoms bonded to the carbon atoms that constitute the ring structure of an aliphatic cyclic group, or as substituents that may substitute the hydrogen atoms bonded to an aromatic ring within an aromatic hydrocarbon group.

If there are two or more of the $R^7$ group, as indicated by the value of the subscript (r1, r2, or w1 to w6) appended to $R^7$, then the plurality of $R^7$ groups within the compound may be the same or different.

{Cation Moiety}

$M^{m+}$ represents an organic cation having a valency of m.

There are no particular limitations on the m-valent organic cation for $M^{m+}$, and any of the organic cations known as the cation moieties for onium salt-based acid generators or the like within conventional resist compositions can be used.

The m-valent organic cation is preferably a sulfonium cation or an iodonium cation, and is more preferably a cation represented by one of the general formulas (ca-1) to (ca-4) shown below.

[Chemical Formula 48]

(ca-1)

(ca-2)

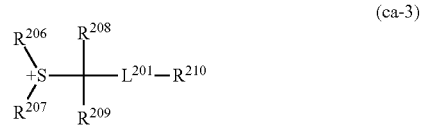
(ca-3)

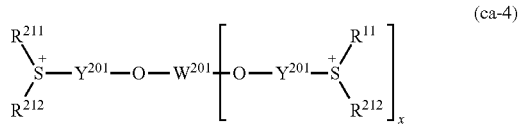
(ca-4)

In the formulas, $R^{201}$ to $R^{207}$ and $R^{210}$ to $R^{212}$ each independently represents an aryl group, alkyl group or alkenyl group which may have a substituent, and two of $R^{201}$ to $R^{203}$, $R^{206}$ and $R^{207}$, or $R^{211}$ and $R^{212}$ may be bonded to each other to form a ring in combination with the sulfur atom in the formula. Each of $R^{208}$ and $R^{209}$ independently represents a hydrogen atom or an alkyl group of 1 to 5 carbon atoms, $L^{201}$ represents —C(=O)— or —C(=O)—O—, each $Y^{201}$ independently represents an arylene group, an alkylene group or an alkenylene group, x represents 1 or 2, and $W^{201}$ represents a linking group having a valency of (x+1).

Examples of the aryl group for $R^{201}$ to $R^{207}$ and $R^{210}$ to $R^{212}$ include unsubstituted aryl groups having 6 to 20 carbon atoms, and a phenyl group or naphthyl group is preferable.

Examples of the alkyl group for $R^{201}$ to $R^{207}$ and $R^{210}$ to $R^{212}$ include chain-like and cyclic alkyl groups, and the alkyl group preferably contains 1 to 30 carbon atoms.

The alkenyl group for $R^{201}$ to $R^{207}$ and $R^{210}$ to $R^{212}$ preferably contains 2 to 10 carbon atoms.

Examples of the substituent which $R^{201}$ to $R^{207}$ and $R^{210}$ to $R^{212}$ may have include an alkyl group, halogen atom, halogenated alkyl group, oxo group (=O), cyano group, amino group, aryl group, or a substituent represented by any of the formulas (ca-r-1) to (ca-r-6) shown below.

[Chemical Formula 49]

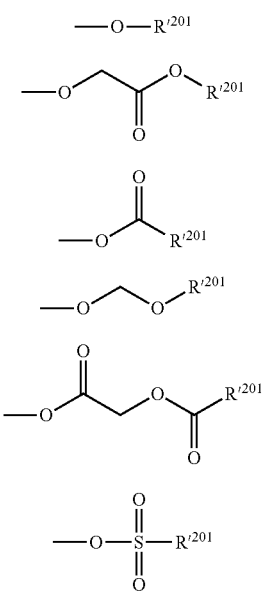

In the above formulas, each $R'^{201}$ independently represents a hydrogen atom or a hydrocarbon group of 1 to 30 carbon atoms.

The hydrocarbon group for $R'^{201}$ is the same as the hydrocarbon cyclic group which may have a substituent, or the chain-like alkyl group or alkenyl group which may have a substituent described above for $R^{101}$.

In those cases where $R^{201}$ to $R^{203}$, $R^{206}$ and $R^{207}$, or $R^{211}$ and $R^{212}$ are bonded to each other to form a ring in combination with the sulfur atom in the formula, the bonded groups may be bonded together via a hetero atom such as a sulfur atom, oxygen atom or nitrogen atom, or via a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms).

The ring that is formed, which includes the sulfur atom in the formula within the ring structure, is preferably a 3- to 10-membered ring, and more preferably a 5- to 7-membered ring, including the sulfur atom.

Specific examples of the ring that is formed include a thiophene ring, thiazole ring, benzothiophene ring, thianthrene ring, dibenzothiophene ring, 9H-thioxanthene ring, thioxanthone ring, phenoxathiin ring, tetrahydrothiophenium ring and tetrahydrothiopyranium ring.

Further, x represents 1 or 2.

$W^{201}$ represents a linking group having a valency of (x+1), namely a divalent or trivalent linking group.

Examples of the divalent linking group for $W^{201}$ include the same groups as those described above for the divalent linking group for $Y^{3''}$, and although the divalent linking group may be linear, branched or cyclic, a cyclic group is preferable. Among such groups, a group combining two carbonyl groups at the two terminals of an arylene group is particularly desirable. Examples of this arylene group include a phenylene group and a naphthylene group, and a phenylene group is particularly desirable.

Examples of the trivalent linking group for $W^{201}$ include groups in which a hydrogen atom has been removed from a divalent linking group, and groups in which an additional divalent linking group is bonded to a divalent linking group. Examples of the divalent linking group include the same groups as those described above for the divalent linking group for $Y^{3''}$. The trivalent linking group for $W^{201}$ is preferably a group in which three carbonyl groups are combined with an arylene group.

Specific examples of preferred cations represented by formula (ca-1) include cations represented by the formulas shown below.

[Chemical Formula 50]

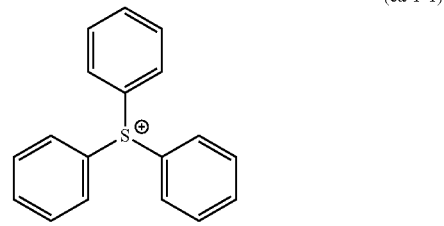

(ca-1-1)

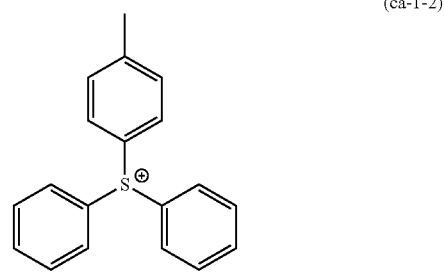

(ca-1-2)

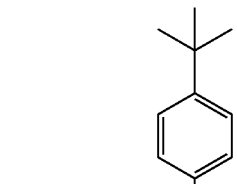

(ca-1-3)

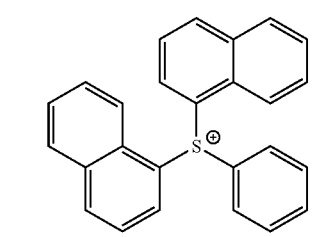

(ca-1-4)

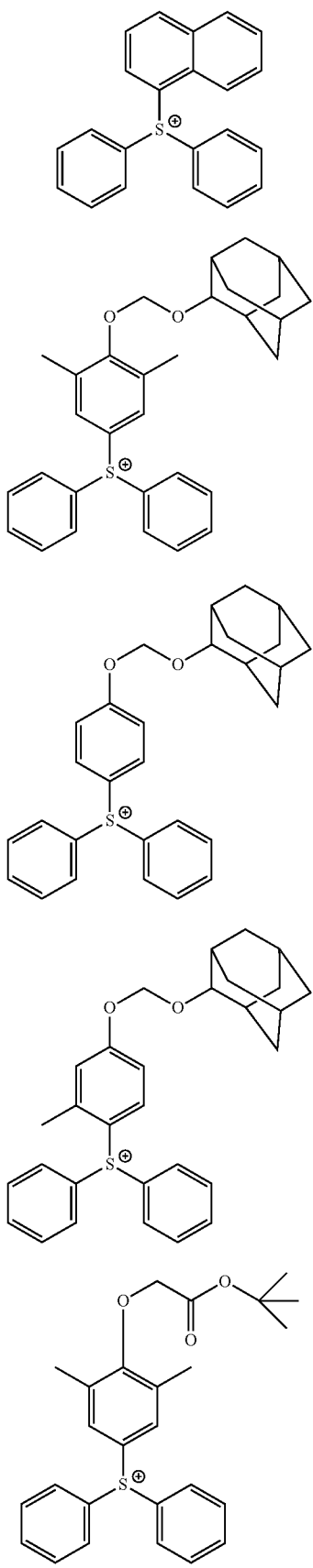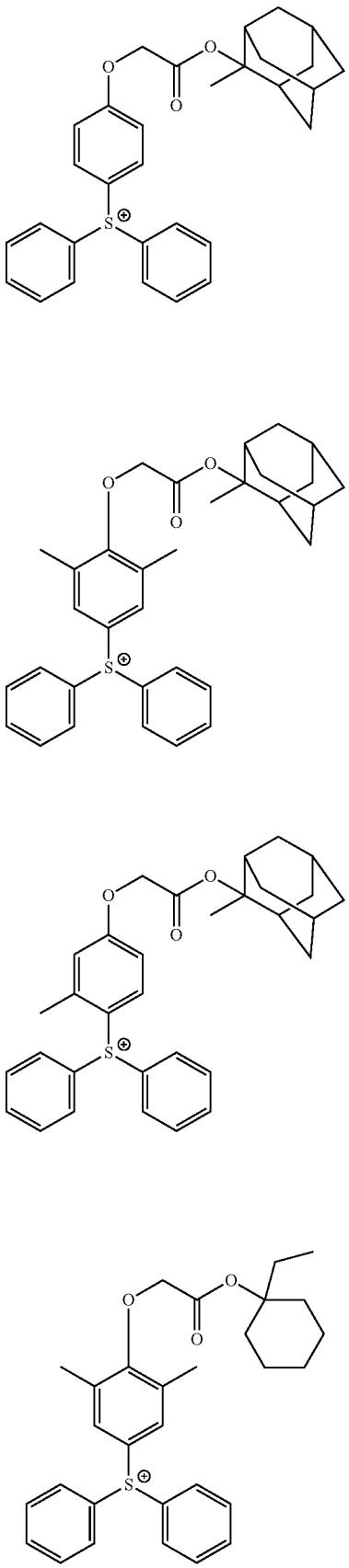

(ca-1-14)
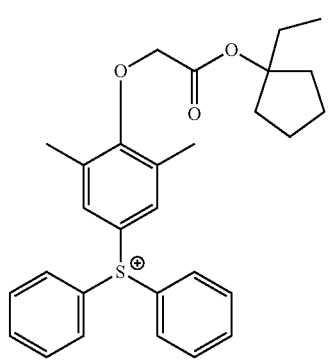
(ca-1-15)
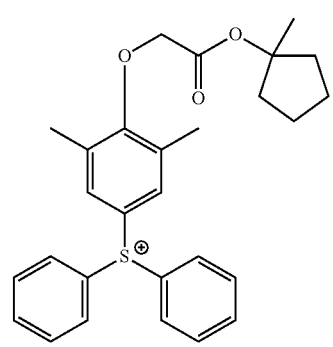
(ca-1-16)
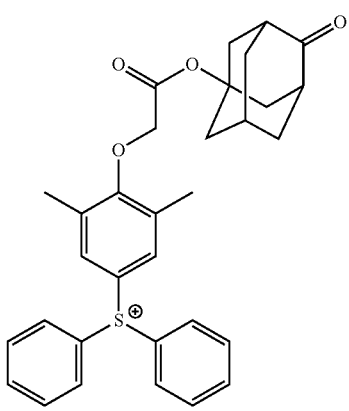
(ca-1-17)
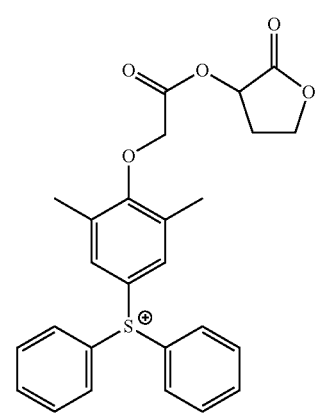
(ca-1-18)
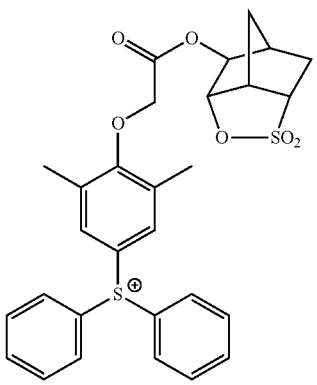
(ca-1-19)
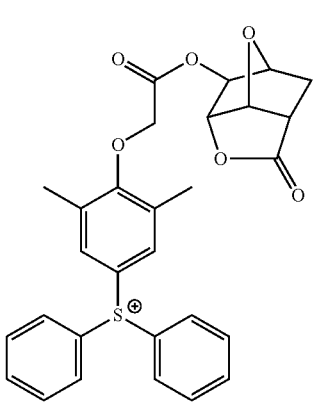
(ca-1-20)
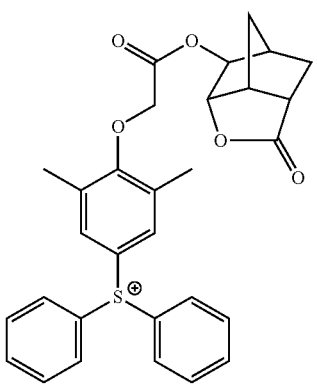
(ca-1-21)
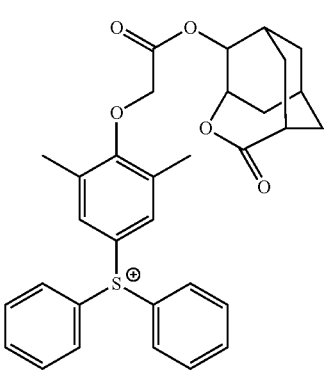

(ca-1-22)
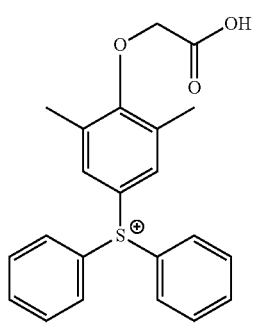
(ca-1-23)
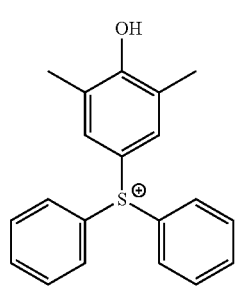
(ca-1-24)
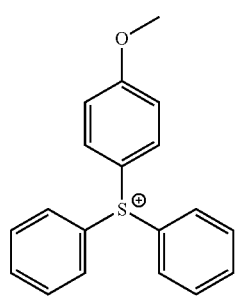
(ca-1-25)
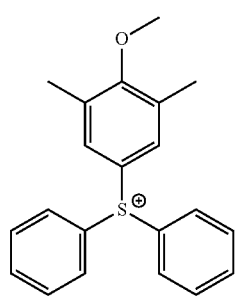
(ca-1-26)
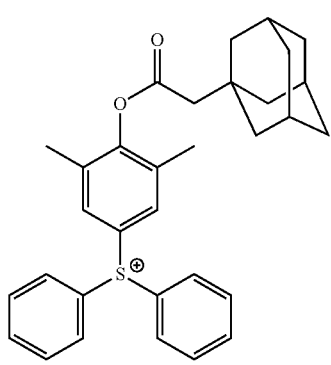
(ca-1-27)
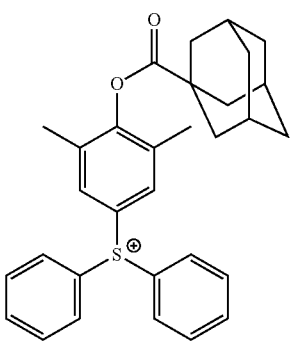
(ca-1-28)
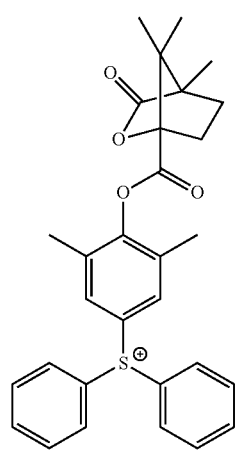
[Chemical Formula 51]
(ca-1-29)
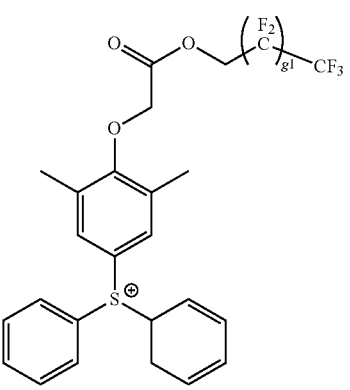
(ca-1-30)
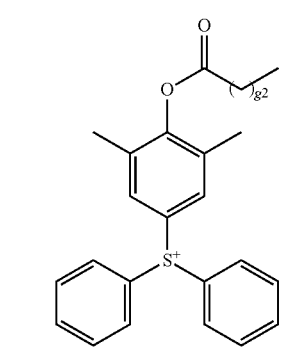

(ca-1-31)
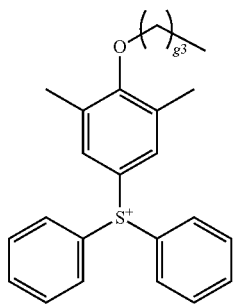
(ca-1-32)
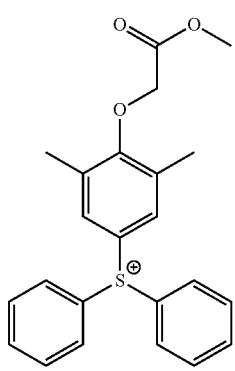
(ca-1-33)
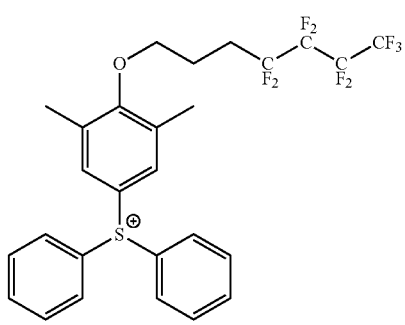
(ca-1-34)
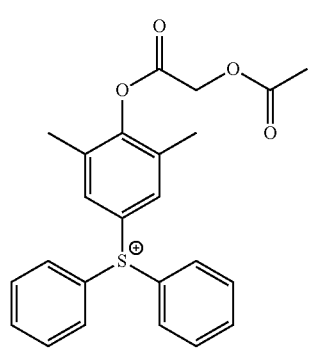
(ca-1-35)
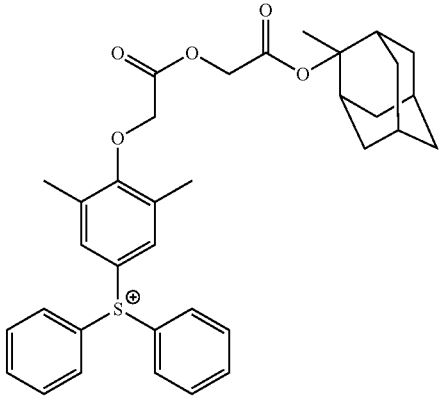
(ca-1-36)
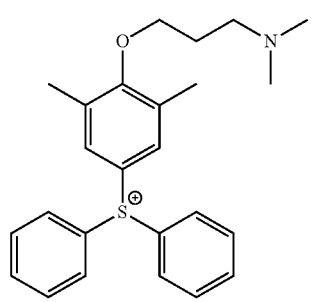
(ca-1-37)
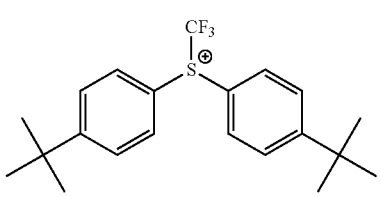
(ca-1-38)
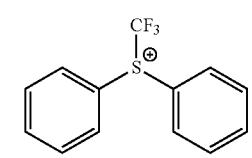
(ca-1-39)
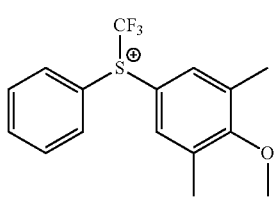
(ca-1-40)
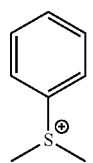
(ca-1-41)

(ca-1-42)
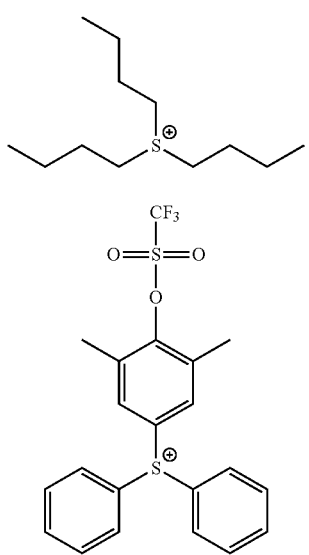
(ca-1-43)
In the above formulas, each of g1, g2 and g3 represents a number of repeating units, wherein g1 represents an integer of 1 to 5, g2 represents an integer of 0 to 20, and g3 represents an integer of 0 to 20.
[Chemical Formula 52]
(ca-1-44)
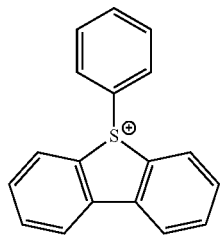
(ca-1-45)
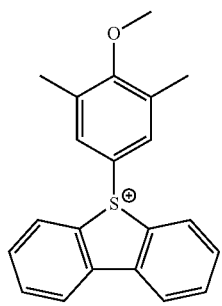
(ca-1-46)
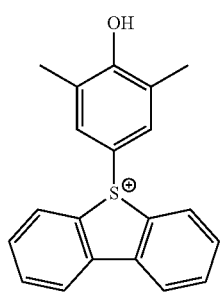
(ca-1-47)
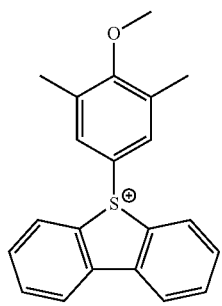
(ca-1-48)
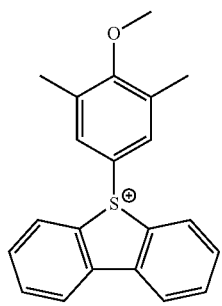
(ca-1-49)
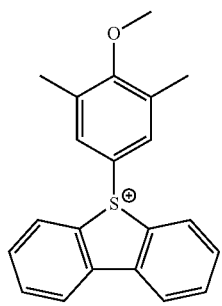
(ca-1-50)
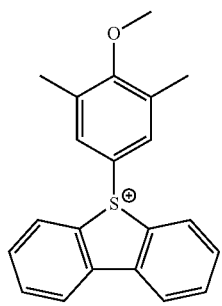
(ca-1-51)
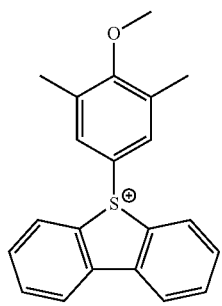

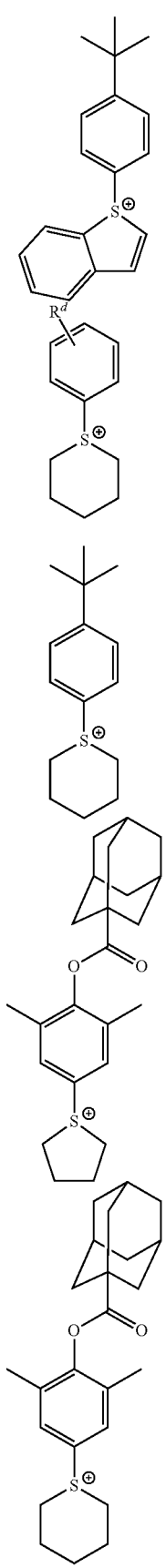

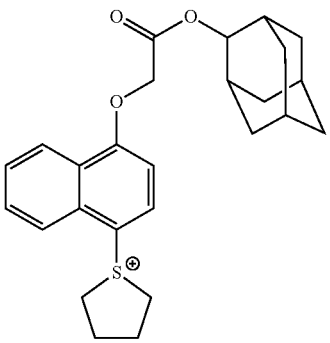

In the above formulas, $R^d$ represents a hydrogen atom or a substituent, wherein examples of the substituent include the same substituents as those mentioned above as substituents that $R^{201}$ to $R^{207}$ and $R^{210}$ to $R^{212}$ may have.

[Chemical Formula 53]

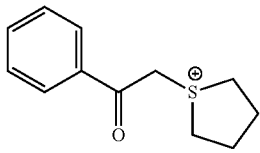

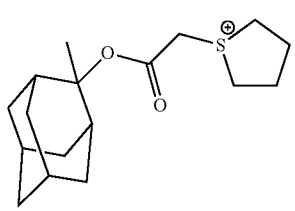

The organic cation represented by $M^{m+}$ is preferably an organic cation represented by formula (ca-1) or (ca-3) shown above.

In terms of oxime sulfonate-based acid generators, the oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 86) can be used favorably.

In terms of diazomethane-based acid generators, those disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 can be used favorably.

Furthermore, examples of poly(bis-sulfonyl)diazomethanes that can be used include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or a combination of two or more types of acid generators may be used.

The amount of the component (B) within the resist composition is preferably within a range from 0.5 to 60 parts by weight, more preferably from 1 to 50 parts by weight, and still more preferably from 1 to 40 parts by weight, relative to 100 parts by weight of the component (A). When the amount of the component (B) is within the above range, formation of a resist pattern can be performed satisfactorily. Further, a uniform solution can be obtained when each of the components of the resist composition is dissolved in an organic solvent, and the storage stability tends to improve, both of which are desirable.

<Optional Components>
{Basic Compound Component; Component (D)}

The component (D) is a basic compound component which functions as an acid diffusion control agent, namely a quencher which traps the acid generated from the component (B) and the like upon exposure. In the present invention, the expression "basic compound" describes a compound that is relatively basic compared with the component (B).

Examples of the component (D) in the present invention include basic compounds (D1) (hereafter referred to as "component (D1)") composed of a cation moiety and an anion moiety.

[Component (D1)]

There are no particular limitations on the component (D1), provided it is relatively basic compared with the component (B), but a compound composed of a cation moiety and an anion moiety is preferable, a compound that includes a photoreactive quencher is more preferable, and a component that includes at least one compound selected from the group consisting of compounds (d1) represented by general formula (d1) shown below (hereafter referred to as "component (d1)"), compounds (d2) represented by general formula (d2) shown below (hereafter referred to as "component (d2)"), and compounds (d3) represented by general formula (d3) shown below (hereafter referred to as "component (d3)") is particularly desirable.

A "photoreactive quencher" is a compound that does not function as a quencher in the exposed portions, but does function as a quencher in the unexposed portions.

[Chemical Formula 54]

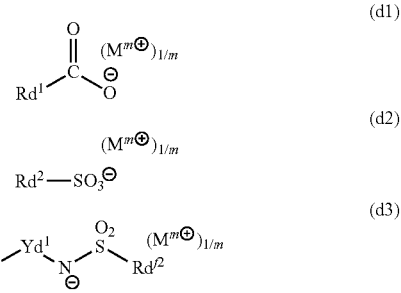

In the above formulas, $Rd^1$ represents an alkyl group which may have a substituent or a hydrocarbon group which may have a substituent, $Rd^2$ represents a hydrocarbon group of 1 to 30 carbon atoms which may have a substituent. In formula (d2), a fluorine atom must not be bonded to the carbon atom adjacent to the S atom. $Rd^3$ represents an organic group, $Yd^1$ represents a linear, branched or cyclic alkylene group or an arylene group, $Rd^{f2}$ represents a hydrocarbon group containing a fluorine atom, each $M^{m+}$ independently represents an organic cation having a valency of m, and m represents an integer of 1 to 3.

(Component (d1))
Anion Moiety

In formula (d1), $Rd^1$ represents an alkyl group which may have a substituent or a hydrocarbon group which may have a substituent.

The alkyl group which may have a substituent for $Rd^1$ may be a chain-like alkyl group or a cyclic alkyl group, but is preferably a linear or branched alkyl group.

The alkyl group preferably contains 1 to 11 carbon atoms, more preferably 1 to 8 carbon atoms, and still more preferably 1 to 4 carbon atoms. Specific examples of the alkyl group include linear alkyl groups such as a methyl group, ethyl group, propyl group, butyl group, pentyl group, hexyl group, heptyl group, octyl group, nonyl group and decyl group, and branched alkyl groups such as a 1-methylethyl group, 1-methylpropyl group, 2-methylpropyl group, 1-methylbutyl group, 2-methylbutyl group and 3-methylbutyl group.

Further, the alkyl group for $Rd^1$ may also include a fluorine atom or some other atom. Examples of these other atoms besides a fluorine atom include an oxygen atom, carbon atom, hydrogen atom, sulfur atom and nitrogen atom.

Of the various possibilities, in those cases where $Rd^1$ represents a fluorinated alkyl group, a group in which part or all of the hydrogen atoms of a linear alkyl group have each been substituted with a fluorine atom is preferable, and a group in which all of the hydrogen atoms of a linear alkyl group have been substituted with fluorine atoms (a perfluoroalkyl group) is particularly desirable.

The hydrocarbon group which may have a substituent for $Rd^1$ may be either an aliphatic hydrocarbon group or an aromatic hydrocarbon group, and examples include the same groups as the cyclic group which may have a substituent, and the chain-like alkyl group or alkenyl group which may have a substituent described above for $R^{101}$ in relation to the component (B).

Of the various possibilities, the hydrocarbon group which may have a substituent for $Rd^1$ is preferably an aromatic hydrocarbon group which may have a substituent, or an aliphatic cyclic group which may have a substituent, and is more preferably a phenyl group or naphthyl group which may have a substituent, or a group in which one or more hydrogen atoms have been removed from a polycycloalkane such as adamantane, norbornane, isobornane, tricyclodecane or tetracyclododecane.

As the hydrocarbon group which may have a substituent for $Rd^1$, a linear, branched or cyclic alkyl group or fluorinated alkyl group is also preferable.

The linear, branched or cyclic alkyl group for $Rd^1$ preferably contains 1 to 10 carbon atoms.

Specific examples of preferred anion moieties for the component (d1) are shown below.

group or an aromatic hydrocarbon group, and examples include the same groups as the cyclic group which may have a substituent, and the chain-like alkyl group or alkenyl group which may have a substituent described above for $R^{101}$ in relation to the component (B).

Among these groups, the hydrocarbon group which may have a substituent for $Rd^2$ is preferably an aliphatic cyclic group which may have a substituent, and is more preferably a group (which may have a substituent) in which one or more hydrogen atoms have been removed from adamantane, norbornane, isobornane, tricyclodecane, tetracyclododecane or camphor or the like.

The hydrocarbon group for $Rd^2$ may have a substituent, and examples of the substituent include the same substituents as those mentioned above for $R^{101}$ in relation to the component (B). However, in $Rd^2$, the carbon atom adjacent to the S atom in $SO_3^-$ must not be substituted with a fluorine atom. By ensuring that $SO_3^-$ is not adjacent to a fluorine atom, the anion of the component (d2) becomes an appropriate weakly acidic anion, and the quenching action of the component (d2) improves.

Specific examples of preferred anions for the component (d2) are shown below.

[Chemical Formula 55]

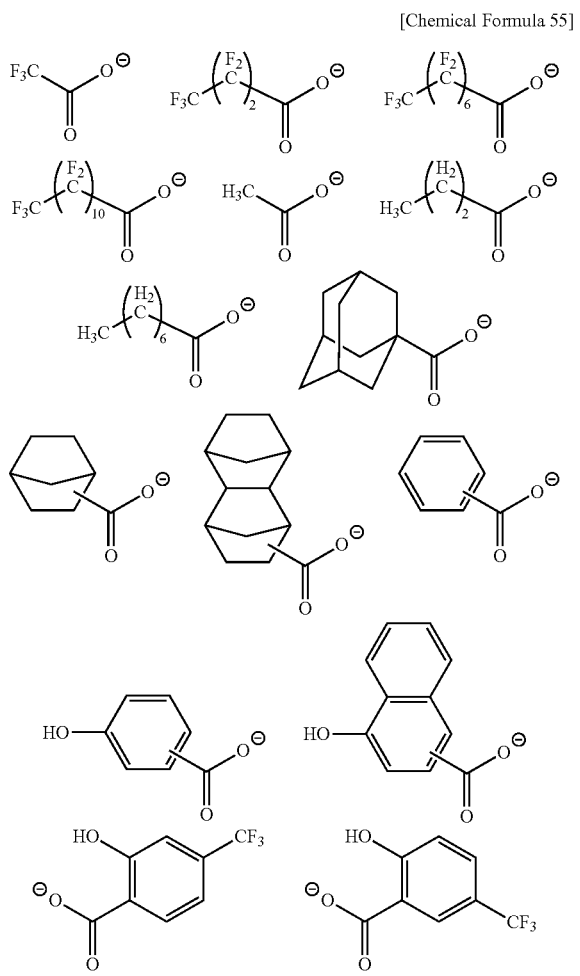

[Chemical Formula 56]

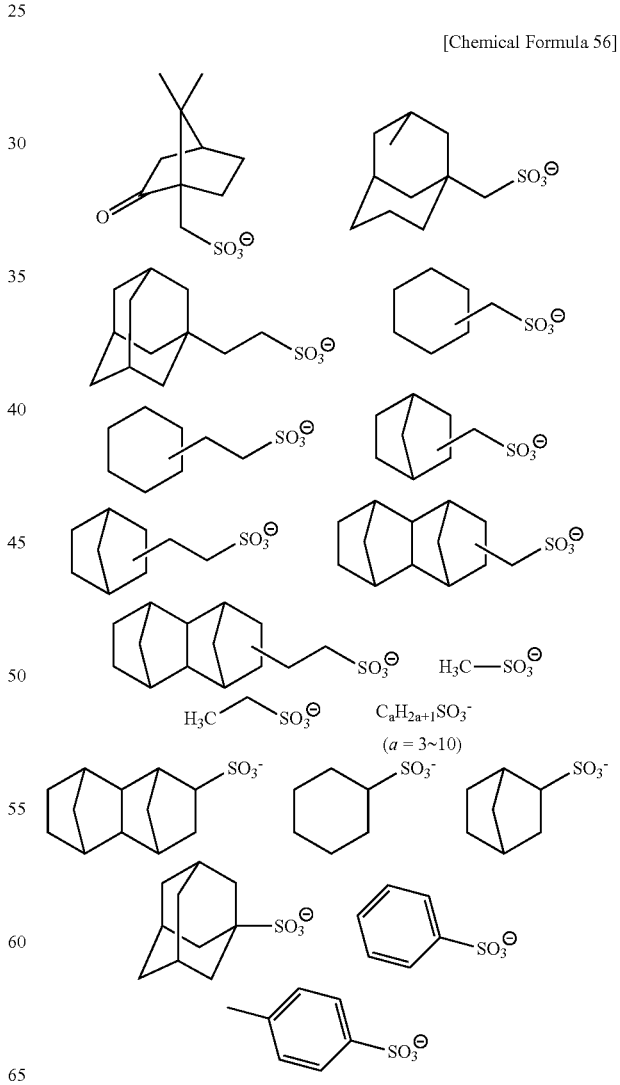

Cation Moiety

In formula (d1), $M^{m+}$ represents an organic cation having a valency of m, and is the same as the cation described above for the component (B). Of such cations, a sulfonium cation or iodonium cation is preferable, and a cation represented by one of the above formulas (ca-1-1) to (ca-1-57) is particularly preferable.

A single type of the component (d1) may be used alone, or a combination of two or more types of components may be used.

(Component (d2))

Anion Moiety

In formula (d2), $Rd^2$ represents a hydrocarbon group of 1 to 30 carbon atoms which may have a substituent.

The hydrocarbon group of 1 to 30 carbon atoms which may have a substituent for $Rd^2$ may be an aliphatic hydrocarbon Cation Moiety In formula (d2), $M^{m+}$ is the same as defined above for $M^{m+}$ in formula (d1).

A single type of the component (d2) may be used alone, or a combination of two or more types of components may be used.

(Component (d3))

Anion Moiety

In formula (d3), $Rd^3$ represents an organic group.

There are no particular limitations on the organic group for $Rd^3$, and examples include an alkyl group, alkoxy group, —O—C(=O)—C($Rd^{31}$)=CH$_2$ (wherein $Rd^{31}$ represents a hydrogen atom, an alkyl group of 1 to 5 carbon atoms or a halogenated alkyl group of 1 to 5 carbon atoms) and —O—C(=O)—$Rd^{32}$ (wherein $Rd^{32}$ represents a hydrocarbon group).

The alkyl group for $Rd^3$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. A portion of the hydrogen atoms within the alkyl group for $Rd^3$ may each be substituted with a hydroxyl group or a cyano group or the like.

The alkoxy group for $Rd^3$ is preferably an alkoxy group of 1 to 5 carbon atoms, and specific examples of such alkoxy groups of 1 to 5 carbon atoms include a methoxy group, ethoxy group, n-propoxy group, iso-propoxy group, n-butoxy group and tert-butoxy group. Among these, a methoxy group or an ethoxy group is the most desirable.

When $Rd^3$ is —O—C(=O)—C($Rd^{31}$)=CH$_2$, $Rd^{31}$ represents a hydrogen atom, an alkyl group of 1 to 5 carbon atoms or a halogenated alkyl group of 1 to 5 carbon atoms.

The alkyl group of 1 to 5 carbon atoms for $Rd^{31}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for $Rd^{31}$ is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

$Rd^{31}$ is preferably a hydrogen atom, an alkyl group of 1 to 3 carbon atoms or a fluorinated alkyl group of 1 to 3 carbon atoms, and in terms of industrial availability, a hydrogen atom or a methyl group is the most desirable.

When $Rd^3$ is —O—C(=O)—$Rd^{32}$, $Rd^{32}$ represents a hydrocarbon group.

The hydrocarbon group for $Rd^{32}$ may be either an aromatic hydrocarbon group or an aliphatic hydrocarbon group. Specific examples of the hydrocarbon group for $Rd^{32}$ include the same groups as the cyclic group which may have a substituent, and the chain-like alkyl group or alkenyl group which may have a substituent described above for $R^{101}$ in relation to the component (B).

Among these, as the hydrocarbon group for $Rd^{32}$, an alicyclic group in which one or more hydrogen atoms have been removed from a cycloalkane such as cyclopentane, cyclohexane, adamantane, norbornane, isobornane, tricyclodecane or tetracyclododecane, or an aromatic group such as a phenyl group or a naphthyl group is preferable. When $Rd^{32}$ is an alicyclic group, the resist composition can be satisfactorily dissolved in an organic solvent, thereby improving the lithography properties. Alternatively, when $Rd^{32}$ is an aromatic group, the resist composition exhibits excellent photoabsorption efficiency in a lithography process using EUV or the like as the exposure source, resulting in improvements in the sensitivity and the lithography properties.

Among the above possibilities, $Rd^3$ is preferably a group represented by —O—C(=O)—C($Rd^{31}$)=CH$_2$ (wherein $Rd^{31}$ represents a hydrogen atom or a methyl group) or —O—C(=O)—$Rd^{32}$ (wherein $Rd^{32}$ represents an aliphatic cyclic group).

In formula (d3), $Yd^1$ represents a linear, branched or cyclic alkylene group or an arylene group.

Examples of the linear, branched or cyclic alkylene group or the arylene group for $Yd^1$ include the same groups as the "linear or branched aliphatic hydrocarbon group", "cyclic aliphatic hydrocarbon group" and "aromatic hydrocarbon group" mentioned above within the description of the divalent linking group for $Y^3$".

Among these groups, $Yd^1$ is preferably an alkylene group, more preferably a linear or branched alkylene group, and most preferably a methylene group or an ethylene group.

In formula (d3), $Rd^{f2}$ represents a hydrocarbon group containing a fluorine atom.

The hydrocarbon group containing a fluorine atom for $Rd^{f2}$ is preferably a fluorinated alkyl group, and the same groups as those described above for the fluorinated alkyl group for $Rd^1$ in the aforementioned formula (d1) are particularly desirable.

Specific examples of preferred anion moieties for the component (d3) are shown below.

[Chemical Formula 57]

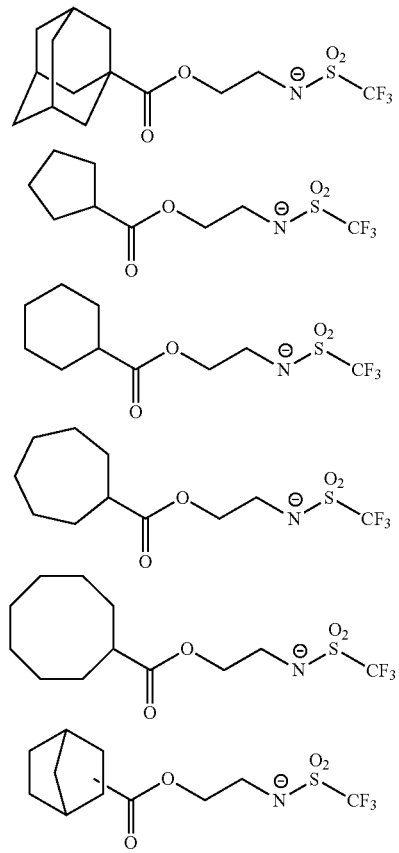

-continued

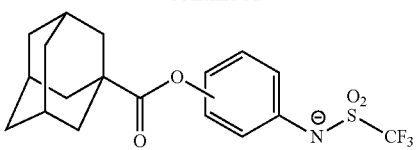
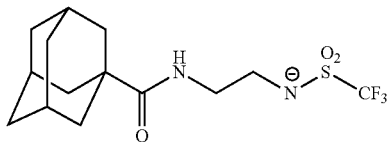
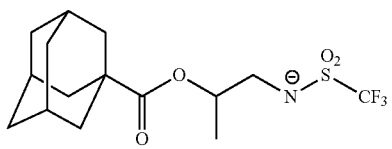
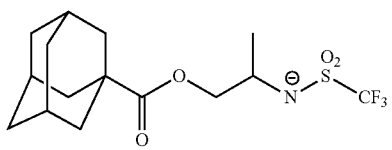
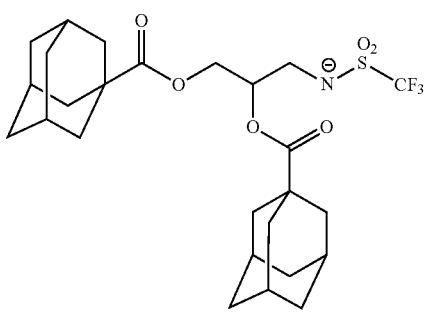
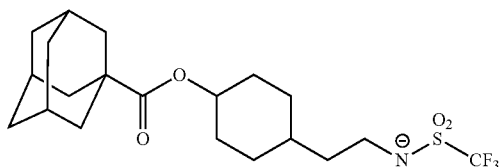
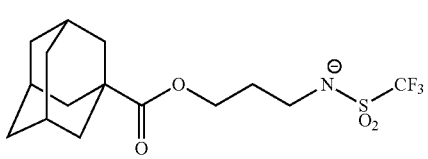
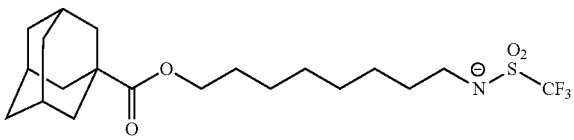
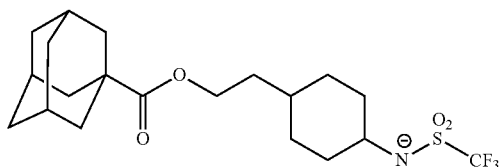
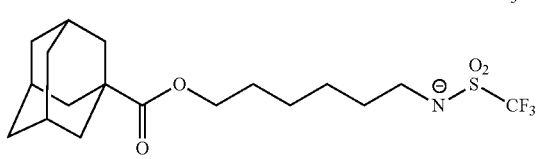

-continued

[Chemical Formula 58]

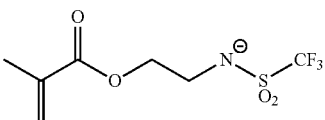
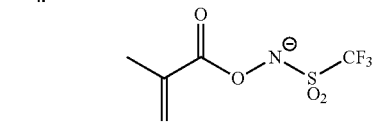
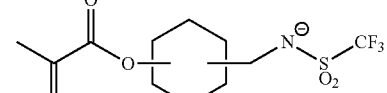
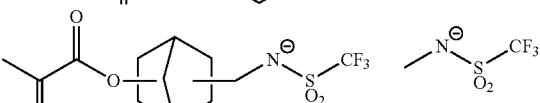
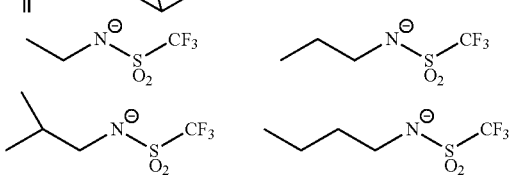
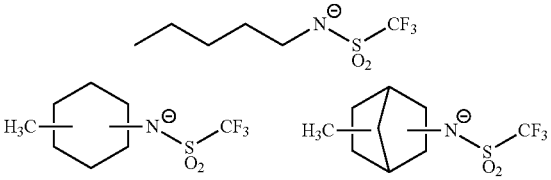
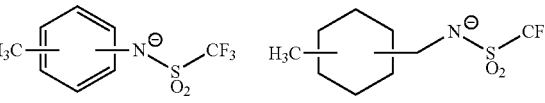
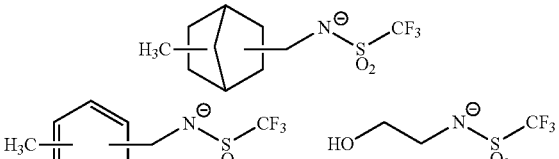

Cation Moiety

In formula (d3), $M^{m+}$ is the same as defined above for $M^{m+}$ in formula (d1).

A single type of the component (d3) may be used alone, or a combination of two or more types of components may be used.

A single component among the components (d1) to (d3) may be used alone, or a combination of two or more components may be used.

The combined amount of the components (d1) to (d3) is preferably within a range from 0.5 to 10.0 parts by weight, more preferably from 0.5 to 8.0 parts by weight, and still more preferably from 1.0 to 8.0 parts by weight, per 100 parts by weight of the component (A). When this amount is at least as large as the lower limit of the above range, excellent lithography properties and excellent resist pattern shape can be obtained. On the other hand, when the amount is not more than the upper limit of the above range, sensitivity can be maintained at a satisfactory level, and throughput can be improved.

There are no particular limitations on the methods used for producing the components (d1) and (d2), and conventional methods can be used. Further, there are also no particular limitations on the production method for the component (d3). For example, in the case where $Rd^3$ in the aforementioned formula (d3) is a group having an oxygen atom at the terminal bonded to $Yd^1$, a compound (i-1) represented by general formula (i-1) shown below can be reacted with a compound (i-2) represented by general formula (i-2) shown below to obtain a compound (i-3) represented by general formula (i-3) shown below, and this compound (i-3) can then be reacted with a compound $Z^-M^{m+}$ (i-4) having the desired cation $M^{m+}$, thereby producing a compound (d3) represented by general formula (d3).

[Chemical Formula 59]

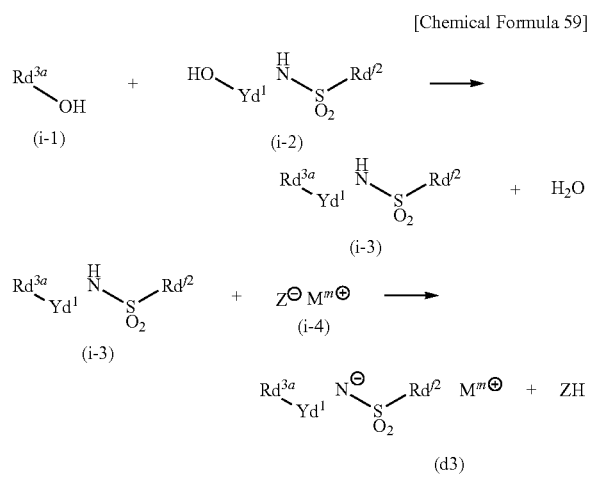

In the above formulas, $Rd^3$, $Yd^1$, $Rd'^2$ and $M^{m+}$ are the same as defined above for $Rd^3$, $Yd^3$, $Rd'^2$ and $M^{m+}$ respectively in general formula (d3), $Rd^{3a}$ represents a group in which the terminal oxygen atom has been removed from $Rd^3$, and $Z^-$ represents a counter anion.

First, the compound (i-1) is reacted with the compound (i-2) to obtain the compound (i-3).

In formula (i-1), $Rd^3$ is the same as defined above, and $Rd^{3a}$ represents a group in which the terminal oxygen atom has been removed from $Rd^3$. In formula (i-2), $Yd^1$ and $Rd'^2$ are the same as defined above.

Commercially available compounds may be used as the compound (i-1) and the compound (i-2), or the compounds may be synthesized.

The method for reacting the compound (i-1) with the compound (i-2) to obtain the compound (i-3) is not particularly limited, and can be performed, for example, by reacting the compound (i-1) with the compound (i-2) in an organic solvent in the presence of an appropriate acid catalyst, and then washing the reaction mixture and recovering the reaction product.

There are no particular limitations on the acid catalyst used in the above reaction, and examples include toluenesulfonic acid and the like. The amount used of the acid catalyst is preferably within a range from approximately 0.05 to 5 mol per 1 mol of the compound (i-2).

As the organic solvent used in the above reaction, any organic solvent which is capable of dissolving the raw materials, namely the compound (i-1) and the compound (i-2), can be used, and specific examples include toluene and the like. The amount of the organic solvent is preferably within a range from 0.5 to 100 parts by weight, and more preferably from 0.5 to 20 parts by weight, relative to 1 part by weight of the compound (i-1). As the solvent, one type of solvent may be used alone, or a combination of two or more types of solvents may be used.

In general, the amount of the compound (i-2) used in the above reaction is preferably within a range from approximately 0.5 to 5 mol, and more preferably from approximately 0.8 to 4 mol, relative to 1 mol of the compound (i-1).

The reaction time for the above reaction varies depending on the reactivity between the compound (i-1) and the compound (i-2), and the reaction temperature and the like, but in most cases, is preferably from 1 to 80 hours, and more preferably from 3 to 60 hours.

The reaction temperature of the above reaction is preferably within a range from 20° C. to 200° C., and more preferably from approximately 20° C. to 150° C.

Next, the obtained compound (i-3) is reacted with the compound (i-4), thereby obtaining the compound (d3).

In formula (i-4), $M^{m+}$ is the same as defined above, and $Z'$ represents a counter anion.

The method used for reacting the compound (i-3) with the compound (i-4) to obtain the compound (d3) is not particularly limited, and can be performed, for example, by dissolving the compound (i-3) in an appropriate organic solvent and water in the presence of an appropriate alkali metal hydroxide, and then adding the compound (i-4) and stirring to effect a reaction.

There are no particular limitations on the alkali metal hydroxide used in the above reaction, and examples include sodium hydroxide and potassium hydroxide and the like. The amount used of the alkali metal hydroxide is preferably from approximately 0.3 to 3 mol, per 1 mol of the compound (i-3).

Examples of the organic solvent used in the above reaction include dichloromethane, chloroform, ethyl acetate and the like. The amount used of the organic solvent is preferably within a range from 0.5 to 100 parts by weight, and more preferably from 0.5 to 20 parts by weight, relative to the weight of the compound (i-3). As the solvent, one type of solvent may be used alone, or a combination of two or more types of solvents may be used.

In general, the amount of the compound (i-4) used in the above reaction is preferably from approximately 0.5 to 5 mol, and more preferably from approximately 0.8 to 4 mol, relative to 1 mol of the compound (i-3).

The reaction time for the above reaction varies depending on the reactivity between the compound (i-3) and the compound (i-4), and the reaction temperature and the like, but in most cases, is preferably from 1 to 80 hours, and more preferably from 3 to 60 hours.

The reaction temperature of the above reaction is preferably within a range from 20° C. to 200° C., and more preferably from approximately 20° C. to 150° C.

Following completion of the reaction, the compound (d3) contained in the reaction mixture may be isolated and purified. Conventional methods may be used to isolate and purify the product, including concentration, solvent extraction, distillation, crystallization, recrystallization and chromatography, which may be used individually or in combinations of two or more different methods.

The structure of the compound (d3) obtained in the manner described above can be confirmed by general organic analysis methods such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elemental analysis and X-ray crystal diffraction methods.

The amount of the component (D1) is preferably within a range from 0.5 to 10.0 parts by weight, more preferably from 0.5 to 8.0 parts by weight, and still more preferably from 1.0 to 8.0 parts by weight, per 100 parts by weight of the component (A). When the amount of the component (D1) is at least as large as the lower limit of the above range, excellent lithography properties and excellent resist pattern shape can be obtained. On the other hand, when the amount is not more than the upper limit of the above range, sensitivity can be maintained at a satisfactory level, and throughput can be improved.

[Component (D2)]

The component (D) may also include another basic compound component (hereafter referred to as "component (D2)") that does not correspond with the aforementioned component (D1).

There are no particular limitations on the component (D2), and a conventional compound can be used, provided it is a compound which is relatively basic compared with the component (B) so as to function as an acid diffusion inhibitor, and provided it does not fall under the definition of the component (D1). Among such compounds, aliphatic amines are preferable, and a secondary aliphatic amine or tertiary aliphatic amine is particularly desirable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines or alkyl alcohol amines), and cyclic amines.

Specific examples of the alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decanylamine and tri-n-dodecylamine, and alkyl alcohol amines such as diethanolamine, triethanolamine, diisopropanolamine, triisopropanolamine, di-n-octanolamine and tri-n-octanolamine. Among these compounds, trialkylamines of 5 to 10 carbon atoms are preferable, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate, and among these, triethanolamine triacetate is preferable.

An aromatic amine may also be used as the component (D2).

Examples of the aromatic amine include aniline, pyridine, 4-dimethylaminopyridine, pyrrole, indole, pyrazole, imidazole, and derivatives of these compounds, as well as diphenylamine, triphenylamine, tribenzylamine, 2,6-diisopropylaniline and N-tert-butoxycarbonylpyrrolidine.

As the component (D2), one type of compound may be used alone, or a combination of two or more types of compounds may be used.

The component (D2) is typically used in an amount within a range from 0.01 to 5.0 parts by weight, relative to 100 parts by weight of the component (A). By ensuring that the amount of the component (D2) is within the above range, the shape of the resist pattern and the post exposure stability of the latent image formed by the pattern-wise exposure of the resist layer are improved.

As the component (D), one type of compound may be used alone, or a combination of two or more types of compounds may be used.

In those cases where the resist composition of the present invention includes the component (D), the amount of the component (D) is preferably within a range from 0.1 to 15 parts by weight, more preferably from 0.3 to 12 parts by weight, and still more preferably from 0.5 to 12 parts by weight, per 100 parts by weight of the component (A). When the amount of the component (D) is at least as large as the lower limit of the above range, lithography properties such as the roughness can be improved when a resist composition is formed. Further, a more favorable resist pattern shape can be obtained. On the other hand, when the amount of the component (D) is not more than the upper limit of the above range, sensitivity can be maintained at a satisfactory level, and throughput can be improved.

{Component (E)}

Furthermore, in order to prevent any deterioration in sensitivity, and improve the resist pattern shape and the post exposure stability of the latent image formed by the pattern-wise exposure of the resist layer, the resist composition of the present invention may contain at least one compound (E) (hereafter referred to as "component (E)") selected from the group consisting of organic carboxylic acids, and phosphorus oxo acids and derivatives thereof as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorus oxo acid derivatives include esters in which a hydrogen atom within an aforementioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

As the component (E), one type of compound may be used alone, or a combination of two or more types of compounds may be used.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film (such as fluorine-containing resins for improving the water repellency and the like), surfactants for improving the applicability, dissolution inhibitors, plasticizers, stabilizers, colorants, halation prevention agents, and dyes.

{Component (S)}

The resist composition of the present invention can be prepared by dissolving the materials for the resist composition in an organic solvent (hereafter frequently referred to as "component (S)").

The component (S) may be any organic solvent which can dissolve the respective components to give a uniform solution, and one or more types of organic solvent may be selected appropriately from those solvents that have been conventionally known as solvents for chemically amplified resists.

Examples of the component (S) include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among these, propylene glycol monomethyl ether acetate (PGMEA), propylene glycol monomethyl ether (PGME), and ethyl lactate (EL) are preferable.

Further, among the mixed solvents, a mixed solvent obtained by mixing PGMEA with a polar solvent is preferable. The mixing ratio (weight ratio) of the mixed solvent may be determined as appropriate, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as the polar solvents, the PGMEA: (PGME+cyclohexanone) weight ratio is preferably from 1:9 to 9:1, more preferably from 2:8 to 8:2, and still more preferably 3:7 to 7:3.

Further, as the component (S), a mixed solvent of PGMEA, EL or an aforementioned mixed solvent of PGMEA and a polar solvent, with γ-butyrolactone is also preferable. In this case, the mixing ratio (former:latter) of the mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

The resist composition of the present invention exhibits excellent lithography properties, and can form a resist pattern of superior shape having excellent rectangularity.

The structural unit (a0) contained within the component (A1) of the present invention has both an acetal-type acid-dissociable group and an —$SO_2$-containing cyclic group, and is therefore able to exhibit both acid diffusion control and acid dissociability.

In other words, in the resist composition of the present invention, including the aforementioned structural unit (a0) enables the proportion of structural units within the component (A1) that perform the role of the structural unit (a1) to be increased, and moreover, including the structural unit (a0) enables the proportion of structural units within the component (A1) that perform the roles of the structural units (a2) and (a5) to also be increased.

This offers the advantage that, because the structural unit (a0) also has functions similar to those of the structural unit (a1), and the structural units (a2) and (a5), the proportions of structural units within the component (A1) that have different functions from those of the structural units (a0), (a1), (a2) and (a5) (for example, the structural units (a3) and (a4) and the like) can be increased.

Furthermore, because the structural unit (a0) generates a carboxyl group following acid dissociation, in those cases where pattern formation is conducted using alkali developing, the resist composition exhibits excellent solubility in the alkali developing solution, which offers the advantage of yielding improvements in the lithography properties such as the resolution and the LWR, and improved footing shape.

<<Method of Forming a Resist Pattern>>

The method of forming a resist pattern according to a second aspect of the present invention includes: using the aforementioned resist composition of the present invention to form a resist film on a substrate, conducting exposure of the resist film, and developing the resist film to form a resist pattern.

More specifically, the method of forming a resist pattern according to the present invention can be performed, for example, as follows.

First, the resist composition of the present invention is applied onto a substrate using a spinner or the like, and a bake treatment (post applied bake (PAB)) is conducted under temperature conditions of 80 to 150° C. for 40 to 120 seconds, and preferably 60 to 90 seconds to form a resist film.

Subsequently, the resist film is selectively exposed using an exposure apparatus such as an ArF exposure apparatus, an electron beam lithography apparatus or an EUV exposure apparatus, either by irradiation through a mask having a predetermined pattern formed therein (namely, a mask pattern), or by patterning via direct irradiation with an electron beam without using a mask pattern, and the resist film is then subjected to a bake treatment (post exposure bake (PEB))

under temperature conditions of 80 to 150° C. for 40 to 120 seconds, and preferably 60 to 90 seconds.

Next, the resist film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered onto the pattern following the developing treatment or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

There are no particular limitations on the substrate, and a conventionally known substrate can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (a lower-layer organic film) and at least one layer of a resist film (an upper-layer resist film) are provided on a substrate, and a resist pattern formed on the upper-layer resist film is used as a mask to conduct patterning of the lower-layer organic film. This method is considered as being capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (triple-layer resist method).

The wavelength used for exposure is not particularly limited, and the exposure can be conducted using various forms of radiation, including ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective for use with a KrF excimer laser, ArF excimer laser, EB or EUV.

The exposure of the resist film may be performed using either general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon-based solvents.

If required, known additives can be added to the organic developing solution. Examples of these additives include surfactants. There are no particular limitations on the surfactants, and ionic and nonionic fluorine-based surfactants and/or silicone-based surfactants can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged continuously from the nozzle (dynamic dispensing methods).

Examples of the organic solvent contained within the rinse liquid used for the rinse treatment performed following the developing treatment in a solvent developing process include those organic solvents among the solvents described above for the organic solvent of the organic developing solution which exhibit poor dissolution of the resist pattern. In general, at least one type of solvent selected from amongst hydrocarbon-based solvents, ketone-based solvents, ester-based solvents, alcohol-based solvents, amide-based solvents and ether-based solvents is used. Among these, at least one solvent selected from among hydrocarbon-based solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

<<Polymeric Compound>>

The polymeric compound according to a third aspect of the present invention has a structural unit (a0) represented by general formula (a0-1) shown below. Description of this polymeric compound of the present invention is the same as that included above within the description of the component (A1) of the resist composition of the present invention.

[Chemical Formula 60]

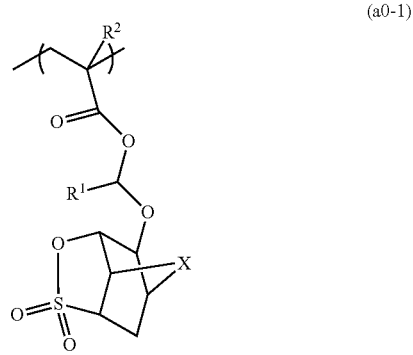

(a0-1)

In the formula, $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

EXAMPLES

A more detailed description of the present invention is presented below based on a series of examples, although the present invention is in no way limited by these examples.

In the analyses performed by NMR, tetramethylsilane (TMS) was used as an internal standard for $^1$H-NMR and $^{13}$C-NMR. Further, hexafluorobenzene was used as the internal standard for $^{19}$F-NMR (with the shift of the hexafluorobenzene peak set at −160 ppm).

Synthesis Example 1

Synthesis of 5-hydroxy-2,6-norbornanesultone (Alcohol Derivative)

A four-neck flask having an internal capacity of 2 L and fitted with a stirrer and a thermometer was charged with 0.80 g of phenothiazine, 2308.1 g of tetrahydrofuran (THF), and 174.0 g (2.64 mol) of cyclopentadiene, and the mixture was cooled to 5° C. or lower under constant stirring. Subsequently, 391.4 g (2.40 mol) of 2-chloroethanesulfonyl chloride and 293.45 g (2.9 mol) of triethylamine were placed in separate dropping funnels and were then simultaneously added dropwise to the flask over 4 hours, with the internal temperature of the flask maintained at 5 to 10° C.

Following completion of the dropwise addition, the reaction mixture was stirred at a temperature of 5 to 10° C. for 5 hours, the precipitated salt was collected by filtration under reduced pressure, and 1200.0 g of THF was then poured through the filtered salt, yielding a total of 3261.2 g of filtrate (this filtrate is termed "filtrate (A)"). Analysis of the filtrate (A) by gas chromatography revealed that it contained 356.4 g (1.85 mol) of 5-norbornene-2-sulfonyl chloride (a yield of 77.1% relative to the 2-chloroethanesulfonyl chloride).

Next, a three-neck flask having an internal capacity of 5 L and fitted with a stirrer and a thermometer was charged with 1,800 g of water, and the water was cooled to 20° C. or lower. With the water undergoing constant stirring, 160.6 g (4.02 mol) of sodium hydroxide was added so that the internal temperature was maintained at 20° C. or lower. Subsequently, 2,600 g of the filtrate (A) (5-norbornene-2-sulfonyl chloride: 283.8 g (1.474 mol)) was added dropwise to the flask over 5 hours with the internal temperature of the flask maintained at 20 to 25° C.

One hour following completion of the dropwise addition, analysis of the reaction mixture by gas chromatography revealed that the 5-norbornene-2-sulfonyl chloride had been completely dissipated. The reaction mixture was concentrated under reduced pressure to remove the THF, and was then transferred to a 5 L separating funnel and washed 3 times with 600 g samples of toluene, yielding 2144.6 g of an aqueous solution containing sodium 5-norbornene-2-sulfonate (hereafter this aqueous solution is termed "aqueous solution (A)").

Subsequently, a three-neck flask having an internal capacity of 5 L and fitted with a stirrer and a thermometer was charged with all of the aqueous solution (A), and the temperature was cooled to 10° C. Next, 186.54 g (4.02 mol) of 99% formic acid was added dropwise to the flask with the internal temperature of the flask maintained at 10 to 15° C., and following completion of the addition, the mixture was heated until the internal temperature reached 50 to 52° C., at which point 325.0 g (2.86 mol) of a 30% hydrogen peroxide solution was added dropwise to the flask over 3 hours. Following completion of the dropwise addition, the internal temperature was maintained at approximately 50° C., and 21 hours following completion of the dropwise addition, the reaction mixture was analyzed by high performance liquid chromatography (HPLC), which revealed a conversion rate to 5-norbornene-2-sulfonic acid of 99.2%.

The reaction mixture was cooled to 15° C., 73.1 g (0.58 mol) of sodium sulfite was added gradually at an internal temperature of 10 to 16° C., and following confirmation using a starch paper that hydrogen peroxide could not be detected, 281.9 g (3.36 mol) of sodium hydrogen carbonate was added gradually with the internal temperature maintained at 12 to 15° C., thus yielding a reaction mixture having a pH of 7.2. The reaction mixture was extracted twice with 1,800 g samples of ethyl acetate, and the thus obtained organic layers were combined and then concentrated under reduced pressure, yielding 141.9 g of a yellowy white solid. This solid was dissolved in 280 g of ethyl acetate at 50° C., the solution was gradually cooled to 10° C., and the precipitated crystals were collected by filtration. The precipitated crystals were washed with 70 g of ethyl acetate at 5° C., and then dried for two hours at 40° C. under reduced pressure, yielding 113.2 g (purity: 99.3%, 0.6 mol) of 5-hydroxy-2,6-norbornanesultone having the structure shown below (a yield of 40.4% relative to the 5-norbornene-2-sulfonyl chloride).

[Chemical Formula 61]

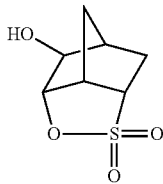

¹H-NMR (400 MHz, CDCl₃, TMS, ppm) δ: 1.72 (1H, dd, J=11.6, 1.6 Hz), 2.06 to 2.1 (3H, m), 2.22 (1H, dd, J=11.2, 1.6 Hz), 2.44 (1H, m), 3.44 (1H, m), 3.50 to 3.53 (1H, m), 3.93 (1H, brs), 4.61 (1H, d, J=4.8 Hz)

Synthesis Example 2

Production of 5-chloromethoxy-2,6-norbornanesultone (First Step)

A three-neck flask having an internal capacity of 300 mL and fitted with a stirrer and a thermometer was charged with 25.1 g (0.132 mol) of the 5-hydroxy-2,6-norbornanesultone obtained in Synthesis Example 1, 6.6 g (0.22 mol) of paraformaldehyde and 230 g of dichloromethane, and the mixture was then cooled to 5° C. or lower under constant stirring. Subsequently, hydrogen chloride gas was bubbled through the reaction solution, and gas chromatography was used to confirm elimination of the alcohol form (5-hydroxy-2,6-norbornanesultone).

Following completion of the reaction, a liquid-liquid separation operation was performed to remove the aqueous layer, yielding 234.5 g of a dichloromethane solution containing 24.1 g (0.1 mol) of 5-chloromethoxy-2,6-norbornanesultone having the structure shown below (a yield of 76.5% relative to the 5-hydroxy-2,6-norbornanesultone).

[Chemical Formula 62]

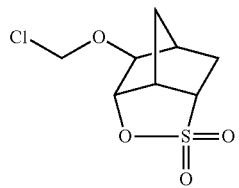

¹H-NMR (400 MHz, CDCl₃, TMS, ppm) δ: 1.67 to 1.76 (1H, m), 2.01 to 2.18 (3H, m), 2.62 (1H, m), 3.40 to 3.46 (1H, m), 3.48 to 3.53 (1H, m), 3.91 (1H, d, J=1.7 Hz), 4.74 (1H, d, J=4.6 Hz), 5.45 to 5.54 (2H, m)

Synthesis Example 3

Production of 4-oxa-5-thio-5,5-dioxide-tricyclo [4.2.1.0³,⁷]nonyl-2-oxymethyl methacrylate (Second Step)

A three-neck flask having an internal capacity of 300 mL and fitted with a stirrer and a thermometer was charged with 234.5 g of a dichloromethane solution containing 24.1 g (0.1 mol) of the 5-chloromethoxy-2,6-norbornanesultone obtained in Synthesis Example 2, 0.035 g (0.28 mmol) of 4-methoxyphenol, and 10.7 g (0.124 mol) of methacrylic acid. Subsequently, with the internal temperature of the flask maintained at 2 to 8° C. and under constant stirring, 11.9 g (0.118 mol) of triethylamine was added dropwise over 30 minutes.

Following completion of the dropwise addition, stirring was continued for two hours at 25° C., and 150 g of water was then added. Subsequently, a liquid-liquid separation was performed, the thus obtained aqueous layer was extracted twice with 100 g samples of ethyl acetate, the extracts were combined with the organic layer and washed with 100 g of water, and the organic layer was then concentrated under reduced pressure to obtain 28.7 g of a brown solid. Purification of this solid by silica gel column chromatography (developing solvent: hexane/ethyl acetate=3/7) yielded 10.49 g (0.036 mol, a yield of 31.6% relative to the 5-chloromethoxy-2,6-norbornanesultone) of 4-oxa-5-thio-5,5-dioxide-tricyclo[4.2.1.0³,⁷] nonyl-2-oxymethyl methacrylate having the structure shown below.

[Chemical Formula 63]

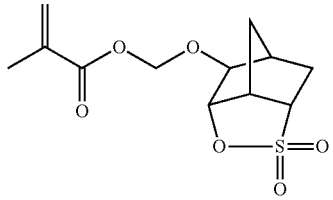

¹H-NMR (400 MHz, CDCl₃, TMS, ppm) δ: 1.68 (1H, dd, J=11.5, 1.6 Hz), 1.96 (3H, s), 2.04 to 2.13 (3H, m), 2.54 (1H, brs), 3.38 to 3.49 (2H, m), 3.80 (1H, d, J=1.4 Hz), 4.69 (1H, d, J=4.8 Hz), 5.37 (2H, dd, J=9.5, 6.4 Hz), 5.66 (1H, s), 6.17 (1H, s)

Polymeric Compound Synthesis Example (1)

Synthesis of Polymeric Compound 1

In a separable flask fitted with a thermometer, a reflux condenser and a nitrogen inlet tube, 10.0 g (34.71 mmol) of a compound (1) and 6.24 g (26.63 mmol) of a compound (2) were dissolved in 21.6 g of methyl ethyl ketone (MEK). Next, 0.77 mmol of dimethyl azobisisobutyrate (V-601) was added to the resulting solution as a polymerization initiator and dissolved. This solution was then added dropwise, over 3 hours and under a nitrogen atmosphere, to 16.24 g of MEK that had been heated to 80° C. Following completion of the dropwise addition, the reaction solution was stirred under heat for 4 hours, and the reaction solution was then cooled to room temperature.

Subsequently, the obtained polymerization reaction solution was added dropwise to a large volume of a mixed solution of normal heptane and 2-propanol to precipitate the polymer, and the precipitated white powder was collected by filtration, washed with a mixed solution of normal heptane and 2-propanol and then with methanol, and then dried, yielding 11.3 g of the target polymeric compound 1.

The polystyrene-equivalent weight-average molecular weight (Mw) of this polymeric compound 1 determined by GPC measurement was 7,300, and the molecular weight dispersity (Mw/Mn) was 1.82.

Further, the copolymer composition ratio (the ratio (molar ratio) of the respective structural units within the structural formula) for the copolymer, determined by carbon-13 nuclear magnetic resonance spectroscopy (600 MHz $^{13}$C-NMR), was 1/m=60/40.

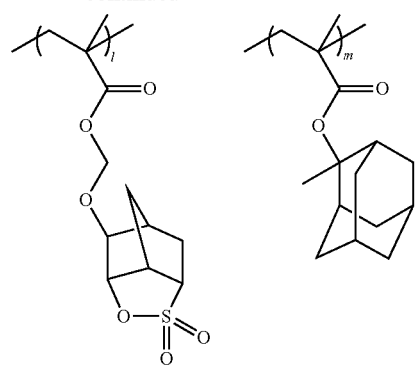

Polymeric compound 1

Synthesis of Polymeric Compounds 2 to 20

Polymeric compounds 2 to 20 were synthesized in the same manner as the polymeric compound 1, using the compounds (1) to (12) shown below as the monomers for forming the structural units that constitute each polymeric compound.

For each of the obtained polymeric compounds, the copolymer composition ratio (the ratio (molar ratio) of the respective structural units within the structural formula) for the copolymer, determined by carbon-13 nuclear magnetic resonance spectroscopy (600 MHz $^{13}$C-NMR, internal standard: tetramethylsilane), the polystyrene-equivalent weight-average molecular weight (Mw) determined by GPC measurement, and the molecular weight dispersity (Mw/Mn) are shown below in Table 1 or 2.

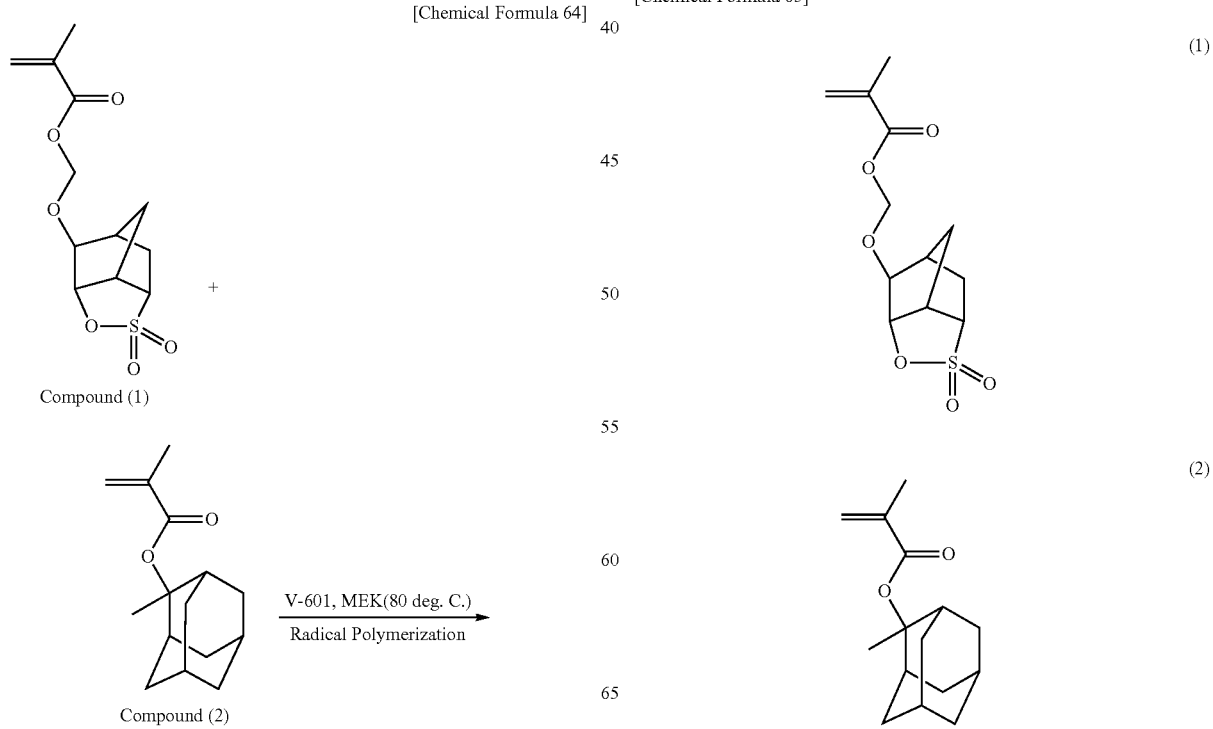

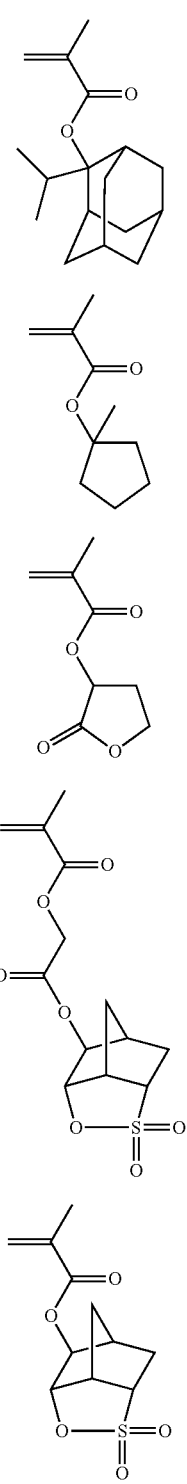
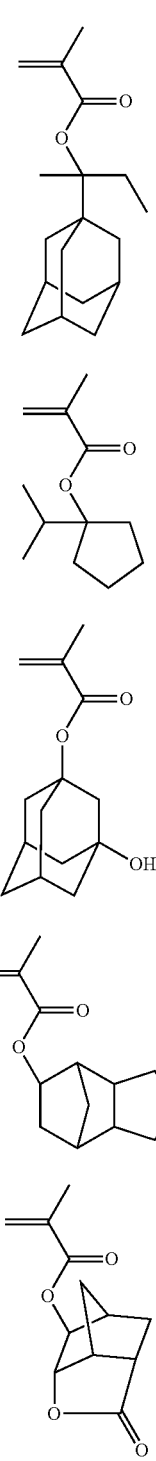
TABLE 1
| | | Polymeric compound | | | | | | | | | |
|---|---|---|---|---|---|---|---|---|---|---|---|
| | | 1 | 2 | 3 | 4 | 5 | 6 | 7 | 8 | 9 | 10 |
| Compound | (1) | 60 | 60 | 60 | 40 | 40 | 40 | 40 | 40 | 40 | 40 |
| | (2) | 40 | | | 40 | | | | | | |
| | (3) | | 40 | | | | | 20 | 20 | | |

TABLE 1-continued

| | | Polymeric compound | | | | | | | | | |
|---|---|---|---|---|---|---|---|---|---|---|---|
| | | 1 | 2 | 3 | 4 | 5 | 6 | 7 | 8 | 9 | 10 |
| | (4) | | | 40 | | 40 | 40 | 20 | 20 | 20 | 20 |
| | (5) | | | | 20 | | | 20 | | 20 | |
| | (6) | | | | | 20 | | | 20 | | 20 |
| | (7) | | | | | | 20 | | | | |
| | (8) | | | | | | | | 20 | 20 | |
| | (9) | | | | | | | | | | |
| | (10) | | | | | | | | | | |
| | (11) | | | | | | | | | | |
| | (12) | | | | | | | | | | |
| Mw | | 7,300 | 6,900 | 7,900 | 7,300 | 7,900 | 6,900 | 7,300 | 7,000 | 7,700 | 7,300 |
| Mw/Mn | | 1.82 | 1.90 | 1.78 | 1.82 | 1.78 | 1.90 | 1.82 | 1.88 | 1.78 | 1.82 |

TABLE 2

| | | Polymeric compound | | | | | | | | | |
|---|---|---|---|---|---|---|---|---|---|---|---|
| | | 11 | 12 | 13 | 14 | 15 | 16 | 17 | 18 | 19 | 20 |
| Compound | (1) | 40 | 40 | 30 | 30 | 30 | 30 | 40 | | | |
| | (2) | | | | | | | | 40 | 40 | 40 |
| | (3) | | | 20 | 20 | 20 | 20 | | | | |
| | (4) | 20 | 20 | 20 | 20 | 20 | 20 | | | | |
| | (5) | 20 | | 20 | 20 | | | 60 | 60 | | |
| | (6) | | 20 | | | 20 | 20 | | | | |
| | (7) | | | | | | | | | | 60 |
| | (8) | | | | | | | | | | |
| | (9) | 20 | 20 | | | | | | | | |
| | (10) | | | 10 | | 10 | | | | | |
| | (11) | | | | 10 | | 10 | | | | |
| | (12) | | | | | | | | | 60 | |
| Mw | | 7,300 | 7,100 | 7,500 | 7,300 | 7,300 | 6,900 | 8,100 | 7,300 | 7,500 | 7,600 |
| Mw/Mn | | 1.82 | 1.86 | 1.78 | 1.80 | 1.78 | 1.70 | 1.82 | 1.80 | 1.78 | 1.70 |

Resist Composition Preparation (1)

Examples 1 to 17, Comparative Examples 1 to 3

The components shown in Tables 3 and 4 were mixed together and dissolved to prepare a series of positive resist compositions.

TABLE 3

| | Component (A) | Component (B) | | Component (D) | Component (E) | Component (S) | |
|---|---|---|---|---|---|---|---|
| Example 1 | (A)-1 [100] | (B)-1 [18.81] | (B)-2 [3.11] | (D)-1 [0.38] | (E)-1 [0.47] | (S)-1 [1440] | (S)-2 [960] |
| Example 2 | (A)-2 [100] | (B)-1 [18.81] | (B)-2 [3.11] | (D)-1 [0.38] | (E)-1 [0.47] | (S)-1 [1440] | (S)-2 [960] |
| Example 3 | (A)-3 [100] | (B)-1 [18.81] | (B)-2 [3.11] | (D)-1 [0.38] | (E)-1 [0.47] | (S)-1 [1440] | (S)-2 [960] |
| Example 4 | (A)-4 [100] | (B)-1 [18.81] | (B)-2 [3.11] | (D)-1 [0.38] | (E)-1 [0.47] | (S)-1 [1440] | (S)-2 [960] |
| Example 5 | (A)-5 [100] | (B)-1 [18.81] | (B)-2 [3.11] | (D)-1 [0.38] | (E)-1 [0.47] | (S)-1 [1440] | (S)-2 [960] |
| Example 6 | (A)-6 [100] | (B)-1 [18.81] | (B)-2 [3.11] | (D)-1 [0.38] | (E)-1 [0.47] | (S)-1 [1440] | (S)-2 [960] |
| Example 7 | (A)-7 [100] | (B)-1 [18.81] | (B)-2 [3.11] | (D)-1 [0.38] | (E)-1 [0.47] | (S)-1 [1440] | (S)-2 [960] |
| Example 8 | (A)-8 [100] | (B)-1 [18.81] | (B)-2 [3.11] | (D)-1 [0.38] | (E)-1 [0.47] | (S)-1 [1440] | (S)-2 [960] |
| Example 9 | (A)-9 [100] | (B)-1 [18.81] | (B)-2 [3.11] | (D)-1 [0.38] | (E)-1 [0.47] | (S)-1 [1440] | (S)-2 [960] |
| Example 10 | (A)-10 [100] | (B)-1 [18.81] | (B)-2 [3.11] | (D)-1 [0.38] | (E)-1 [0.47] | (S)-1 [1440] | (S)-2 [960] |
| Example 11 | (A)-11 [100] | (B)-1 [18.81] | (B)-2 [3.11] | (D)-1 [0.38] | (E)-1 [0.47] | (S)-1 [1440] | (S)-2 [960] |
| Example 12 | (A)-12 [100] | (B)-1 [18.81] | (B)-2 [3.11] | (D)-1 [0.38] | (E)-1 [0.47] | (S)-1 [1440] | (S)-2 [960] |

TABLE 4

|  | Component (A) | Component (B) | | Component (D) | Component (E) | Component (S) | |
|---|---|---|---|---|---|---|---|
| Example 13 | (A)-13 [100] | (B)-1 [18.81] | (B)-2 [3.11] | (D)-1 [0.38] | (E)-1 [0.47] | (S)-1 [1440] | (S)-2 [960] |
| Example 14 | (A)-14 [100] | (B)-1 [18.81] | (B)-2 [3.11] | (D)-1 [0.38] | (E)-1 [0.47] | (S)-1 [1440] | (S)-2 [960] |
| Example 15 | (A)-15 [100] | (B)-1 [18.81] | (B)-2 [3.11] | (D)-1 [0.38] | (E)-1 [0.47] | (S)-1 [1440] | (S)-2 [960] |
| Example 16 | (A)-16 [100] | (B)-1 [18.81] | (B)-2 [3.11] | (D)-1 [0.38] | (E)-1 [0.47] | (S)-1 [1440] | (S)-2 [960] |
| Example 17 | (A)-17 [100] | (B)-1 [18.81] | (B)-2 [3.11] | (D)-1 [0.38] | (E)-1 [0.47] | (S)-1 [1440] | (S)-2 [960] |
| Comparative Example 1 | (A)-18 [100] | (B)-1 [18.81] | (B)-2 [3.11] | (D)-1 [0.38] | (E)-1 [0.47] | (S)-1 [1440] | (S)-2 [960] |
| Comparative Example 2 | (A)-19 [100] | (B)-1 [18.81] | (B)-2 [3.11] | (D)-1 [0.38] | (E)-1 [0.47] | (S)-1 [1440] | (S)-2 [960] |
| Comparative Example 3 | (A)-20 [100] | (B)-1 [18.81] | (B)-2 [3.11] | (D)-1 [0.38] | (E)-1 [0.47] | (S)-1 [1440] | (S)-2 [960] |

In Tables 3 and 4, the reference characters have the following meanings. Further, the numerical values in brackets [ ] indicate the amount added (in parts by weight) of that particular component.

(A)-1 to (A)-20: the polymeric compounds 1 to 20 respectively.
(B)-1: a compound represented by structural formula (B)-1 shown below.
(B)-2: a compound represented by structural formula (B)-2 shown below.
(D)-1: tri-n-pentylamine
(E)-1: salicylic acid
(S)-1: PGMEA
(S)-2: PGME

[Chemical Formula 66]

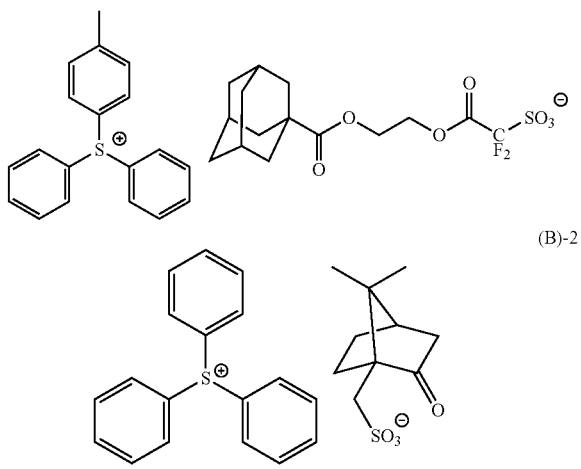

(B)-1

(B)-2

Using each of the obtained resist compositions, a resist pattern was formed in accordance with the procedure described below, and the resist pattern was then subjected to the evaluations described below.

[Resist Pattern Formation]

An organic antireflection film composition ARC29A (a product name, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 89 nm.

The resist composition of each example above was applied onto a thus formed organic antireflection film using a spinner, and was then subjected to a prebake (PAB) treatment on a hotplate at a temperature of 110° C. for 60 seconds and dried, thereby forming a resist film having a film thickness of 90 nm.

Subsequently, using an ArF exposure apparatus NSR-609B (manufactured by Nikon Corporation, NA (numerical aperture)=1.07, Cross pole (in/out=0.78/0.97) with Polano), the resist film having the top coat formed thereon was selectively irradiated through a mask with an ArF excimer laser (193 nm).

Next, a post exposure bake (PEB) treatment was conducted at a prescribed temperature indicated in Table 5 for 60 seconds, the resist film was then subjected to alkali development for 10 seconds at 23° C. in a 2.38% by weight aqueous solution of tetramethylammonium hydroxide (TMAH) (NMD-3, a product name, manufactured by Tokyo Ohka Kogyo Co., Ltd.), and the resist film was then rinsed with pure water for 15 seconds and shaken dry.

Subsequently, a post bake treatment was performed on a hotplate at 200° C. for 5 minutes.

As a result, in each of the examples, a 1:1 line and space (LS) pattern having a line width of 49 nm and a pitch of 98 nm was formed.

The optimum exposure Eop (mJ/cm$^2$; sensitivity) for formation of the LS pattern was determined. The result is shown in Table 5. Further, the critical resolution (nm) at the aforementioned Eop is also shown in Table 5 (in Table 5, the critical resolution is shown as "resolution (nm)").

[Evaluation of Line Width Roughness (LWR)]

For the LS pattern formed at the aforementioned Eop, the line width was measured at 400 locations along the lengthwise direction of the line using a measuring scanning electron microscope (SEM) (accelerating voltage: 300 V, product name: S-9380, manufactured by Hitachi High-Technologies Corporation), and from these measurement results, a standard deviation (s) was determined, and the value of 3 times the standard deviation (3s) averaged over the 400 locations was calculated as an indicator of the LWR. The result is shown in Table 5.

The smaller this value of 3s, the lower the level of roughness in the line width, indicating an LS pattern of more uniform width.

[Evaluation of Resist Pattern Shape]

The LS pattern formed at the aforementioned Eop was inspected using a scanning electron microscope (product name: SU-8000, manufactured by Hitachi High-Technologies Corporation), and the cross-sectional shape of the formed LS pattern was evaluated against the following evaluation criteria. The result is shown in Table 5.

(Evaluation Criteria)
A: excellent rectangularity, superior shape.
B: tapered shape (footing shape).

TABLE 5

|  | PEB (° C.) | Eop (mJ/cm$^2$) | LWR (nm) | Resolution (nm) | Resist pattern shape |
|---|---|---|---|---|---|
| Example 1 | 130 | 25 | 6.5 | 45 | A |
| Example 2 | 120 | 23 | 6.3 | 43 | A |
| Example 3 | 110 | 23 | 5.9 | 44 | A |
| Example 4 | 120 | 22 | 6.3 | 46 | A |
| Example 5 | 95 | 21 | 6.1 | 45 | A |
| Example 6 | 100 | 20 | 6.1 | 43 | A |
| Example 7 | 90 | 21 | 6.2 | 44 | A |
| Example 8 | 105 | 16 | 6.9 | 45 | A |
| Example 9 | 90 | 19 | 6.2 | 41 | A |
| Example 10 | 105 | 15 | 6.9 | 43 | A |
| Example 11 | 90 | 14 | 5.8 | 41 | A |
| Example 12 | 100 | 15 | 5.9 | 42 | A |
| Example 13 | 95 | 22 | 6.4 | 42 | A |
| Example 14 | 90 | 21 | 6.2 | 44 | A |
| Example 15 | 110 | 15 | 7.0 | 46 | A |
| Example 16 | 105 | 16 | 6.9 | 45 | A |
| Example 17 | 130 | 28 | 7.1 | 47 | A |
| Comparative Example 1 | 110 | 30 | 8.0 | 49 | B |
| Comparative Example 2 | 130 | 29 | 7.2 | 48 | B |
| Comparative Example 3 | 130 | 32 | 7.9 | 48 | B |

Resist Composition Preparation (2)

Examples 18 to 20, Comparative Examples 4 to 6

The components shown in Table 6 were mixed together and dissolved to prepare a series of resist compositions.

TABLE 6

|  | Component (A) | Component (B) | Component (D) | Component (E) | Component (S) |
|---|---|---|---|---|---|
| Composition 1 | (A)-21 [100] | (B)-3 [10.83] | (D)-2 [2.38] | (E)-1 [0.54] | (S)-3 [3200] |
| Composition 2 | (A)-22 [100] | (B)-3 [10.83] | (D)-2 [2.38] | (E)-1 [0.54] | (S)-3 [3200] |

In Table 6, the reference characters have the following meanings. Further, the numerical values in brackets [ ] indicate the amount added (in parts by weight) of that particular component.

(A)-21: a polymeric compound (A)-21 shown below [Mw=5,900, Mw/Mn=1.59, l/m/n=34.3/19.3/46.4 (molar ratio)]

(A)-22: a polymeric compound (A)-22 shown below [Mw=6,600, Mw/Mn=1.62, l/m=45.2/54.8 (molar ratio)]

(B)-3: a compound (B)-3 shown below.
(D)-2: a compound (D)-2 shown below.
(E)-1: salicylic acid
(S)-3: a mixed solvent in which PGMEA/PGME/cyclohexanone=45/30/25 (weight ratio)

[Chemical Formula 67]

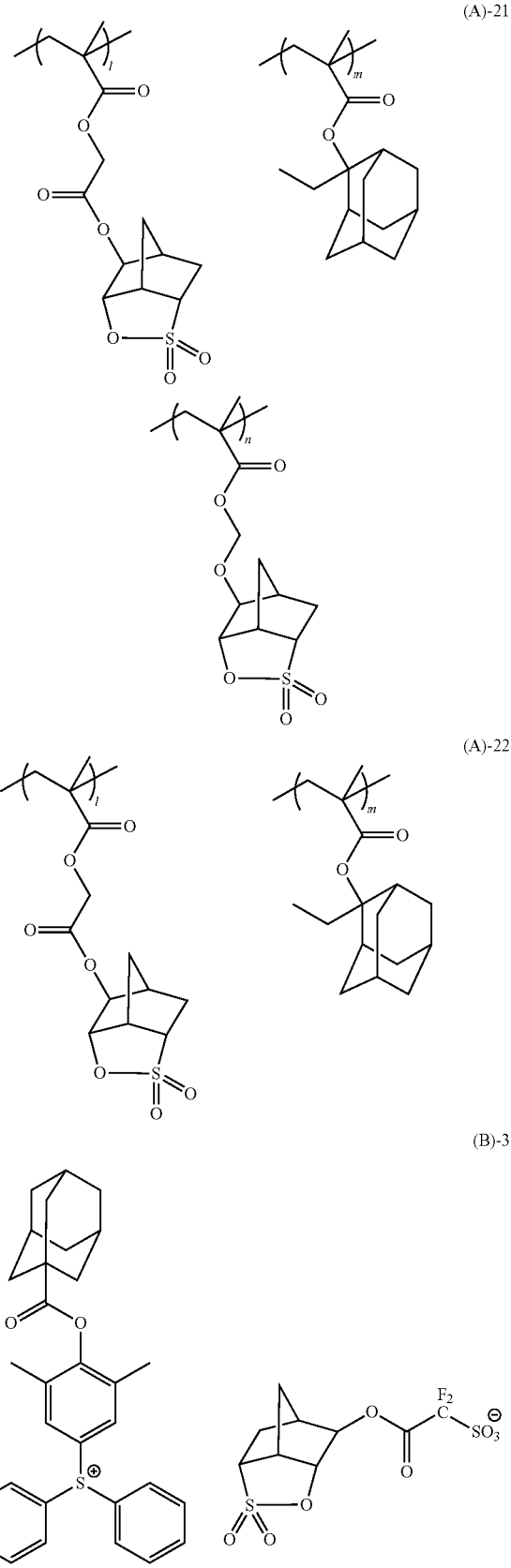

(D)-2

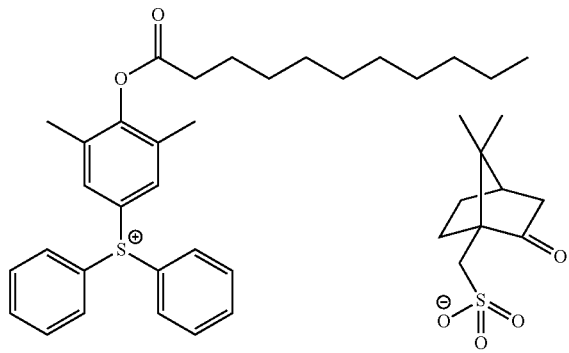

Using the obtained resist compositions, resist patterns were formed in accordance with the procedure described below, and these resist patterns were then subjected to the evaluations described below.

[Resist Pattern Formation]

An organic antireflection film composition ARC95 (a product name, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 98 nm.

Each of the above resist compositions was applied onto a thus formed organic antireflection film using a spinner, and was then subjected to a prebake (PAB) treatment on a hotplate at a temperature of 90° C. for 60 seconds and dried, thereby forming a resist film having a film thickness of 80 nm.

Next, a coating solution for forming a protective film (product name: TILC-057, manufactured by Tokyo Ohka Kogyo Co., Ltd.) was applied onto the resist film using a spinner, and was then heated at 90° C. for 60 seconds, thereby forming a top coat with a film thickness of 35 nm.

Subsequently, using an ArF exposure apparatus NSR-S610C (manufactured by Nikon Corporation, NA (numerical aperture)=1.30, Cross pole (in/out=0.78/0.97) with Polano), the resist film having the top coat formed thereon was selectively irradiated through a halftone mask with an ArF excimer laser (193 nm).

Next, a post exposure bake (PEB) treatment was conducted at 80° C. for 60 seconds, the resist film was then subjected to alkali development for 10 seconds at 23° C. in a 2.38% by weight aqueous solution of tetramethylammonium hydroxide (TMAH) (NMD-3, a product name, manufactured by Tokyo Ohka Kogyo Co., Ltd.), and the resist film was then rinsed with pure water for 15 seconds and shaken dry.

As a result, 1:1, 1:3 and 1:5 line and space (LS) patterns having a line width fixed at 42 nm, and having pitches of 84 nm, 168 nm and 252 nm respectively, were formed.

The optimum exposure Eop (mJ/cm²; sensitivity) for formation of each of the LS patterns was determined. These results are shown in Tables 7 to 9. The resist patterns formed using the composition 1 were evaluated as examples (Examples 18 to 20), and the resist patterns formed using the composition 2 were evaluated as comparative examples (Comparative Examples 4 to 6).

[Evaluation of Line Width Roughness (LWR)]

For each LS pattern formed at the aforementioned Eop, the line width was measured at 400 locations along the lengthwise direction of the line using a measuring scanning electron microscope (SEM) (accelerating voltage: 300 V, product name: S-9380, manufactured by Hitachi High-Technologies Corporation), and from these measurement results, a standard deviation (s) was determined, and the value of 3 times the standard deviation (3s) averaged over the 400 locations was calculated as an indicator of the LWR. The results are shown in Tables 7 to 9.

The smaller this value of 3s, the lower the level of roughness in the line width, indicating an LS pattern of more uniform width.

[Evaluation of Resist Pattern Shape]

Each LS pattern formed at the aforementioned Eop was inspected using a scanning electron microscope (product name: SU-8000, manufactured by Hitachi High-Technologies Corporation), and the cross-sectional shape of the formed LS pattern was evaluated against the following evaluation criteria. The results are shown in Tables 7 to 9.

(Evaluation Criteria)

A: excellent rectangularity, superior shape.
B: tapered shape (footing shape).

TABLE 7

| | Eop (mJ/cm²) | LWR (nm) | Resist pattern shape |
|---|---|---|---|
| Example 18 | 19.8 | 4.55 | A |
| Comparative Example 4 | 18.2 | 4.36 | B |

TABLE 8

| | Eop (mJ/cm²) | LWR (nm) | Resist pattern shape |
|---|---|---|---|
| Example 19 | 19.5 | 6.21 | A |
| Comparative Example 5 | 18.5 | 5.38 | B |

TABLE 9

| | Eop (mJ/cm²) | LWR (nm) | Resist pattern shape |
|---|---|---|---|
| Example 20 | 19.4 | 5.12 | A |
| Comparative Example 6 | 18.6 | 4.99 | B |

From the results shown in Table 5 and Tables 7 to 9 it was confirmed that compared with the resist compositions of Comparative Examples 1 to 6, the resist compositions of Examples 1 to 20 which represented applications of the present invention each exhibited excellent lithography properties such as LWR, and was able to form a resist pattern of superior shape with excellent rectangularity.

Synthesis Example 4

Synthesis of 2-hydroxy-4,8-dioxa-5-thiatricyclo[4.2.1.0$^{3,7}$]nonane-5,5-dioxide (alcohol derivative)

The methyl vinylsulfonate used as a raw material was synthesized in accordance with the synthesis example disclosed in Angew. Chem., 77(7), 291 to 302 (1965). Specifically, first, a four-neck flask having an internal capacity of 2 L and fitted with a stirrer, a thermometer, a dropping funnel and a three-way cock was charged, under a nitrogen atmosphere, with 326.0 g (2.00 mol) of 2-chloroethanesulfonyl chloride, the flask was cooled in an ice bath, and a 25% by weight solution of sodium methoxide (methanol solution) was added dropwise from the dropping funnel such that the internal temperature of the flask was maintained within a range from 2 to 5° C. Following completion of the dropwise addition, the flask was removed from the ice bath, and the reaction mixture was stirred for one hour at room temperature. The reaction mixture was then filtered, the filtrate was concentrated under reduced pressure, and the concentrate was subjected to a single evaporation operation, yielding 197.2 g of methyl vinylsulfonate (purity: 97.3%, 1.571 mol) (a yield of 78.5% relative to the 2-chloroethanesulfonyl chloride).

Next, the target product 2-hydroxy-4,8-dioxa-5-thiatricyclo[4.2.1.0$^{3,7}$]nonane-5,5-dioxide was synthesized in accordance with the method disclosed in Example 2 in Japanese Unexamined Patent Application, First Publication No. 2007-31355.

A four-neck flask having an internal capacity of 300 mL and fitted with a stirrer, a dropping funnel and a thermometer was charged with 150 g (2.20 mol) of furan and 15.0 g of zinc iodide, and 41.5 g (0.34 mol) of methyl vinylsulfonate was added dropwise from the dropping funnel at a temperature of 25 to 27° C. Stirring was continued at the same temperature for two days, and the reaction mixture was then transferred to a 1 L separating funnel. Following washing twice with 300 mL samples of water, the unreacted furan was removed by distillation under reduced pressure, yielding 22.0 g of methyl 7-oxabicyclo[2.2.1]hept-2-ene-5-sulfonate.

A four-neck flask having an internal capacity of 1,000 mL and fitted with a stirrer, a dropping funnel and a thermometer was charged sequentially with 22.0 g of methyl 7-oxabicyclo[2.2.1]hept-2-ene-5-sulfonate and 450 g of methylene chloride, the temperature was cooled to 4° C., and 22.9 g (0.17 mol) of m-chloroperbenzoic acid was added gradually to the flask under constant stirring so that the temperature did not exceed 10° C. Following stirring for 4 hours at 5 to 7° C., 100 g of a saturated aqueous solution of sodium sulfite was added, and the resulting mixture was stirred for 30 minutes. After standing and separating, the organic layer was washed three times with 100 g samples of saturated sodium hydrogen carbonate. The organic layer was then concentrated under reduced pressure, yielding 20.2 g of methyl 2,3-epoxy-7-oxabicyclo[2.2.1]hept-2-ene-5-sulfonate.

A four-neck flask having an internal capacity of 300 mL and fitted with a stirrer, a dropping funnel and a thermometer was charged with a 5.0 (mol/L) aqueous solution of sodium hydroxide, and 29.5 g of methyl 2,3-epoxy-7-oxabicyclo[2.2.1]hept-2-ene-5-sulfonate was added dropwise to the flask from the dropping funnel so that the internal temperature of the flask was maintained within a range from 20 to 23° C. Following completion of the dropwise addition, the reaction mixture was stirred for 4 hours, and then while the flask was cooled in an ice bath, concentrated hydrochloric acid was added dropwise to adjust the pH to 7.3. Subsequently, the reaction mixture was extracted 4 times with 300 mL samples of ethyl acetate, the thus obtained organic layers were combined and concentrated, and the resulting concentrate was separated and purified by silica gel column chromatography, yielding 4.75 g (purity: 98.8%, 0.024 mol) of 2-hydroxy-4,8-dioxa-5-thiatricyclo[4.2.1.0$^{3,7}$]nonane=5,5-dioxide.

[Chemical Formula 68]

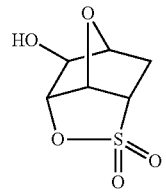

$^1$H-NMR (400 MHz, CD$_3$OD, TMS, ppm) δ: 2.17 (1H, dd, J=2.6, 14.4 Hz), 2.28 (1H, ddd, J=5.5, 10.7, 14.4 Hz), 3.81 (1H, ddd, J=2.6, 4.9, 10.7 Hz), 3.92 (1H, s), 4.54 (1H, d, J=5.5 Hz), 4.65 (1H, dd, J=1.4, 4.8 Hz), 5.52 (1H, dd, J=4.8, 4.8 Hz).

Synthesis Example 5

Production of 2-chloromethoxy-4,8-dioxa-5-thiatricyclo[4.2.1.0$^{3,7}$]nonane-5,5-dioxide (First Step)

A four-neck flask having an internal capacity of 100 mL and fitted with a stirrer and a thermometer was charged with 4.0 g (20.8 mmol) of 2-hydroxy-4,8-dioxa-5-thiatricyclo[4.2.1.0$^{3,7}$]nonane-5,5-dioxide, 1.04 g of paraformaldehyde (equivalent to 34.7 mmol of formaldehyde) and 32.4 g of methylene chloride, and the temperature was cooled to 5° C. or lower under constant stirring. Subsequently, hydrogen chloride gas was bubbled through the reaction mixture until it was confirmed by gas chromatography that the 2-hydroxy-4,8-dioxa-5-thiatricyclo[4.2.1.0$^{3,7}$]nonane-5,5-dioxide had been dissipated.

Following completion of the reaction, a liquid-liquid separation operation was performed to remove the aqueous layer, yielding 32.6 g of a methylene chloride solution containing 3.78 g (15.7 mmol) of 2-chloromethoxy-4,8-dioxa-5-thiatricyclo[4.2.1.0$^{3,7}$]nonane-5,5-dioxide.

[Chemical Formula 69]

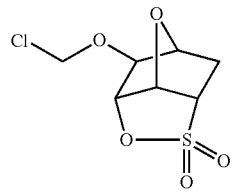

$^1$H-NMR (400 MHz, CDCl$_3$, TMS, ppm) δ: 2.28 to 2.44 (2H, m), 3.68 (1H, m), 4.13 (1H, s), 4.70 (1H, m), 4.86 (1H, m), 5.52 (3H, m)

Synthesis Example 6

Production of 2-methacryloxymethoxy-4,8-dioxa-5-thiatricyclo[4.2.1.0$^{3,7}$]nonane-5,5-dioxide (Second Step)

A four-neck flask having an internal capacity of 100 mL and fitted with a stirrer and a thermometer was charged with 10.0 g of a methylene chloride solution containing 1.16 g (4.82 mmol) of 2-chloromethoxy-4,8-dioxa-5-thiatricyclo[4.2.1.0$^{3,7}$]nonane-5,5-dioxide, 1 mg of 4-methoxyphenol and 0.52 g (6.0 mmol) of methacrylic acid. Subsequently, under constant stirring and with the internal temperature maintained within a range from 2 to 9° C., 0.57 g (5.64 mmol) of triethylamine was added dropwise to the flask over 30 minutes.

Following completion of the dropwise addition, the reaction mixture was stirred at 10° C. for 30 minutes, and 10 g of water was then added. Subsequently, a liquid-liquid separation was performed, and the thus obtained organic layer was concentrated under reduced pressure to obtain a residue of 2.54 g. This residue was recrystallized using ethyl acetate as a solvent, yielding 1.17 g (4.03 mmol) of 2-methacryloxymethoxy-4,8-dioxa-5-thiatricyclo[4.2.1.0$^{3,7}$]nonane-5,5-dioxide (yield 84%).

[Chemical Formula 70]

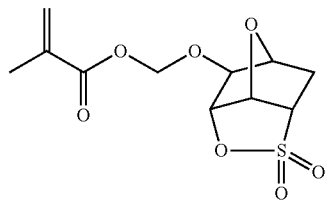

$^1$H-NMR (400 MHz, CDCl$_3$, TMS, ppm) δ: 1.96 (3H, s), 2.26 to 2.40 (2H, m), 3.66 (1H, m), 4.06 (1H, s), 4.77 (1H, m), 4.83 (1H, m), 5.43 (2H, m), 5.52 (1H, m), 5.71 (1H, m), 6.20 (1H, m)

Polymeric Compound Synthesis Example (2)

Synthesis of Polymeric Compound (a)

In a separable flask fitted with a thermometer, a reflux condenser and a nitrogen inlet tube, 11.95 g (50.55 mmol) of a compound (II-2) represented by chemical formula (II-2) shown below was dissolved in 17.75 g of methyl ethyl ketone and 17.75 g of cyclohexanone, and the resulting solution was heated to 80° C. To this solution was added a solution prepared by dissolving 19.34 g (84.75 mmol) of a compound (VII-10) represented by chemical formula (VII-10) shown below, 2.99 g (12.64 mmol) of the compound (II-2), 11.41 g (39.56 mmol) of the 4-oxa-5-thio-5,5-dioxide-tricyclo[4.2.1.0$^{3,7}$]nonyl-2-oxymethyl methacrylate obtained in Synthesis Example 3, and 4.31 g (18.75 mmol) of dimethyl 2,2'-azobisisobutyrate as a polymerization initiator in a mixed solvent containing 42.44 g of methyl ethyl ketone and 42.44 g of cyclohexanone, with the addition performed dropwise over 4 hours under a nitrogen atmosphere.

Following completion of the dropwise addition, the reaction solution was stirred under heat for a further one hour, and the reaction solution was then cooled to room temperature. The thus obtained polymerization reaction solution was added dropwise to a large volume of n-heptane to precipitate the polymer, and the precipitated white powder was collected by filtration, washed with methanol and then dried, yielding 28.78 g of a polymeric compound (a) shown below.

The polystyrene-equivalent weight-average molecular weight (Mw) of this polymeric compound (a) determined by gel permeation chromatography (GPC) measurement was 9,200, and the molecular weight distribution (Mw/Mn) was 1.68. Further, the copolymer composition ratio (the ratio (molar ratio) of the respective structural units within the structural formula) for the polymeric compound, determined by $^{13}$C-NMR (600 MHz), was l/m/n=45.2/33.7/21.1.

[Chemical Formula 71]

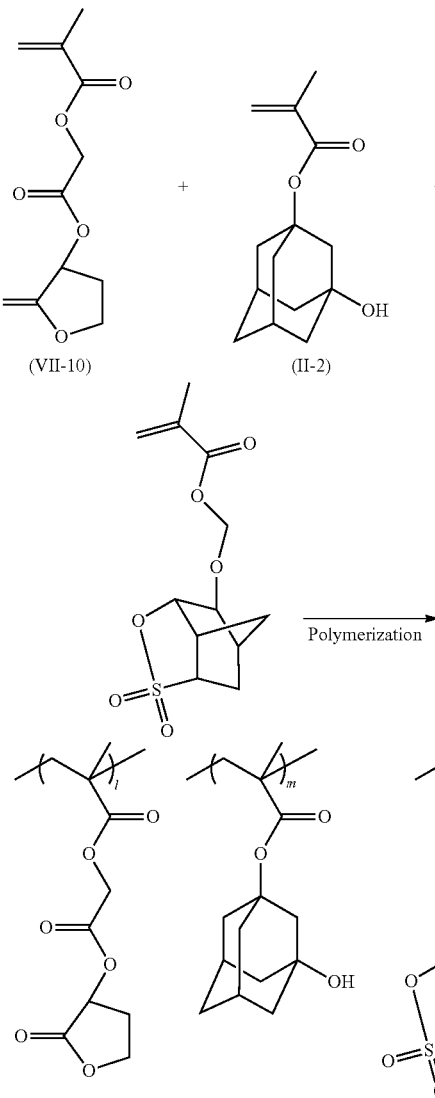

Polymeric compound (a)

Synthesis of Polymeric Compound (b)

In a separable flask fitted with a thermometer, a reflux condenser and a nitrogen inlet tube, 11.95 g (50.55 mmol) of the compound (II-2) was dissolved in 17.75 g of methyl ethyl ketone and 17.75 g of cyclohexanone, and the resulting solution was heated to 80° C. To this solution was added a solution prepared by dissolving 19.34 g (84.75 mmol) of the compound (VII-10), 2.99 g (12.64 mmol) of the compound (II-2), 11.48 g (39.56 mmol) of the 2-methacryloxymethoxy-4,8-dioxa-5-thiatricyclo[4.2.1.0$^{3,7}$]nonane-5,5-dioxide obtained in Synthesis Example 6, and 4.31 g (18.75 mmol) of dimethyl 2,2'-azobisisobutyrate as a polymerization initiator in a mixed solvent containing 42.44 g of methyl ethyl ketone and 42.44 g of cyclohexanone, with the addition performed dropwise over 4 hours under a nitrogen atmosphere.

Following completion of the dropwise addition, the reaction solution was stirred under heat for a further one hour, and the reaction solution was then cooled to room temperature.

The thus obtained polymerization reaction solution was added dropwise to a large volume of n-heptane to precipitate the polymer, and the precipitated white powder was collected by filtration, washed with methanol and then dried, yielding 28.02 g of a polymeric compound (b) shown below.

The polystyrene-equivalent weight-average molecular weight (Mw) of this polymeric compound (b) determined by GPC measurement was 9,400, and the molecular weight distribution (Mw/Mn) was 1.70. Further, the copolymer composition ratio (the ratio (molar ratio) of the respective structural units within the structural formula) for the polymeric compound, determined by $^{13}$C-NMR (600 MHz), was l/m/n=45.0/33.8/21.2.

[Chemical Formula 72]

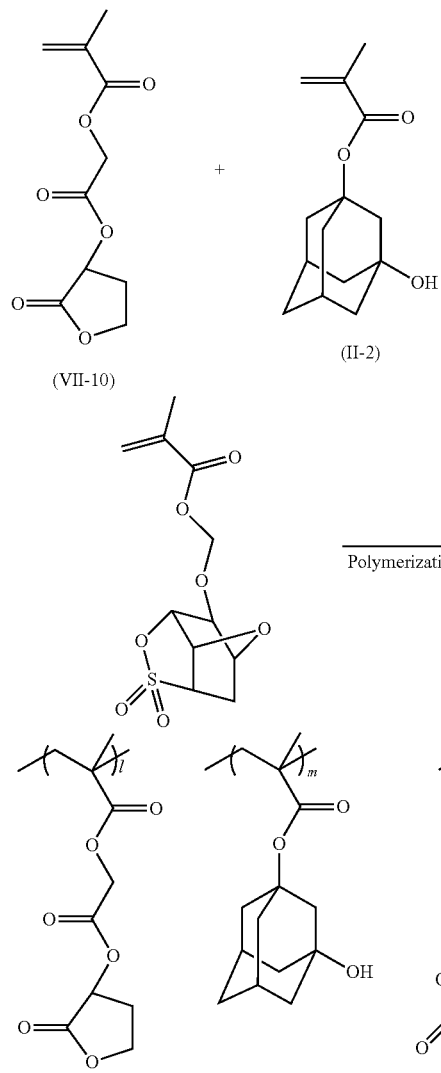

Polymeric compound (b)

Synthesis of Polymeric Compound (c)

In a separable flask fitted with a thermometer, a reflux condenser and a nitrogen inlet tube, 11.95 g (50.55 mmol) of the compound (II-2) was dissolved in 17.75 g of methyl ethyl ketone and 17.75 g of cyclohexanone, and the resulting solution was heated to 80° C. To this solution was added a solution prepared by dissolving 19.34 g (84.75 mmol) of the compound (VII-10), 2.99 g (12.64 mmol) of the compound (II-2), 7.84 g (39.56 mmol) of a compound (VI-2) represented by chemical formula (VI-2) shown below, and 4.31 g (18.75 mmol) of dimethyl 2,2'-azobisisobutyrate as a polymerization initiator in a mixed solvent containing 42.44 g of methyl ethyl ketone and 42.44 g of cyclohexanone, with the addition performed dropwise over 4 hours under a nitrogen atmosphere.

Following completion of the dropwise addition, the reaction solution was stirred under heat for a further one hour, and the reaction solution was then cooled to room temperature. The thus obtained polymerization reaction solution was added dropwise to a large volume of n-heptane to precipitate the polymer, and the precipitated white powder was collected by filtration, washed with methanol and then dried, yielding 26.58 g of the target polymeric compound (c).

The polystyrene-equivalent weight-average molecular weight (Mw) of this polymeric compound (c) determined by GPC measurement was 10,300, and the molecular weight distribution (Mw/Mn) was 1.86. Further, the copolymer composition ratio (the ratio (molar ratio) of the respective structural units within the structural formula) for the polymeric compound, determined by $^{13}$C-NMR (600 MHz), was l/m/n=45.2/33.7/21.1.

[Chemical Formula 73]

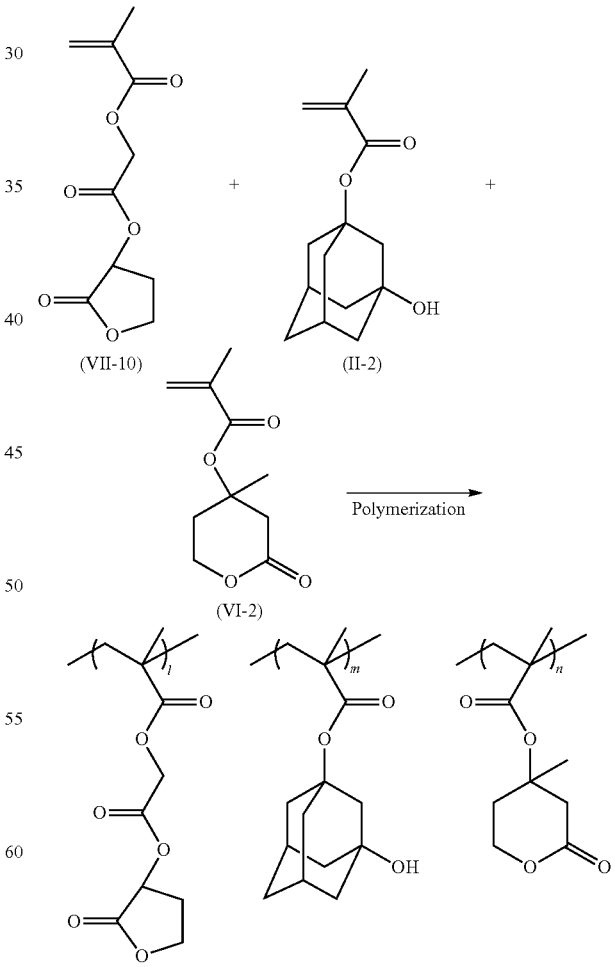

Polymeric compound (c)

Resist Composition Preparation (3)

Examples 21 and 22, Comparative Example 7

One hundred parts by weight samples of the polymeric compounds (a), (b) and (c) obtained in the aforementioned <Polymeric Compound Synthesis Example (2)> were each mixed with 4.5 parts by weight of a photoacid generator TPS-109 (a product name, active component: triphenylsulfonium nonafluoro-n-butanesulfonate, manufactured by Midori Kagaku Co., Ltd.), and 1,896 parts by weight of a mixed solvent of propylene glycol monomethyl ether acetate and cyclohexanone (weight ratio=1:1) to prepare a resist composition for each of the examples.

[Resist Pattern Formation]

The resist composition of each example was filtered using a membrane filter with a pore size of 0.2 μm.

Subsequently, a 6% by weight propylene glycol monomethyl ether acetate solution of a cresol novolac resin (PS-6937, manufactured by Gunei Chemical Industry Co., Ltd.) was applied to a silicon wafer having a diameter of 10 cm using a spin coating method, and the solution was heated at 200° C. for 90 seconds on a hotplate to form an antireflection film (base film). The resist composition of each example was applied to such an antireflection film by spin coating, and the composition was subjected to a prebake on a hotplate at 130° C. for 90 seconds, thus forming a resist film with a thickness of 300 nm. This resist film was exposed by double beam interference lithography using an ArF excimer laser with a wavelength of 193 nm. Subsequently, a post exposure bake was performed at 130° C. for 90 seconds, and the resist film was then developed for 60 seconds using a 2.38% by weight aqueous solution of tetramethylammonium hydroxide, thus forming a 1:1 line and space pattern.

[Evaluations]

A cut cross-section of the developed wafer was inspected using a scanning electron microscope (SEM), the shape of the pattern formed at an exposure at which the line and space pattern with a line width of 100 nm was resolved with a 1:1 ratio was evaluated, and the fluctuation in the line width of the pattern (LWR) was measured.

The LWR was measured by using the measurement monitor to detect the line width at a plurality of locations, and using the variation (3δ) in the line width at the detected locations as an indicator of the LWR. Further, the cross-sectional shape of the pattern was evaluated by inspecting the pattern using the scanning electron microscope (SEM). Patterns that had a high level of pattern rectangularity were evaluated as "good" and patterns that had a low level of pattern rectangularity were evaluated as "poor". The results are shown in Table 10.

TABLE 10

| | Polymeric compound used | LWR (nm) | Pattern shape |
|---|---|---|---|
| Example 21 | 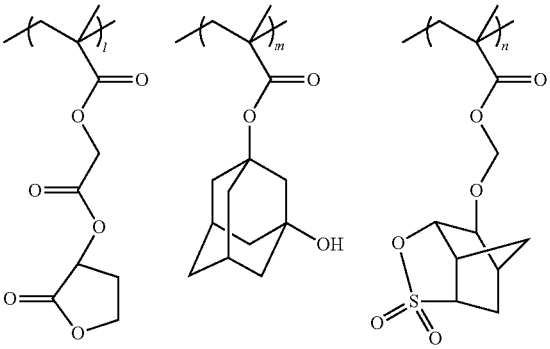<br>Polymeric compound (a) | 5.4 | good |
| Example 22 | 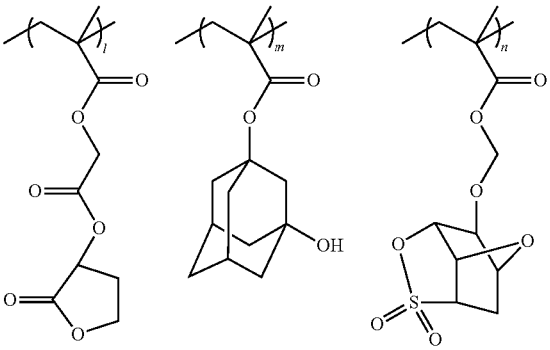<br>Polymeric compound (b) | 5.3 | good |

TABLE 10-continued

| | Polymeric compound used | LWR (nm) | Pattern shape |
|---|---|---|---|
| Comparative Example 7 | 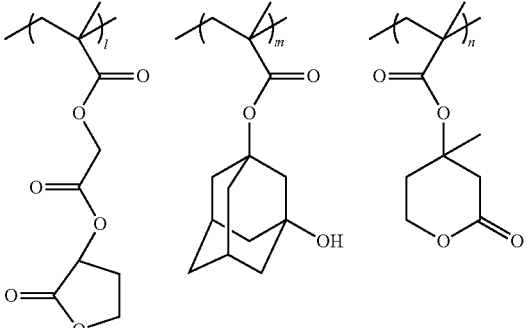 Polymeric compound (c) | 7.1 | good |

From Table 10 it is evident that the resist compositions of Examples 21 and 22, which represent applications of the present invention, were each able to form a resist pattern of good shape in which the LWR had been improved significantly compared with the resist composition of Comparative Example 7. In other words, the present invention is able to combine formation of a high-resolution photoresist pattern with a reduction in the LWR.

What is claimed is:

1. A resist composition which generates acid upon exposure and exhibits changed solubility in a developing solution under action of acid, wherein
the resist composition comprises a base component (A) that exhibits changed solubility in a developing solution under action of acid, and
the base component (A) comprises a resin component (A1) having a structural unit (a0) represented by general formula (a0-1) shown below:

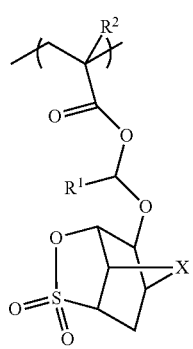

(a0-1)

wherein $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

2. The resist composition according to claim 1, wherein the resin component (A1) has a structural unit (a1) comprising an acid-decomposable group that exhibits increased polarity under action of acid, provided that the structural unit (a0) is excluded from the structural unit (a1).

3. The resist composition according to claim 1, wherein the resin component (A1) has a structural unit (a5) comprising an —SO$_2$-containing cyclic group, provided that the structural unit (a0) is excluded from the structural unit (a5).

4. A method of forming a resist pattern, comprising:
forming a resist film on a substrate using the resist composition according to claim 1;
exposing the resist film; and
developing the resist film to form a resist pattern.

5. A polymeric compound having a structural unit (a0) represented by general formula (a0-1) shown below:

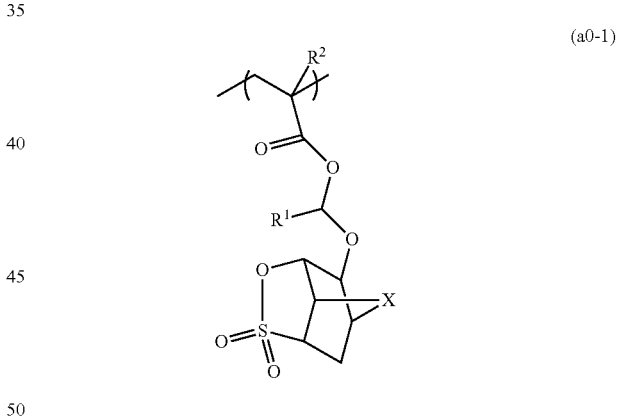

(a0-1)

wherein $R^1$ represents a hydrogen atom or an alkyl group of 1 to 5 carbon atoms, $R^2$ represents a hydrogen atom, an alkyl group of 1 to 5 carbon atoms or a halogenated alkyl group of 1 to 5 carbon atoms, and X represents an oxygen atom, a sulfur atom, or an alkylene group of 1 to 5 carbon atoms which may contain an oxygen atom or a sulfur atom.

6. The polymeric compound according to claim 5, having a structural unit (a1) comprising an acid-decomposable group that exhibits increased polarity under action of acid, provided that the structural unit (a0) is excluded from the structural unit (a1).

7. The polymeric compound according to claim 5, having a structural unit (a5) comprising an —SO$_2$-containing cyclic group, provided that the structural unit (a0) is excluded from the structural unit (a5).

* * * * *